United States Patent
Liu et al.

(10) Patent No.: US 11,411,529 B2
(45) Date of Patent: Aug. 9, 2022

(54) SELF-POWERED SOLAR TRACKER APPARATUS

(71) Applicant: NEXTracker Inc., Fremont, CA (US)

(72) Inventors: Yang Liu, Mountain View, CA (US); Alexander W. Au, Oakland, CA (US)

(73) Assignee: NEXTRACKER LLC, Fremont, CA (US)

( * ) Notice: Subject to any disclaimer, the term of this patent is extended or adjusted under 35 U.S.C. 154(b) by 0 days.

(21) Appl. No.: 17/343,600

(22) Filed: Jun. 9, 2021

(65) Prior Publication Data

US 2021/0305932 A1    Sep. 30, 2021

Related U.S. Application Data

(63) Continuation of application No. 16/128,022, filed on Sep. 11, 2018, now Pat. No. 11,101,768, which is a
(Continued)

(51) Int. Cl.
*H02S 20/32* (2014.01)
*H02S 40/32* (2014.01)
(Continued)

(52) U.S. Cl.
CPC ............ *H02S 20/32* (2014.12); *H01L 31/042* (2013.01); *H02S 40/32* (2014.12); *H02S 40/34* (2014.12); *H02S 40/38* (2014.12); *Y02E 10/50* (2013.01)

(58) Field of Classification Search
CPC .... H02S 20/32; H02S 20/30; H02S 40/30–38; G01S 3/7861; G01S 3/7862; F21S 11/002; F21S 11/007
(Continued)

(56) References Cited

U.S. PATENT DOCUMENTS

| | | | |
|---|---|---|---|
| 4,469,938 A * | 9/1984 | Cohen | G01S 3/7861 |
| | | | 250/203.4 |
| 4,556,788 A | 12/1985 | Hanak | |

(Continued)

FOREIGN PATENT DOCUMENTS

| | | |
|---|---|---|
| KR | 100896332 B | 5/2009 |
| WO | 2012076949 A1 | 6/2012 |

OTHER PUBLICATIONS

Definition of "side by side" [retrieved from https://www.collinsdictionary.com/us/dictionary/english/side-by-side on Feb. 8, 2022] (Year: 2022).*

(Continued)

*Primary Examiner* — Eric R Smith
(74) *Attorney, Agent, or Firm* — Weber Rosselli & Cannon LLP

(57) ABSTRACT

A solar tracker apparatus includes an adjustable hanger assembly that has a clam shell hanger assembly. The clam shell hanger assembly may hold a torque tube comprising a plurality of torque tubes configured together in a continuous length from a first end to a second end. A center of mass of the solar tracker apparatus may be aligned with a center of rotation of the torque tubes, in order to reduce a load of a drive device operably coupled to the torque tube. Solar modules may be coupled to the torque tubes. The solar tracker includes an energy system that includes solar panel, a DC to DC converter, a battery, and a micro-controller. The energy system may facilitate full operation movement of the tracker apparatus without any external power lines.

7 Claims, 50 Drawing Sheets

Related U.S. Application Data continuation of application No. 14/972,036, filed on Dec. 16, 2015, now Pat. No. 10,075,125.

(60) Provisional application No. 62/095,670, filed on Dec. 22, 2014.

(51) Int. Cl.
   *H02S 40/38*    (2014.01)
   *H02S 40/34*    (2014.01)
   *H01L 31/042*   (2014.01)

(58) Field of Classification Search
   USPC ........................................................ 126/574
   See application file for complete search history.

(56) References Cited

U.S. PATENT DOCUMENTS

| | | | |
|---|---|---|---|
| 5,632,823 A | 5/1997 | Sharan | |
| 7,884,308 B1 | 2/2011 | Mejia | |
| 8,459,249 B2 | 6/2013 | Corio | |
| 2003/0034029 A1 | 2/2003 | Shingleton | |
| 2006/0283497 A1* | 12/2006 | Hines | F24S 23/70 |
| | | | 136/246 |
| 2007/0102037 A1* | 5/2007 | Irwin | H01L 31/044 |
| | | | 136/246 |
| 2007/0297058 A1 | 12/2007 | Briee et al. | |
| 2009/0114211 A1 | 5/2009 | Homyk et al. | |
| 2010/0018570 A1 | 1/2010 | Cashion et al. | |
| 2010/0101630 A1 | 4/2010 | Kats et al. | |
| 2010/0236602 A1* | 9/2010 | Cohen | H01L 31/0547 |
| | | | 136/246 |
| 2011/0023940 A1 | 2/2011 | Do et al. | |
| 2011/0073161 A1 | 3/2011 | Scanlon | |
| 2011/0232631 A1 | 9/2011 | Boehmer | |
| 2012/0048341 A1 | 3/2012 | Mikhael et al. | |
| 2012/0072041 A1 | 3/2012 | Miller et al. | |
| 2012/0091077 A1 | 4/2012 | Zuritis | |
| 2012/0180845 A1 | 7/2012 | Cole et al. | |
| 2013/0006435 A1 | 1/2013 | Berrios et al. | |
| 2014/0182577 A1 | 7/2014 | Linderman et al. | |
| 2015/0015975 A1 | 1/2015 | Huss et al. | |
| 2015/0092383 A1 | 4/2015 | Corio et al. | |
| 2016/0056759 A1 | 2/2016 | Pinneo et al. | |

OTHER PUBLICATIONS

Definition of pier [retrieved from https://www.collinsdictionary.com/dictionary/english/pier on Sep. 28, 2020].

International Search Report and Written Opinion for PCT/US2013/073948, filed on Dec. 9, 2013.

* cited by examiner

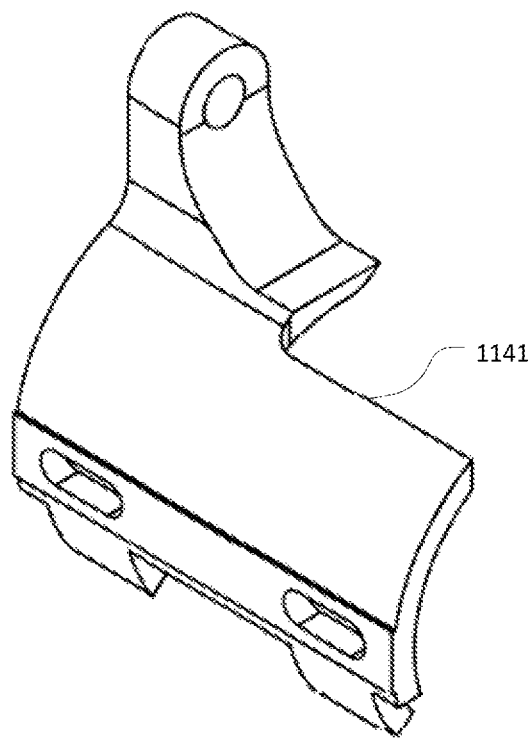
FIG. 36
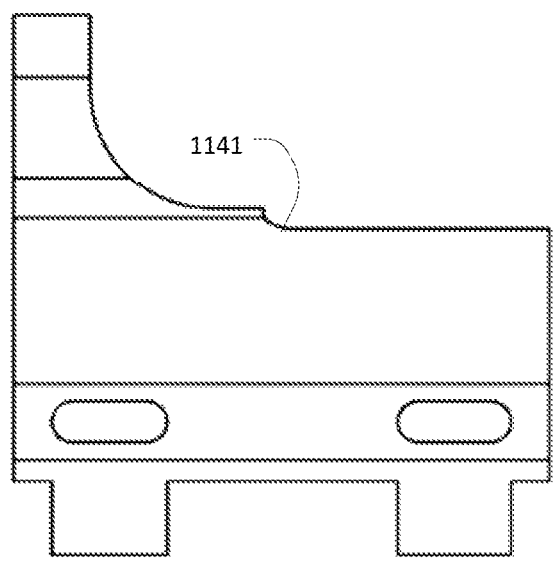 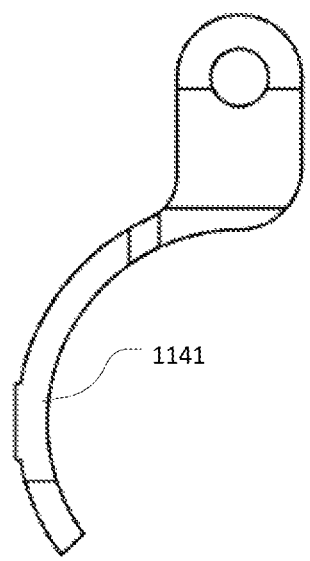
FIG. 37  FIG. 38

SELF-POWERED SOLAR TRACKER APPARATUS

CROSS REFERENCE TO RELATED APPLICATION

The present application relates to U.S. application Ser. No. 14/101,273 filed Dec. 9, 2013, which claims the benefit of U.S. Provisional Application No. 61/735,537 filed Dec. 10, 2012, each of which is incorporated by reference herein for all purposes.

The present disclosure is a continuation of U.S. patent application Ser. No. 16/128,022 filed Sep. 11, 2018, which is a continuation of U.S. patent application Ser. No. 14/972,036 filed Dec. 16, 2015, now U.S. Pat. No. 10,075,125, which claims the benefit and priority to U.S. Provisional Application No. 62/095,670, filed on Dec. 22, 2014, which is incorporated by reference herein in its entirety.

BACKGROUND

As the world population expands, so does the demand for energy. Energy often derives from sources like fossil fuels, including coal and oil, hydroelectric plants, nuclear sources, and others. The International Energy Agency projects further increases in oil consumption, with developing nations such as China and India accounting for most of the increase. Almost every element of our daily lives depends, in part, on oil, which is becoming increasingly scarce. As time further progresses, an era of inexpensive and plentiful oil is coming to an end. Accordingly, alternative sources of energy have been developed.

In addition to fossil fuels, other sources of energy such as hydroelectric, nuclear, and the like have been harvested to provide for our electricity needs. As an example, most electricity used by homes and businesses comes from turbines run on coal or other sources of fossil fuel, nuclear power generation plants, and hydroelectric plants, as well as other sources of renewable energy. Home and business use of electrical power has been widespread.

Much of the useful energy found on the Earth comes from our sun. Generally, all common plant life on the Earth achieves life using photosynthesis processes from sunlight. Fossil fuels such as oil were also developed from biological materials derived from energy associated with the sun. For life on the planet Earth, the sun has been one of our most important energy sources. The sun is fuel for modern-day solar energy.

Solar energy possesses many desirable characteristics. Solar energy is renewable, clean, abundant, and widespread. Certain technologies have been developed to capture, concentrate, and store solar energy. Other technologies have been developed to convert solar energy into other useful forms of energy.

Solar panels have been developed to convert sunlight into energy. As an example, solar thermal panels convert electromagnetic radiation from the sun into thermal energy for heating homes, running certain industrial processes, or driving high grade turbines to generate electricity. Solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successfully for certain applications, there are still limitations. Often, solar panels are unable to convert energy at their full potential due to the fact that the sun is often at an angle that is not optimum for the solar cells to receive solar energy. In the past, various types of conventional solar tracking mechanisms have been developed. Unfortunately, conventional solar tracking techniques are often inadequate. These and other limitations are described throughout the present specification and may be described in more detail below.

It is clear that techniques for improving solar systems are highly desirable.

SUMMARY

The present application relates generally to a tracking system for solar panels. More specifically, embodiments of the present invention provide tracking systems that are suitable for solar panels. In a specific embodiment, a tracking system according to the present invention is fully adjustable in at each of the pillars, among other aspects, and in particular a self powered solar tracker system. There are other embodiments as well.

In an example, the present invention provides a self powered tracker apparatus. The apparatus has a center of mass with an adjustable hanger assembly configured with a clam shell clamp assembly on the adjustable hanger assembly and a cylindrical torque tube comprising a plurality of torque tubes configured together in a continuous length from a first end to a second end such that the center of mass is aligned with a center of rotation of the cylindrical torque tubes to reduce a load of a motor operably coupled to the cylindrical torque tube. In an example, the apparatus has a plurality of solar modules spatially disposed and coupled to the plurality of torque tubes. The apparatus has a motor drive coupled to the motor. The apparatus also has an energy system comprising a solar panel energy source comprising a first electrode and a second electrode. In an example, the solar panel energy source being less than about 300 Watts or other variation. In an example, the energy system has a DC to DC converter coupled to the first electrode and the second electrode, a battery storage device coupled to the DC to DC converter, a boost converter comprising a first lead and a second lead coupled to the battery device, and a capacitor device coupled to the boost converter. In an example, the capacitor device is configured to provide a stable voltage for the motor drive. In an example, the system has a microcontroller comprising an input coupled to a motor current and a voltage, an input for a sensor to monitor a temperature of the battery device, an input for current and voltage from the solar panel energy source, and input for a current and voltage for the battery device. In an example, the system has one or more control signals operably coupled to the battery charger, the boost converter, and the motor drive. In an example, the energy system is configured to supply power to the motor to cause the tracker apparatus to operate with less than 15 Watt-hours per day of operation without an external energy source to provide a self powered tracker that is free from external power lines or the like.

Various additional objects, features and advantages of the present invention can be more fully appreciated with reference to the detailed description and accompanying drawings that follow.

BRIEF DESCRIPTION OF THE DRAWINGS

Various embodiments of the present disclosure will become more apparent in view of the attached drawings and accompanying detailed description, in which:

FIGS. 36, 37, and 38 are simplified perspective-view, side view, and front view diagrams of a clamp housing member according to an embodiment.

DETAILED DESCRIPTION OF THE EMBODIMENTS

Figure 1:
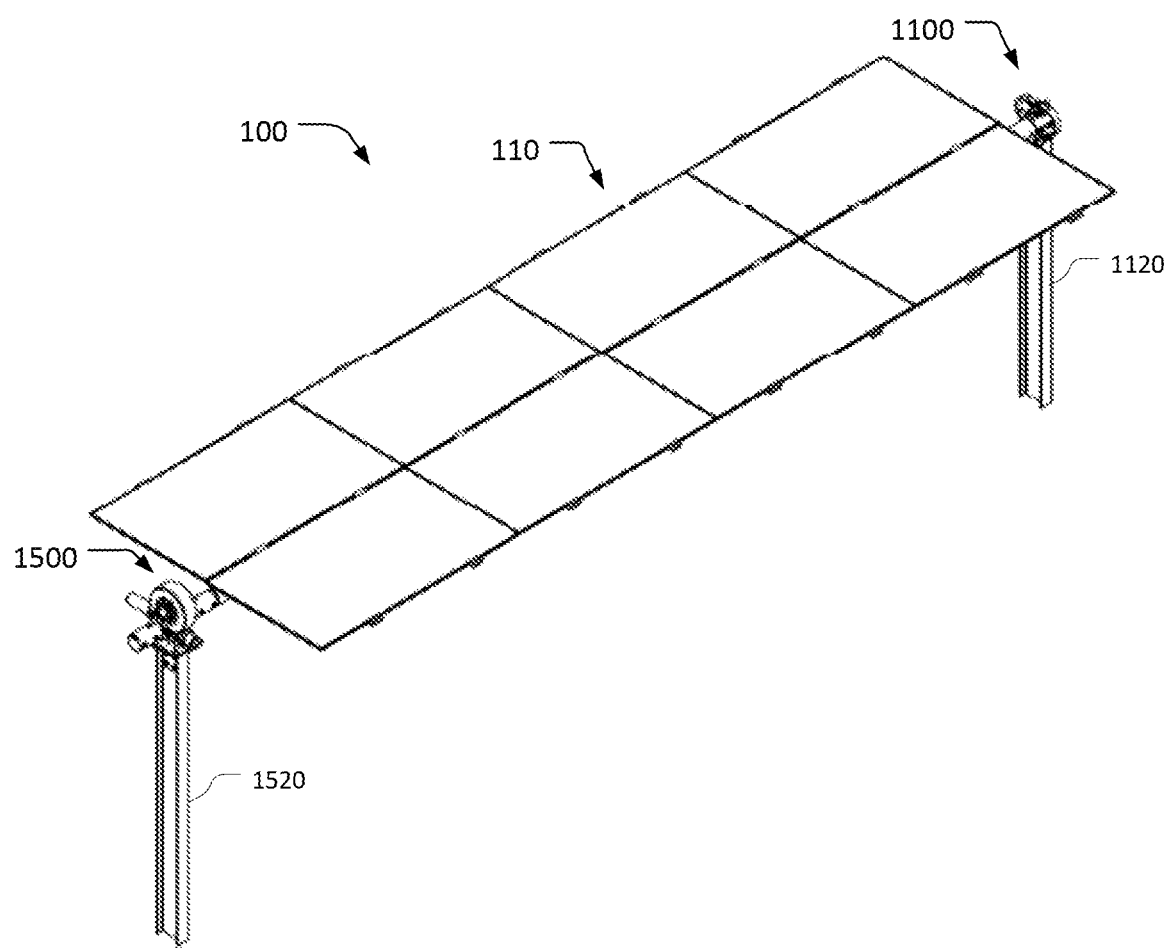
FIG. 1 is a simplified perspective view of a horizontal tracker apparatus including a plurality of solar modules according to an embodiment of the present disclosure.

The present application relates generally to a tracking system for solar panels. More specifically, embodiments of the present disclosure provide tracking systems that are suitable for solar panels. In a specific embodiment, a tracking system according to the present disclosure is fully adjustable in at each of the piers, among other aspects. There are other embodiments as well.

In a specific embodiment, the present disclosure provides a tracker apparatus for solar modules. The tracker apparatus has a first pier including a first hanger assembly and a second pier including a drive assembly including a drive mount. The drive mount is capable of compensating for construction tolerances in at least three axes, and is configured to a drive device. The drive device has an off-set clamp device coupled to a cylindrical bearing device coupled to a clamp housing member. The tracker apparatus has a cylindrical torque tube operably disposed on the first pier and the second pier. The cylindrical torque tube includes a first end and a second end, and a notch. The notch is one of a plurality of notches spatially disposed along a length of the cylindrical torque tube. The tracker apparatus has a clamp configured around an annular portion of the cylindrical torque tube and mate with the notch to prevent movement of the clamp. The clamp includes a support region configured to support a portion of a solar module.

In an example, the self powered solar tracker apparatus has a drive device. The apparatus has a crank coupled to the drive device and configured in an offset manner to a first end of a continuous torque tube, which has a plurality of torque tubes, each of the torque tubes being cylindrical in shape. In example, the apparatus has a frame assembly coupled to the continuous torque tube. In an example, the frame assembly coupled to a plurality of solar modules. In an example, the apparatus has a clamp assembly comprising a housing configured to be coupled to a second end of the continuous torque tube such that the continuous torque tube is suspended from the housing. In an example, the housing comprises an opening having a major plane normal to a length of the continuous torque tube. In an example, the opening comprises a first inner region and a second inner region, the first inner region acts as a first stop for the continuous torque tube when moved in a first radial direction until contact with the first inner region, and the second inner region acts as a second stop for the continuous torque tube when moved in a second radial direction until contact with the second inner region. In an example, the drive motor is operable to move the torque tube about a center of rotation and is substantially free from a load and moves the torque tube about the center of rotation at substantially a same force from a first radial position to a second radial position. In an example, the center of rotation is offset from a center of the continuous torque tube via the crank configured in the offset manner. Further details are provided throughout the present specification and more particularly below.

In an alternative embodiment, the present disclosure provides an alternative solar tracker apparatus. The tracker apparatus has a drive device, a crank coupled to the drive device and configured in an offset manner to a frame assembly. The frame assembly is coupled to a plurality of solar modules.

In an embodiment, the tracker apparatus has a continuous torque tube spatially disposed from a first region to a second region. The crank includes a first crank 1541 coupled to a first side of the drive device and a second crank 1542 coupled to a second side of the drive device. A first torque tube is coupled to the first crank 1541 and a second torque tube is coupled to the second crank 1542. A first swage fitting couples the first crank 1541 to the first torque tube and a second swage fitting couples the second crank 1542 to the second torque tube. The tracker apparatus also has a second pier coupled to the drive device. In an embodiment, the tracker apparatus also has a drive mount coupled to the second pier.

In an alternative embodiment, the present disclosure provides an alternative solar tracker apparatus. The tracker apparatus has an adjustable hanger assembly aligned with a center of mass and configured with a clam shell clamp housing member assembly on the adjustable hanger assembly and a cylindrical torque tube including a plurality of torque tubes configured together in a continuous length from a first end to a second end such that the center of mass is aligned with a center of rotation of the cylindrical torque tubes to reduce a load of a drive motor operably coupled to the cylindrical torque tube.

In an embodiment, the drive motor is operable to move the torque tube about the center of rotation and is substantially free from a load. The center of rotation is offset from a center of the cylindrical torque tube.

In an alternative embodiment, the present disclosure provides a solar tracker apparatus. The tracker apparatus has a clamp housing member configured in an upright direction. The clamp housing member includes a lower region and an upper region. The lower region is coupled to a pier structure, and the upper region includes a spherical bearing device. The upright direction is away from a direction of gravity. The tracker apparatus has a clam shell clamp housing member coupled to the spherical bearing and a torque tube coupled to the spherical bearing device to support the torque tube from the upper region of the clamp housing member. The torque tube is configured in an off-set position from a center region of rotation.

In an embodiment, the tracker apparatus is configured substantially free from any welds during assembly. Reduced welding lowers cost, improves installation time, avoids errors in installation, improves manufacturability, and reduces component count through standardized parts. The torque tube is coupled to another torque tube via a swage device within a vicinity of the clam shell clamp housing member. In an embodiment, the connection is low cost, and provides for strong axial and torsional loading. The tracker apparatus is quick to install with the pokey-yoke design.

The torque tube is coupled to an elastomeric damper in line to dampen torque movement to be substantially free from formation of a harmonic waveform along any portion of a plurality of solar panels configured to the torque tube. The tracker apparatus also has a locking damper or rigid structure to configure a solar panel coupled to the torque tube in a fixed tilt position to prevent damage by securing the solar panel in a position that is substantially free from fluttering in an environment with high movement of air.

The tracker apparatus further includes a controller tracker apparatus configured in an inserter box provided in an underground region to protect the controller tracker apparatus. The tracker apparatus has a drive device to linearly actuate the torque tube. In an embodiment, the tracker apparatus uses an electrical connection coupled to a drive device.

In an embodiment, the spherical bearing device allows for accommodation of a construction tolerance, tracker movement, and acts as a bonding path of least resistance for taking an electrical current to ground.

The tracker apparatus can be one of a plurality of tracker apparatus configured in an array within a geographic region. Each of the plurality of tracker apparatus is driven independently of each other to cause each row to stow independently at a different or similar angle.

Still further, the present disclosure provides a tracker apparatus including a clam shell clamp, which has a first member operably coupled to a second member to hold a torque tube in place.

In an embodiment, the tracker apparatus also has a clamp housing member operably coupled to the clam shell clamp via a spherical bearing device such that the spherical bearing device includes an axis of rotation. The axis of rotation is different from a center of the torque tube. The tracker apparatus further includes a solar module coupled to the torque tube.

In an embodiment, the disclosure provides a tracker apparatus including a plurality of torque tubes including a first torque tube coupled to a second torque tube coupled to an Nth torque tube, wherein N is an integer greater than 2. Each pair of torque tubes is coupled to each other free from any welds.

In an embodiment, each pair of torque tubes is swage-fitted together. Each of the torque tubes is cylindrical in shape. Each of the plurality of torque tubes is characterized by a length greater than 80 meters. Each of the torque tubes includes a plurality of notches. In an embodiment, the tracker apparatus also has a plurality of U-bolt devices coupled respectively to the plurality of notches. Each of the plurality of torque tubes are made of steel.

In an alternative embodiment, the present disclosure provides a tracker apparatus having a pier member including a lower region and an upper region. A clamp holding member is configured to the upper region and is capable of moving in at least a first direction, a second direction opposite to the first direction, a third direction normal to the first direction and the second direction, a fourth direction opposite to the third direction, a fifth direction normal to the first direction, the second direction, the third direction, and the fourth direction, and a sixth direction opposite to the fifth direction.

In yet an alternative embodiment, the present disclosure provides a solar tracker apparatus. The tracker apparatus has a clamp housing member configured in an upright direction. The clamp housing member includes a lower region and an upper region. The lower region is coupled to a pier structure. The upper region includes a spherical bearing device. The upright direction is away from a direction of gravity. The tracker apparatus has a clam shell clamp housing member coupled to the spherical bearing and the clam shell clamp housing member being suspended from the spherical bearing. In an example, the bearing can also by cylindrical, or fixed within a support structure, which allows the torque tube to hang freely. In an embodiment, the tracker apparatus has a torque tube including a first end and a second end. The first end is coupled to the spherical bearing device to support the torque tube from the upper region of the clamp housing member. The torque tube is configured in an off-set position from a center region of rotation. The tracker apparatus has a drive device coupled to the second end such that the drive device and the torque tube are configured to be substantially free from a twisting action while under a load, e.g., rotation, wind, other internal or external forces.

In an embodiment, the present disclosure provides a solar tracker apparatus. In an embodiment, the tracker apparatus includes an adjustable hanger assembly aligned with a center of mass and configured with a clam shell clamp housing member assembly on the adjustable hanger assembly and a cylindrical torque tube including a plurality of torque tubes configured together in a continuous length from a first end to a second end such that the center of mass is aligned with a center of rotation of the cylindrical torque tubes to reduce a load of a drive motor operably coupled to the cylindrical torque tube. Further details of the present example, among others, can be found throughout the present specification and more particularly below.

FIG. 1 is a simplified perspective view of a horizontal tracker apparatus 100 including a plurality of solar modules 110 according to an embodiment of the present disclosure. As shown, the present disclosure provides a tracker apparatus 100 for solar modules 110. In an embodiment, the solar modules 110 can be a silicon based solar module, a poly silicon based solar module, a concentrated solar module, or a thin film solar module, including cadmium telluride (CdTe), copper indium gallium selenide (CuIn1-xGaxSe2 or CIGS), which is a direct bandgap semiconductor useful for the manufacture of solar cells, among others. As shown, each of the solar panels can be arranged in pairs, which form an array. Of course, there can be other variations. In an embodiment, the first pier and the second pier are provided on a sloped surface, an irregular surface, or a flat surface. A first pier and a second pier are two of a plurality of piers provided for the tracker apparatus 100. In example, the tracker apparatus 100 has a solar module held in a hanging position or a supporting position.

The tracker apparatus 100 has a first pier including a first hanger assembly and a second pier including a drive assembly. In an embodiment, the first pier is made of a solid or patterned metal structure, such as a wide beam flange or the like, as shown. In an embodiment, each of the piers is inserted into the ground, and sealed, using cement or other attachment material. Each pier is provided in generally an upright position and in the direction of gravity, although there can be variations. In an embodiment, each of the piers is spatially spaced along a region of the ground, which may be flat or along a hillside or other structure, according to an embodiment. In an embodiment, the first pier includes a wide flange beam. In an embodiment, the first pier and the second pier can be off-set and reconfigurable.

In an embodiment, the drive assembly is capable for construction tolerances in at least three axes, and includes a drive mount that is configured to a drive device. The drive device has an off-set clamp device coupled to a cylindrical bearing device coupled to a clamp housing member.

In an embodiment, the tracker apparatus 100 has a cylindrical torque tube operably disposed on the first pier and the second pier. In an embodiment, the cylindrical torque tube includes a one to ten inch diameter pipe made of Hollow Structure Steel (HSS) steel. The cylindrical torque tube includes a first end and a second end, and a notch. The notch is one of a plurality of notches spatially disposed along a length of the cylindrical torque tube.

In an embodiment, the tracker apparatus 100 has a clamp configured around an annular portion of the cylindrical torque tube. The clamp mates with the notch to prevent movement of the clamp. The clamp includes a support region configured to support a portion of a solar module. The clamp includes a pin configured with the notch. The tracker apparatus 100 also has a rail configured to the clamp. The rail includes a thread region configured to hold a bolt, which is adapted to screw into the thread and bottom out against a portion of cylindrical torque tube such that the clamp is desirably torqued against the cylindrical torque tube. The tracker apparatus 100 has a solar module attached to the rail or other attachment device-shared module claim or other devices. The cylindrical torque tube 3400 is one of a plurality of torque tubes configured in as a continuous structure and extends in length for 80 to 200 meters. Each pair of torque tubes is swage fitted together, and bolted for the configuration.

In an embodiment, the tracker apparatus 100 also has a center of mass along an axial direction that is matched with a pivot point of the drive device. The pivot point of the drive device is fixed in three dimensions while rotating along the center of mass. In an embodiment, the off-set clamp includes a crank device. The first hanger assembly includes a spherical bearing device configured a clam-shell clamp device to secure the first end to the cylindrical torque tube. In other examples, the drive device includes a slew gear. The tracker apparatus 100 also has an overrun device configured with the first hanger assembly. The overrun device includes a mechanical stop to allow the cylindrical torque tube to rotate about a desired range. Further details of the present tracker apparatus 100 can be found throughout the present specification and more particularly below.

Figure 2:
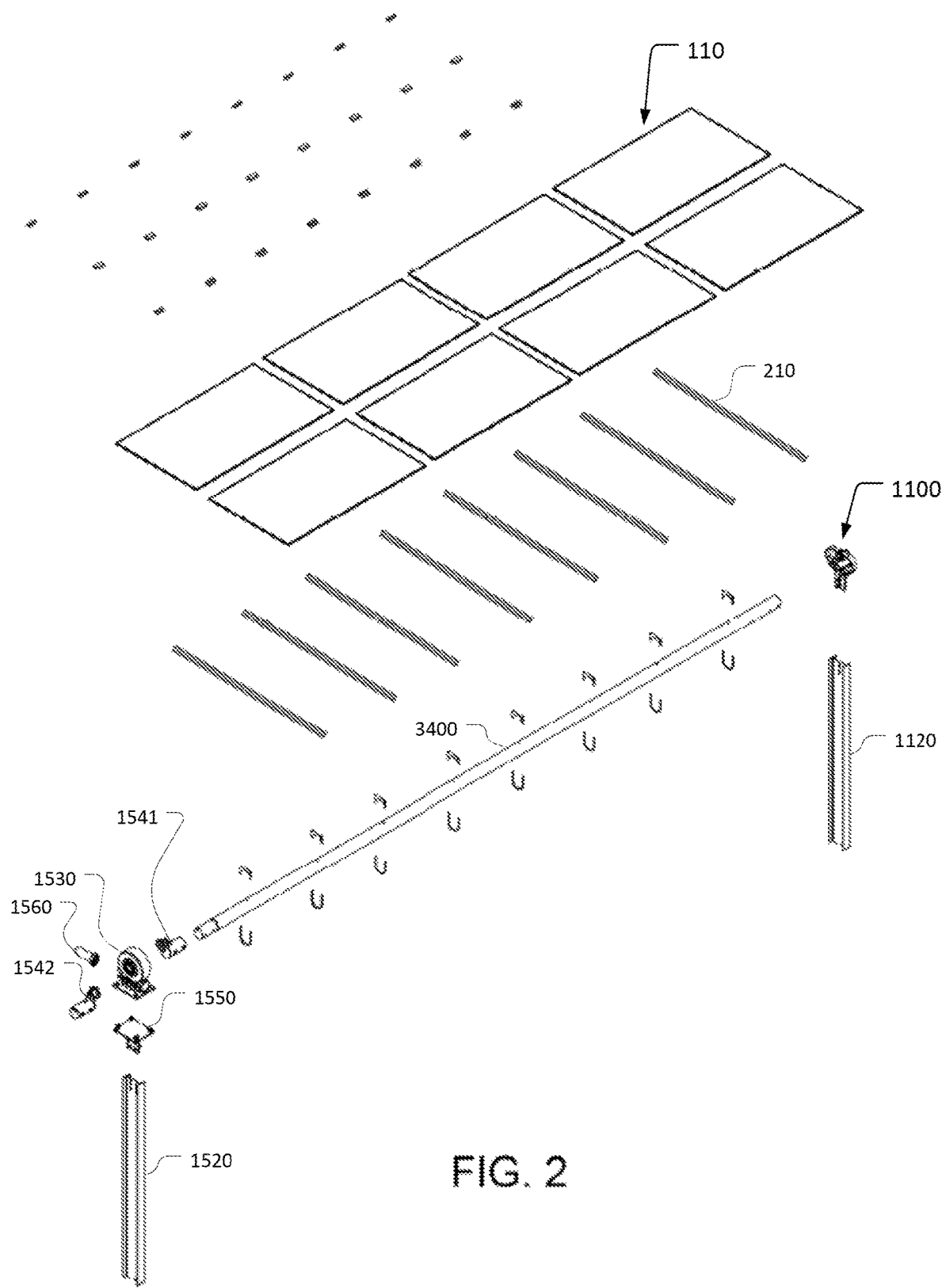
FIGS. 2 through 7 illustrate assembly steps for a process of assembling the horizontal tracker apparatus of FIG. 1.
Figure 3:
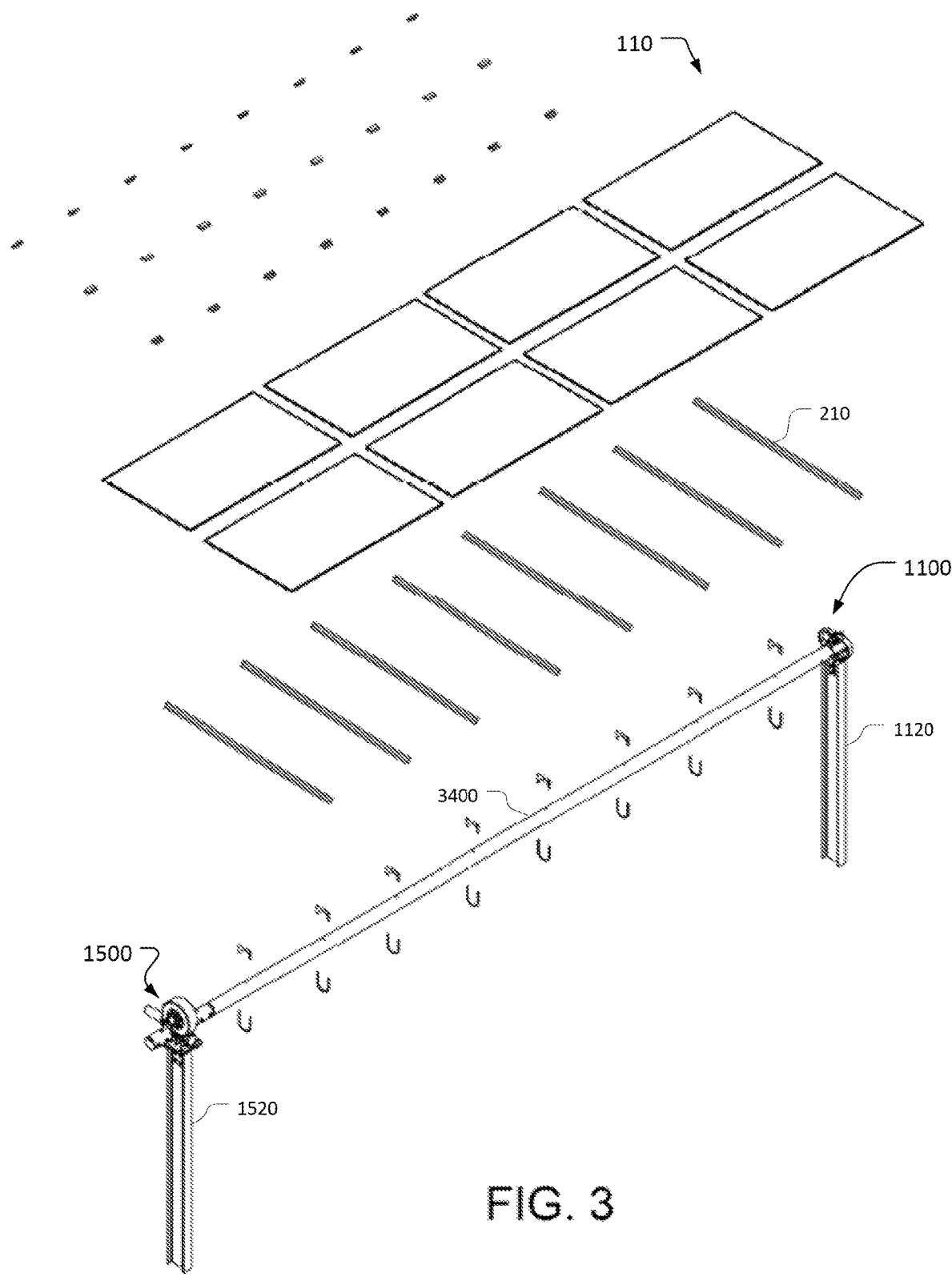
Figure 4:
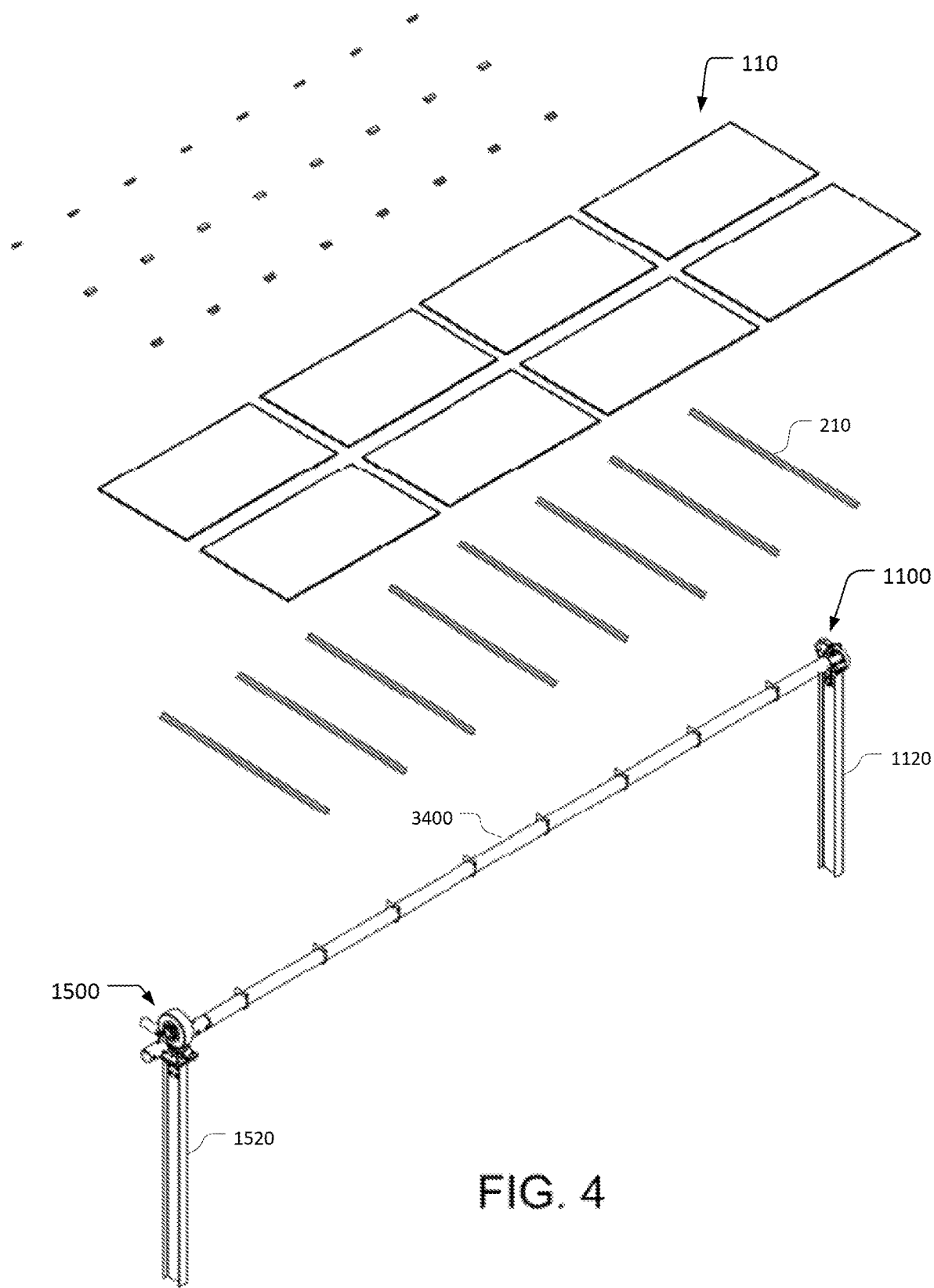
Figure 5:
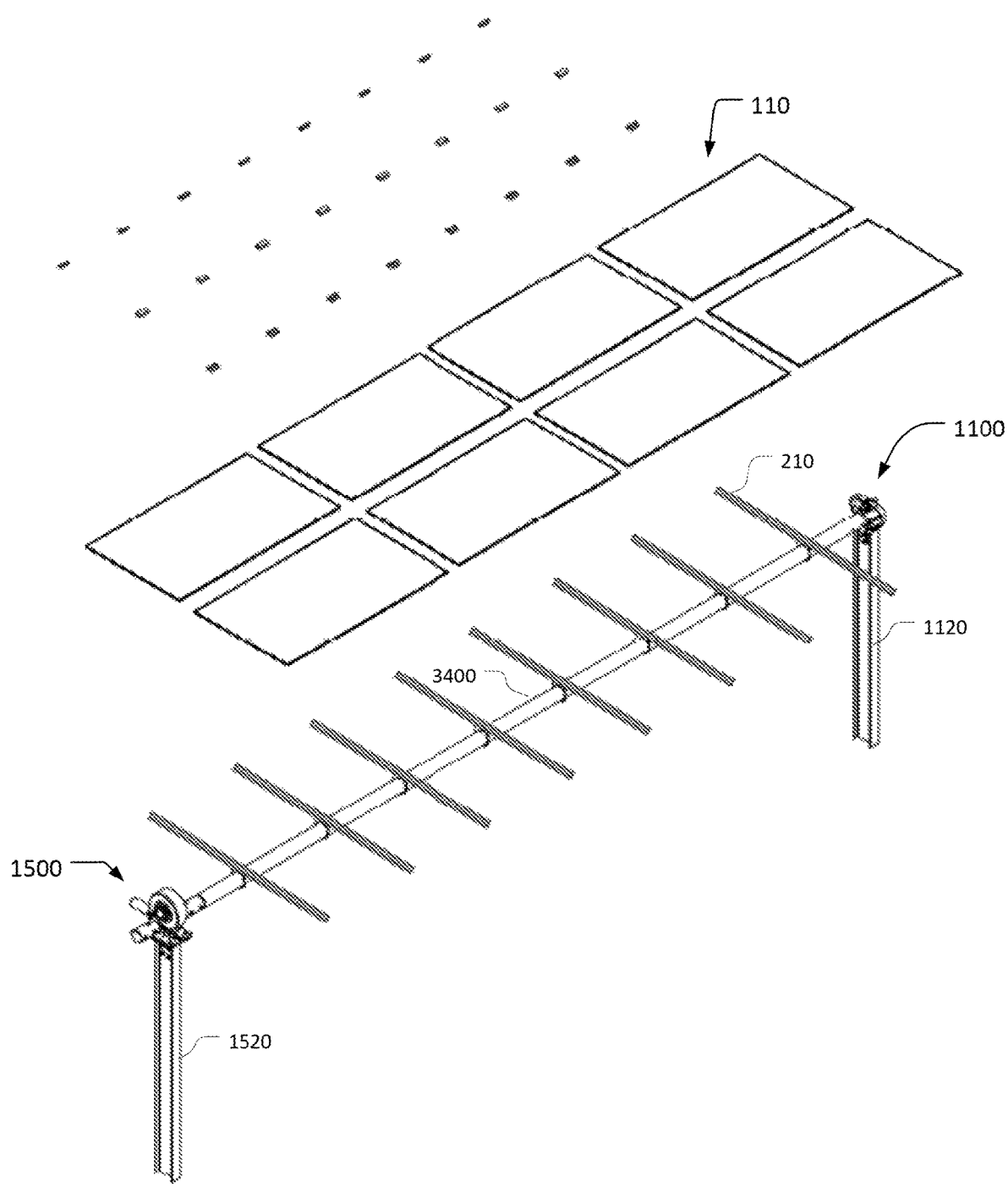
Figure 6:
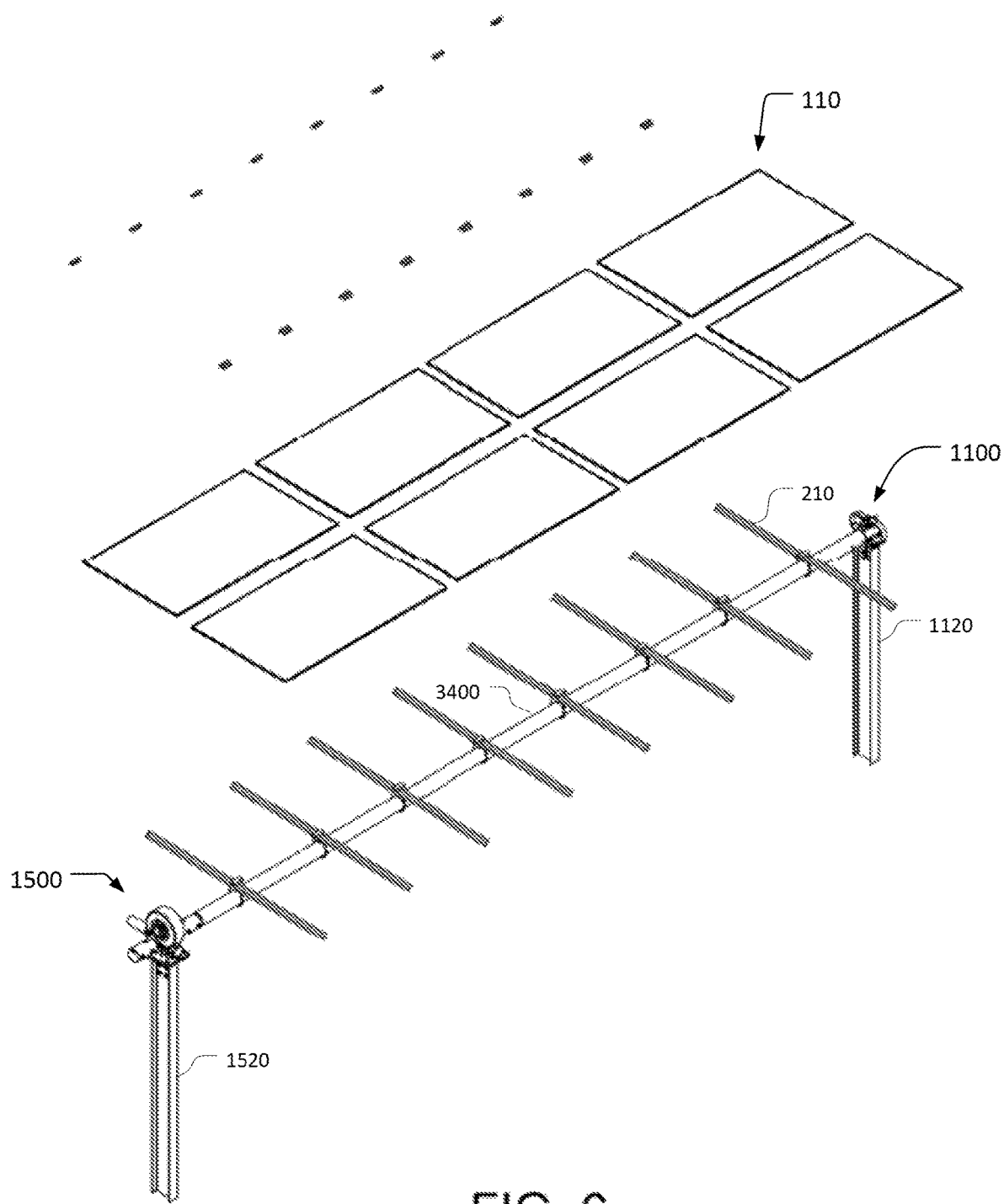
Figure 7:
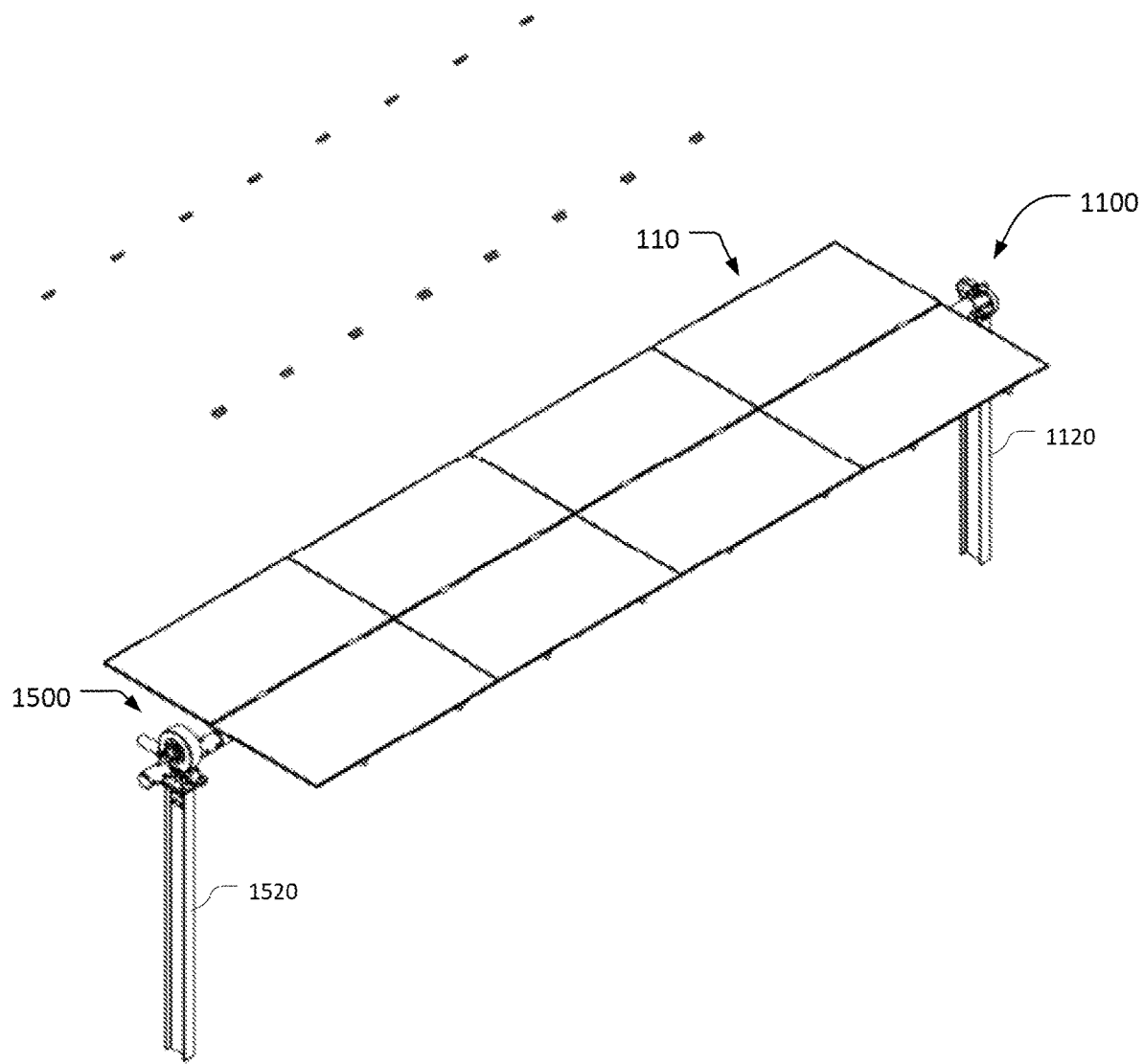

FIGS. 2 through 7 illustrate assembly steps for a process of assembling the horizontal tracker apparatus 100 of FIG. 1. FIG. 2 illustrates an exploded view of the horizontal tracker apparatus 100 of FIG. 1. FIGS. 3 through 7 show partially exploded views of the horizontal tracker apparatus 100 of FIG. 1.

As shown, the process includes disposing a first pier 1120 into a first ground structure. The process also includes disposing a second pier 1520 into a second ground structure. Each of the piers is one of a plurality of piers to be spatially disposed along a ground structure for one row of solar modules configured to a tracker apparatus 100.

In an embodiment, the process includes configuring a first hanger assembly on the first pier.

In an embodiment, the process includes configuring a drive mount 1550 on the second pier 1520. In an embodiment, the drive mount 1550 is capable of compensating for construction tolerances in at least three axes. In an embodiment, the drive mount 1550 is configured to a drive device 1530 having on or more off-set clamp devices 1541 or 1542 coupled to a cylindrical bearing device coupled to a clamp housing member.

In an embodiment, the process includes assembling a cylindrical torque tube 3400 and operably disposing on the first pier and the second pier cylindrical torque tube 3400. The cylindrical torque tube 3400 includes a first end and a second end, and a notch. In an embodiment, the notch is one of a plurality of notches spatially disposed along a length of the cylindrical torque tube 3400.

In an embodiment, the process includes assembling a plurality of clamps spatially disposed and configured around an annular portion of the cylindrical torque tube 3400. Each of the plurality of clamps is configured to mate with a respective notch to prevent movement of the clamp. In an embodiment, the clamp includes a support region configured to support a portion of a solar module.

In an embodiment, the process includes attaching a rail 210 configured to each of the clamps, the rail 210 including a thread region configured to hold a bolt. The bolt is adapted to screw into the thread and bottom out against a portion of cylindrical torque tube 3400 such that the clamp is desirably torqued against the cylindrical torque tube 3400.

In an embodiment, the process includes attaching a solar module 110 to the rail 210 or other attachment device. Further details of other examples can be found throughout the present specification and more particularly below.

Figure 8:
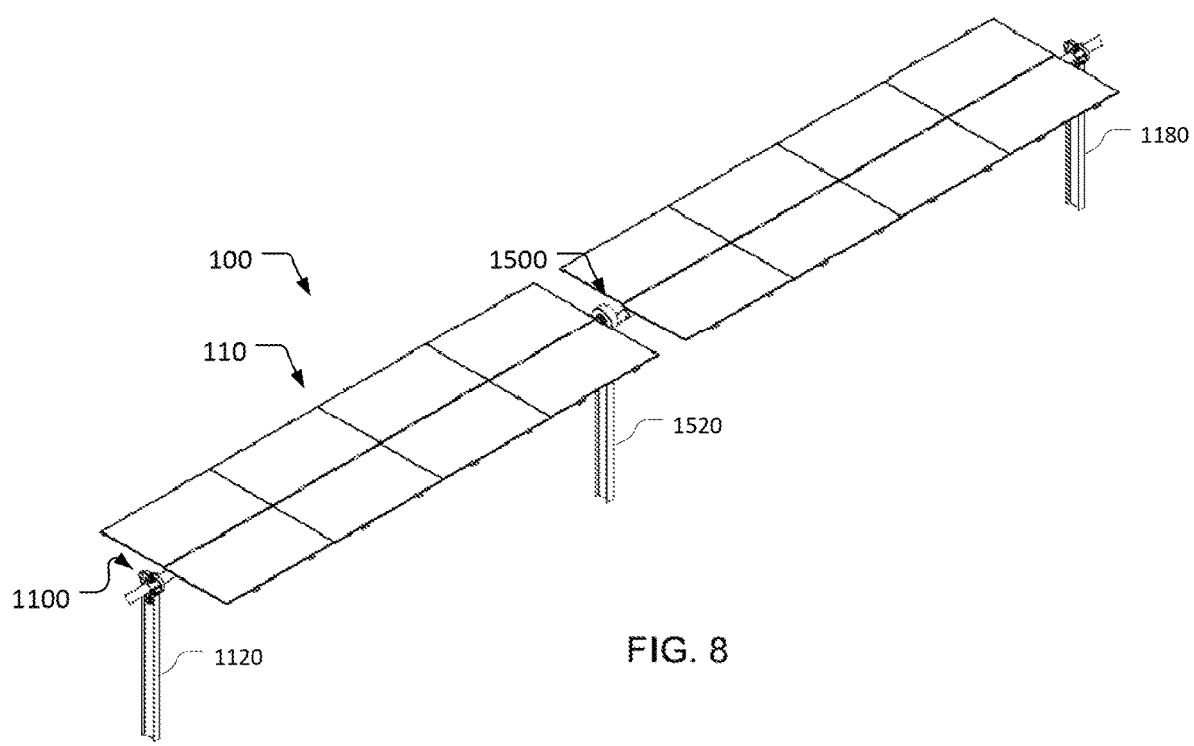
FIG. 8 is a simplified perspective view of a pair of horizontal tracker apparatus configured together with a plurality of solar panels according to an embodiment.

FIG. 8 is a simplified perspective view of a pair of horizontal tracker apparatuses, including the tracker apparatus 100, configured together with a plurality of solar panels according to an embodiment. As shown is a tracker apparatus 100 for solar modules. The tracker apparatus 100 has a first pier 1120 including a first hanger assembly, a second pier 1520 including a drive assembly, and a third pier 1180 including a second hanger assembly. The second pier 1520 is between the first and third piers 1120 and 1180, as shown in an embodiment. Of course, additional piers can be configured on each outer side of the first and third piers 1120 and 1180.

In an embodiment, the drive assembly is capable of compensating for construction tolerances in at least three axes, and includes a drive mount that is configured to a drive device. The drive device has an off-set clamp device coupled to a cylindrical bearing device coupled to a clamp housing member.

In an embodiment, the tracker apparatus 100 has a cylindrical torque tube operably disposed on the first pier and the second pier, and then on the third pier. In an embodiment, the cylindrical torque tube includes a first end and a second end, and a notch. The notch is one of a plurality of notches spatially disposed along a length of the cylindrical torque tube. The tracker apparatus 100 has a clamp configured around an annular portion of the cylindrical torque tube. The clamp mates with the notch to prevent movement of the clamp. The clamp includes a support region configured to support a portion of a solar module. In an embodiment, the cylindrical torque tube is configured to the drive device to rotate the cylindrical torque tube while each of the clamp housing members holds the tube in place. Further details of the present tracker apparatus 100 can be found throughout the present specification and more particularly below.

Figure 9:
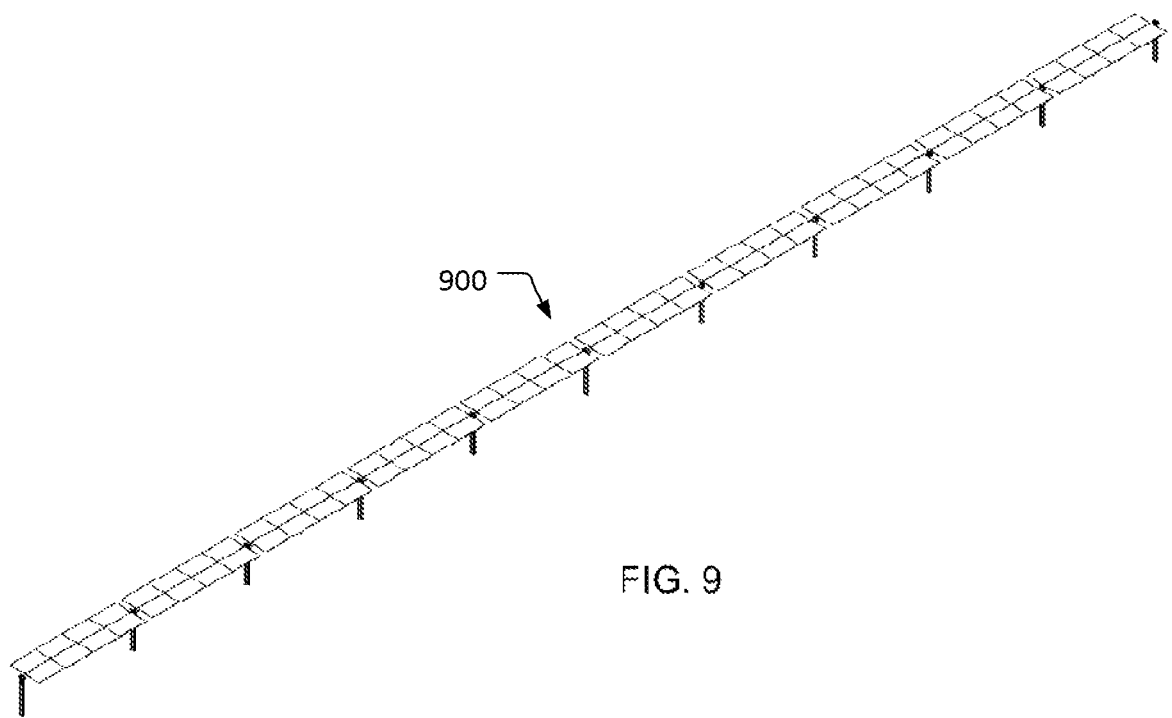
FIG. 9 is a simplified diagram of a plurality of horizontal tracker apparatuses configured together according to an embodiment.

FIG. 9 is a simplified diagram of a horizontal tracker apparatuses 900 including a plurality of tracker apparatuses configured together according to an embodiment. As shown is a solar tracker apparatus 900. The tracker apparatus 900 includes an adjustable hanger assembly aligned with a center of mass and configured with a clam shell clamp on the adjustable hanger assembly and a cylindrical torque tube including a plurality of torque tubes configured together in a continuous length from a first end to a second end such that the center of mass is aligned with a center of rotation of the cylindrical torque tubes to reduce a load of a drive motor operably coupled to the cylindrical torque tube. In an embodiment, the drive motor is operable to move the torque tube about the center of rotation and is substantially free from a load. The center of rotation is offset from a center of the cylindrical torque tube.

In an embodiment, the disclosure provides a tracker apparatus 900 including a plurality of torque tubes including a first torque tube coupled to a second torque tube coupled to an Nth torque tube, wherein N is an integer greater than 2. Each pair of torque tubes is coupled to each other free from any welds.

In an embodiment, a single drive motor can be coupled to a center region of the plurality of torque tubes to rotate the torque tube in a desirable manner to allow each of the solar modules to track a direction of electromagnetic radiation from the sun.

In an embodiment, each tracker apparatus 900 includes a torque tube coupled to an array of solar panels, as shown. Each of the tracker apparatus 900 is coupled to each other via the torque tube, and a hanger assembly. Each tracker has a corresponding pair of piers, a torque tube, and one or more hanger assemblies, as shown. Further details of each of these elements are described in detail throughout the present specification.

Figure 10:
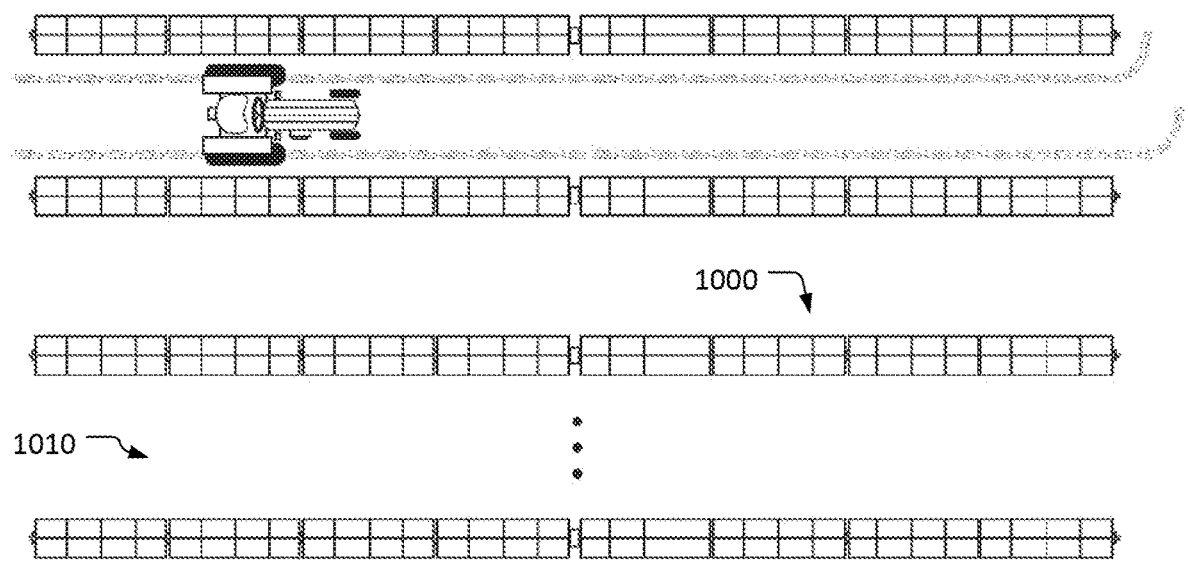
FIG. 10 is a simplified diagram of an array of a plurality of horizontal tracker apparatuses configured together according to an embodiment.

FIG. 10 is a simplified diagram of an array of a plurality of horizontal tracker apparatuses configured together according to an embodiment. As shown are an array of horizontally configured tracker devices to form a plurality of rows 1000 of tracker devices arranged in a parallel manner. Each pair of rows 1000 of tracker devices has an avenue 1010, which allows for other applications. For example, row crops or other things can be provided in the avenue 1010, which extends along an entirety of each horizontal tracker row 1000.

In an embodiment, the plurality of tracker apparatus are configured in an array within a geographic region. Each of the plurality of tracker apparatus is driven independently of each other to cause each row 1000 of tracker devices 1000 to stow independently at a different or similar angle.

Unlike conventional trackers, which often have mechanical devices between the rows of tracker devices 1000, each of the avenues 1010 is continuous from one end to the other end, as allows for a tractor or other vehicle to drive from one end to the other end in a an embodiment. Of course, there can be other variations, modifications, and alternatives.

In an embodiment, each tracker apparatus is configured substantially free from any welds during assembly, and can be assembled using conventional tools. In an embodiment, the torque tube is coupled to another torque tube via a swage device within a vicinity of the clam shell clamp housing member.

In an embodiment, the torque tube is coupled to an elastomeric damper in line to dampen torque movement to be substantially free from formation of a harmonic waveform along any portion of a plurality of solar panels configured to the torque tube.

In an embodiment, each tracker apparatus further including a locking damper or rigid structure to configure a solar panel coupled to the torque tube in a fixed tilt position to prevent damage by securing the solar panel in a position that is substantially free from fluttering in an environment with high movement of air. In an embodiment, the locking damper fixes each of the plurality of solar modules in a desirable angle relative to the direction of air or wind.

In an embodiment, each tracker apparatus has a controller tracker apparatus configured in an inserter box provided in an underground region to protect the controller tracker apparatus. In an embodiment, the inserter box is made of a suitable material, and is sealed and/or environmentally suitable to protect the controller tracker apparatus.

In operation, each tracker apparatus has a drive device to linearly actuate the torque tube to provide desirable positioning of each of the solar modules relative to incident electromagnetic radiation. In an embodiment, an electrical connection and power source (e.g., 120V, 60 Hz, 240V) is coupled to a drive device. In an embodiment, each row 1000 has a drive device that linearly actuates the torque tubes of the row. Of course, there can be variations.

Figure 11:
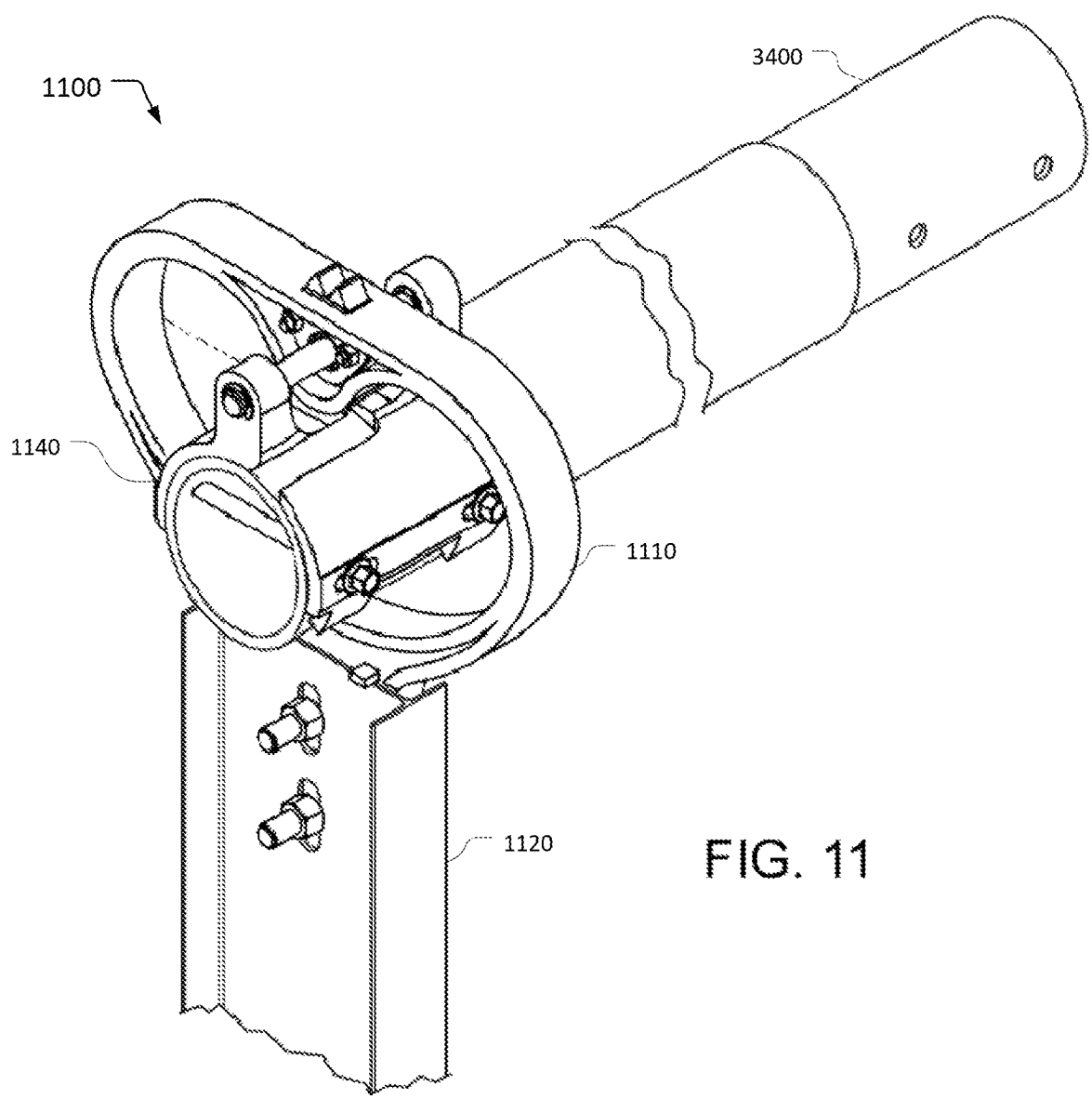
FIG. 11 is a simplified diagram of a clamp assembly for the horizontal tracker of FIG. 1 according to an embodiment.

FIG. 11 is a simplified diagram of a clamp assembly 1100 for the horizontal tracker of FIG. 1 according to an embodiment. As shown, the clamp assembly 1100 has a clamp housing member 1110 configured in an upright direction, which is a direction away from a direction of gravity. In an embodiment, the clamp housing member 1110 includes a lower region and an upper region.

The lower region is coupled to a first pier 1120. The lower region has a thickness of material including bolt openings, which align to openings on an upper portion of the first pier 1120. Locking nuts and bolts are configured to hold the lower region of the clamp housing member 1110 to the first pier 1120 in an upright manner. At least a pair of openings are provided in each of the lower region of the clamp housing member 1110 and the first pier 1120, as shown.

Figure 12:
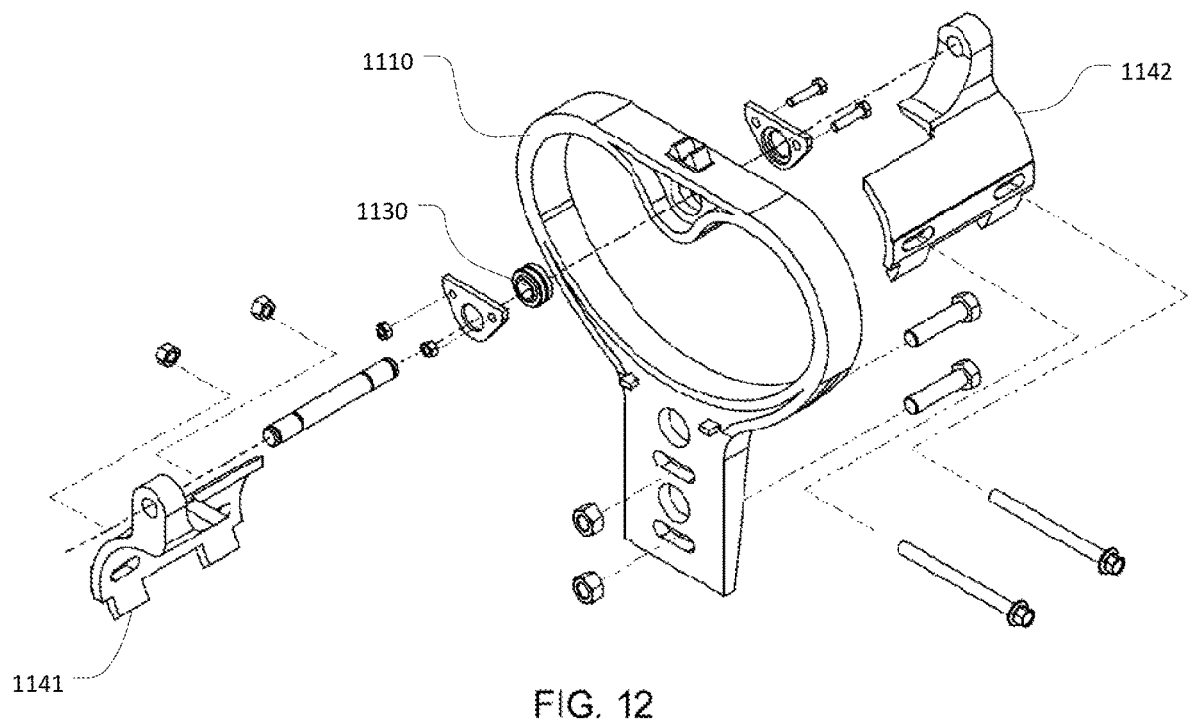
FIGS. 12 through 14 are simplified diagrams illustrating assembly steps for a process for assembling the clamp assembly of FIG. 11.

In an embodiment, the upper region includes a spherical bearing device 1130, as shown in FIG. 12. The upper region has a tongue structure, which has an opening that houses the spherical bearing device 1130 between a pair of plates, which hold the spherical bearing device 1130 in place. In an embodiment, the spherical bearing device 1130 allows for rotational movement in each of the three axis directions within a desirable range. Each of the plates is disposed within a recessed region on each side of the tongue structure. Each of the plates may include a fastener to hold such plate in place within the recessed region.

In an embodiment, clamp assembly 1100 has a clamp housing member 1110 coupled to the spherical bearing device 1130 and the clam shell clamp 1140 being suspended from the spherical bearing device 1130. The clam shell clamp 1140 has a first side 1141 and a second side 1142. Each of the first and second sides 1141 and 1142 has an upper region including an opening. A pin is inserted through each of the openings, while an opening of the spherical bearing device 1130 is provided as a third suspension region between each of the openings, as shown.

Figure 14:
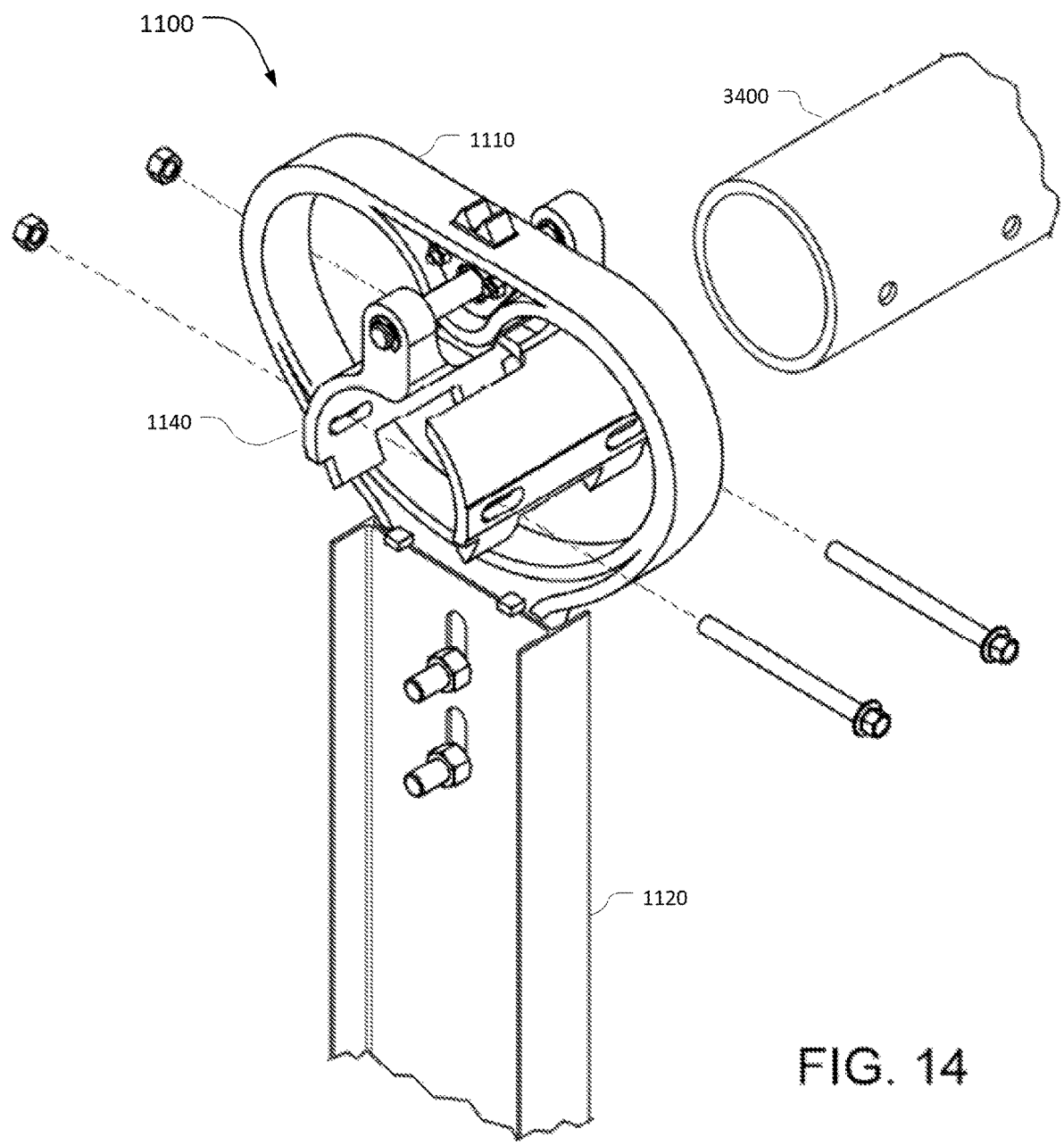

Each of the first and second sides 1141 and 1142 of the clam shell clamp 1140 is shaped to conform or couple to at least one side of a portion of the torque tube 3400, as shown in FIG. 14. Each of the first and second sides 1141 and 1142 has one or more openings, which align to one or more openings on the portion of the torque tube 3400. A pin or bolt is inserted through each of the openings to clamp the clam shell clamp to the portion of the torque tube 3400 and the clam shell clamp 1140 surrounds substantially an entirety of a peripheral region of the torque tube 3400. The pin or bolt or pins or bolts also holds the torque tube 3400 in a fixed position relative to the clam shell clamp 1140 to prevent the torque tube 3400 from slipping and/or twisting within the clam shell clamp 1140. Of course, there can be variations.

In an embodiment, the spherical bearing device 1130 allows for a construction tolerance, tracker movement, and acts as a bonding path of least resistance for taking an electrical current to ground. The bonding path occurs from any of the solar modules, through the frame, to each of the clamp assembly 1100, to one or more piers, and then to ground.

In an embodiment, the torque tube 3400 includes a first end and a second end. The spherical bearing device 1130 supports the torque tube 3400 from the upper region of the clamp housing member 1110. In an embodiment, the torque tube 3400 is configured in an off-set position from a center region of rotation.

In an embodiment, a drive device, which will be described in more detail below, is coupled to the second end such that the drive device and the torque tube 3400 are configured to be substantially free from a twisting action while under a load.

In an embodiment, the clam shell clamp 1140 includes a first member operably coupled to a second member to hold a torque tube 3400 in place. In an embodiment, the tracker apparatus has a clamp housing member 1110 operably coupled to the clam shell clamp 1140 via a spherical bearing device 1130 such that the spherical bearing device 1130 includes an axis of rotation, which is different from a center of the torque tube 3400.

Figure 13:
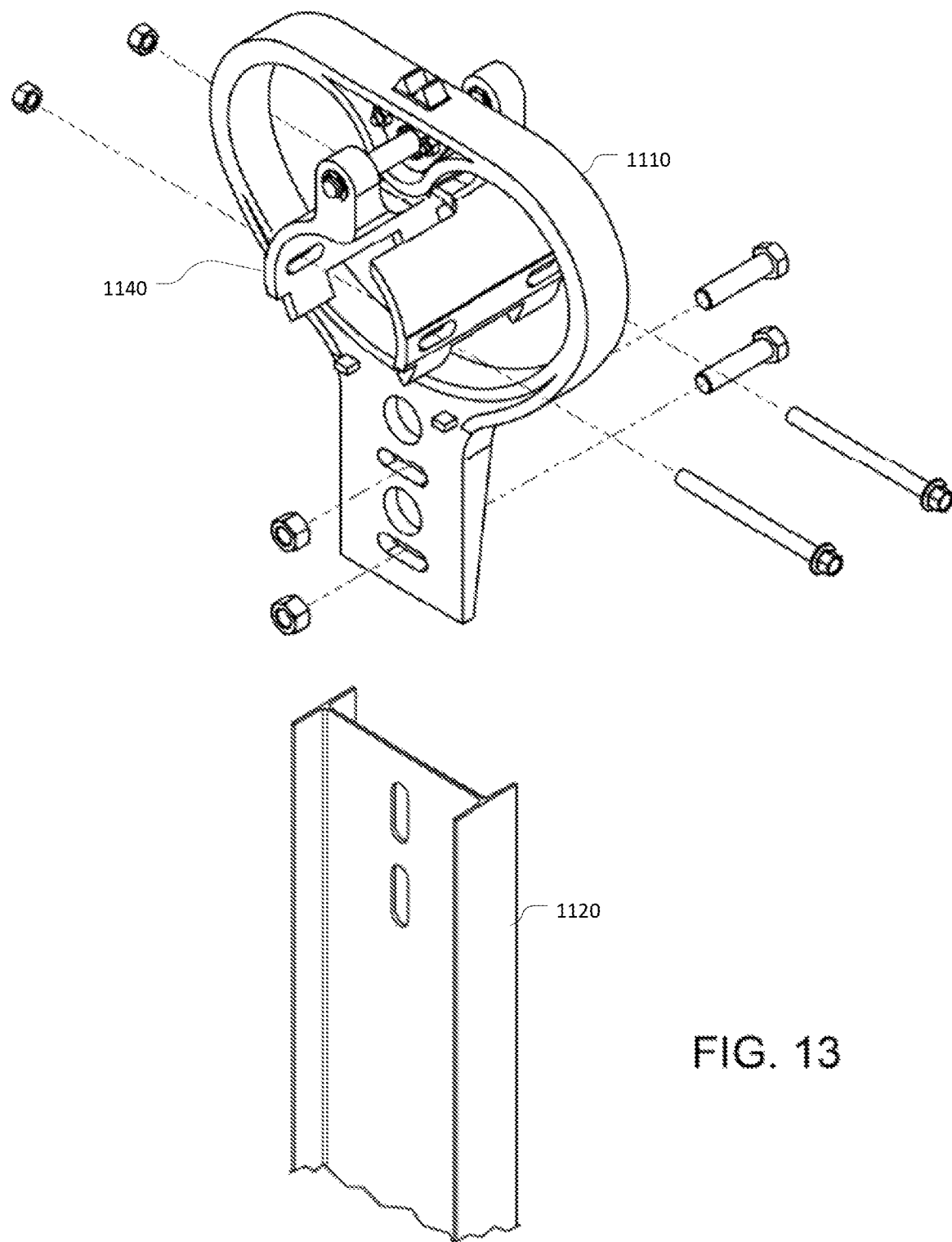

FIGS. 12 through 14 are simplified diagrams illustrating assembly steps for a process for assembling the clamp assembly 1100 of FIG. 11. FIG. 12 shows an exploded view of the clamp assembly 1100 of FIG. 11. FIGS. 13 and 14 show partially exploded views of the clamp assembly 1100 of FIG. 11.

In an embodiment, the present process is for assembling a solar tracker apparatus. The process includes providing a clamp housing member 1110 configured in an upright direction. The clamp housing member 1110 includes a lower region and an upper region. In an embodiment, the lower region is coupled to a first pier 1120. The upper region includes a spherical bearing device 1130. In an embodiment, the upright direction is away from a direction of gravity. In an embodiment, the process includes coupling a first half clam shell clamp or first side 1141 and a second half clam shell clamp or second side 1142 (collectively a clam shell clamp 1140) to the spherical bearing device 1130. The process also includes supporting a torque tube 3400 between the first half clam shell clamp 1141 and the second half clam shell clamp 1142, each of which is coupled to the spherical bearing device 1130 to support the torque tube 3400 from the upper region of the clamp housing member 1110, the torque tube 3400 being configured in an off-set position from a center region of rotation.

In an embodiment, the tracker apparatus is configured substantially free from any welds during assembly. In an embodiment, the torque tube 3400 is coupled to another torque tube via a swage device within a vicinity of the clam shell clamp 1140. In an embodiment, the torque tube 3400 is coupled to an elastomeric damper in line to dampen torque movement to be substantially free from formation of a harmonic waveform along any portion of a plurality of solar panels configured to the torque tube 3400.

In an embodiment, the process includes coupling a pin member to the first half clam shell clamp 1141, the second half clam shell clamp 1142, and the spherical bearing device 1130. In an embodiment, the process includes coupling a first member or first side 1141 and a second member or side 1142 to sandwich the spherical bearing device 1130 to a tongue region of the upper region of the clamp housing member 1110. In an embodiment, the spherical bearing device 1130 is configured for rotation, and movement of the pin to pivot along a solid angle region.

In an embodiment, the housing clamp housing member 1110 is a continuous structure made of cast or stamped or machined metal material. In an embodiment, each of the first half clam shell clamp member 1141 and the second half clam shell clamp member 1142 is made of a solid continuous structure that is cast or stamped or machined metal material. In an embodiment, the spherical bearing device 1130 allows for a construction tolerance, tracker movement, and acting as a bonding path of least resistance taking an electrical current to ground. Further details of the present process and tracker apparatus can be found throughout the present specification and more particularly below.

Figure 15:
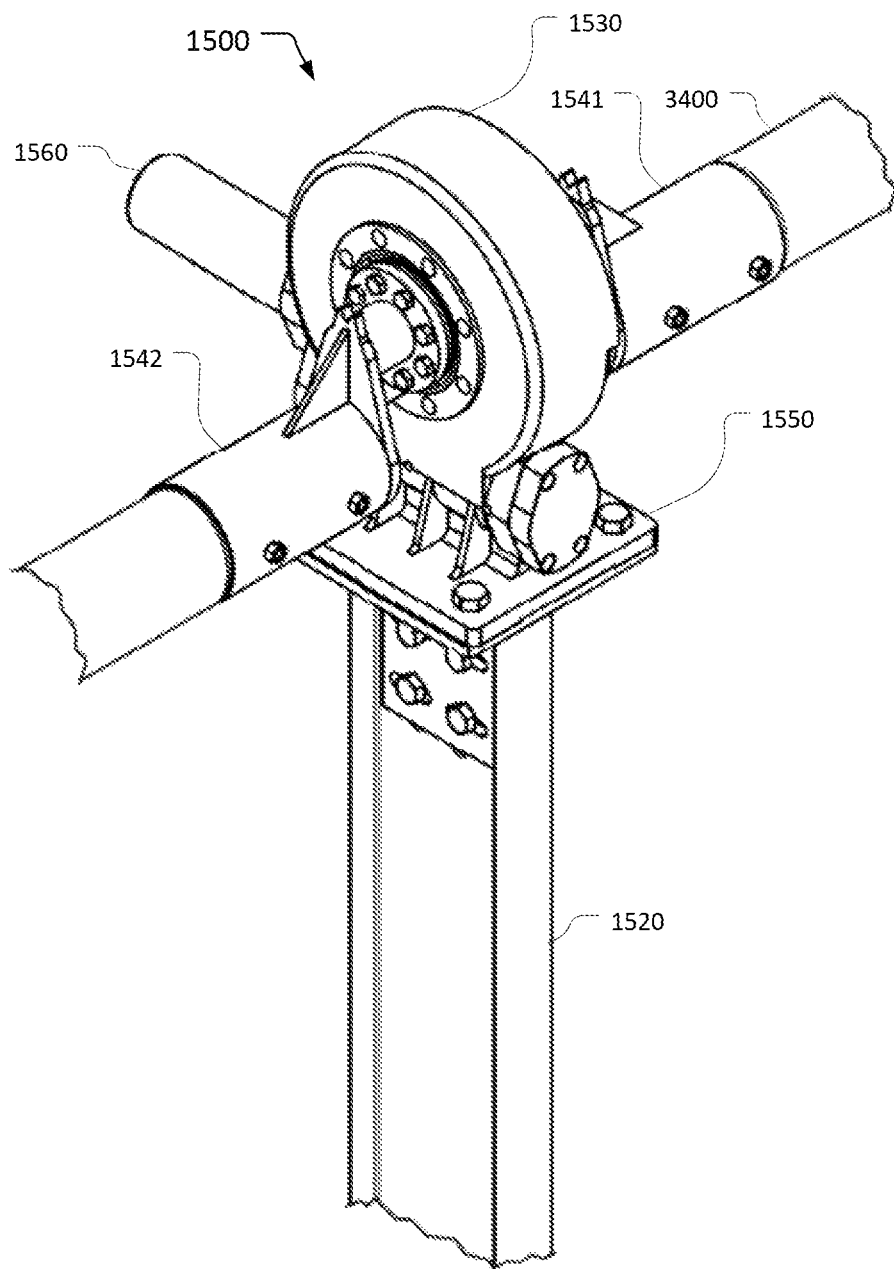
FIG. 15 is a simplified perspective diagram of a drive assembly coupled to a pier member according to an embodiment.

FIG. 15 is a simplified perspective diagram of a drive assembly 1500 coupled to a second pier 1520 according to an embodiment. In an embodiment, as shown, the solar tracker apparatus includes a drive device 1530. The drive device 1530 is coupled to an electric motor, which can be DC or AC. The drive device 1530 has a shaft, which rotates around a rotational point, and drives each crank, which is described below. The drive device 1530 is provided on a support or drive mount 1550, which is configured on an upper region of a second pier 1520, which has been described. The drive device 1530 is coupled to a crank 1540 configured in an offset manner to a frame assembly, which has a plurality of solar modules.

In an embodiment, the drive device 1530 provides rotation to a continuous torque tube 3400 spatially disposed from a first region to a second region. The drive device 1530 has a drive line 1560 including a motor, which couples via a gear box inside the drive device 1530 to drive first and second cranks 1541 and 1542. Each crank 1540 is coupled to each side of the drive device 1530, which causes rotational movement of each crank 1540.

In an embodiment, the crank 1540 includes a first crank 1541 coupled to a first side of the drive device 1530 and a second crank 1542 coupled to a second side of the drive device 1530. In an embodiment, the crank 1540 includes a first crank 1541 coupled to a first side of the drive device 1530 and a second crank 1542 coupled to a second side of the drive device 1530. In an embodiment, each of the first and second crank 1542 has a flange having a plurality of bolt openings to couple to one side of the drive device 1530. Each of the first and second crank 1542 has an arm, which is normal to each flange, and couples to cylindrical member that has one or more bolt openings.

The tracker apparatus has a first torque tube 3400 coupled to the first crank 1541 via the cylindrical member and a second torque tube 3410 coupled to the second crank 1542 via another cylindrical member. In an embodiment, a first swage fitting couples the first crank 1541 to the first torque tube 3400 and a second swage fitting couples the second crank 1542 to the second torque tube 3410. One or more bolts are inserted through the cylindrical members to secure a portion of the torque tube 3400 in place, and keep it free from rotation or twisting within the cylindrical member, and lock it into place, as shown.

In an embodiment, each of the cranks is made of a suitable metal material that may be cast, machined, or stamped. Each cylindrical member is made of a suitable metal material and is configured to be coupled to an end of the torque tube 3400. A swage fitting can be provided to couple or connect the end of the torque tube 3400 to each cylindrical member as shown. Of course, there can be variations. Further details of assembling the drive device 1530 can be found throughout the present specification, and more particularly below.

FIGS. 16 through 19 are simplified diagrams illustrating assembly steps for a process for assembling the drive assembly 1500 of FIG. 15.

Figure 16:
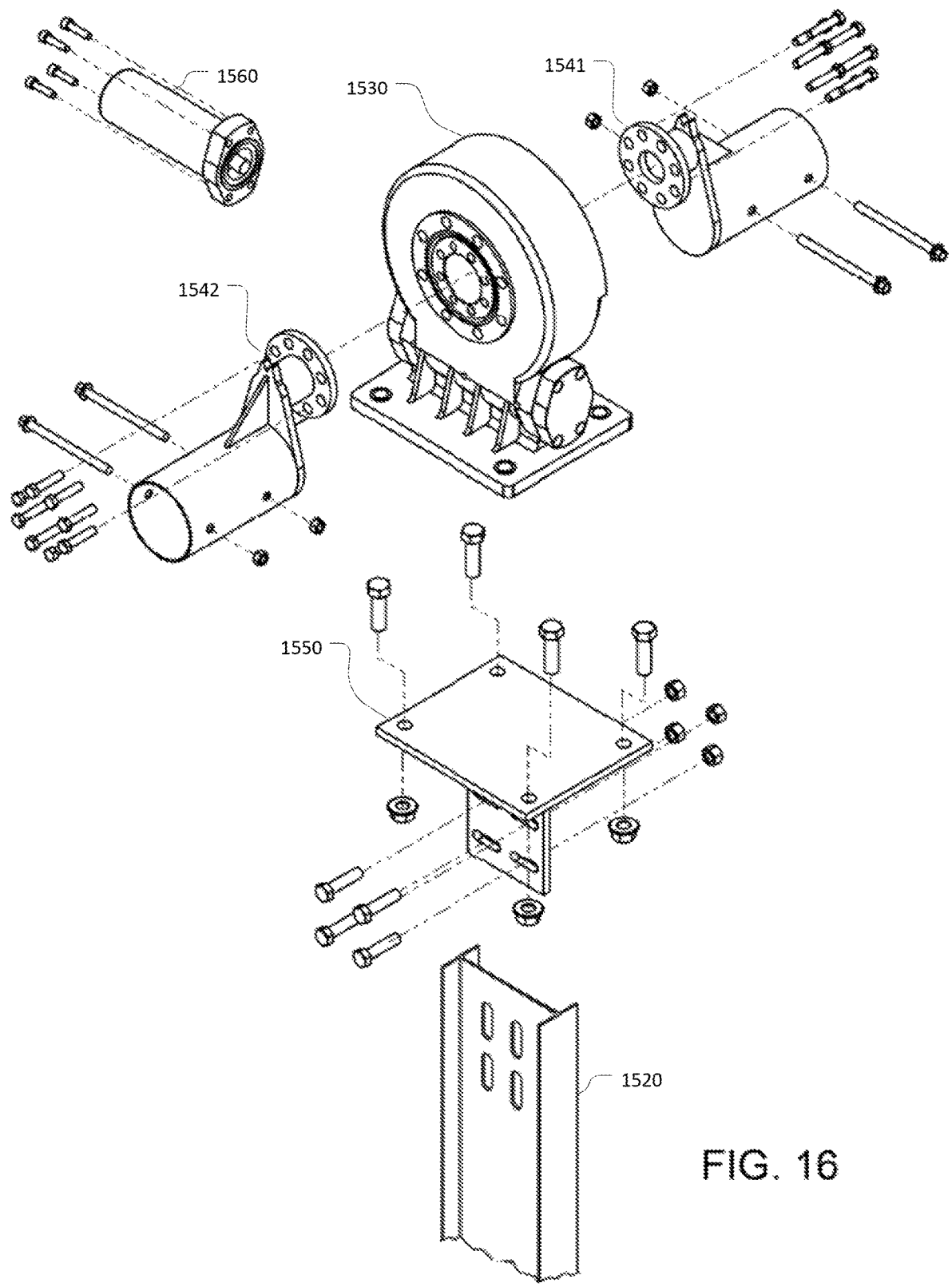
FIGS. 16 through 19 are simplified diagrams illustrating assembly steps for a process for assembling the drive assembly of FIG. 15.

FIG. 16 shows an exploded view of the drive assembly 1500 of FIG. 15.

Figure 17:
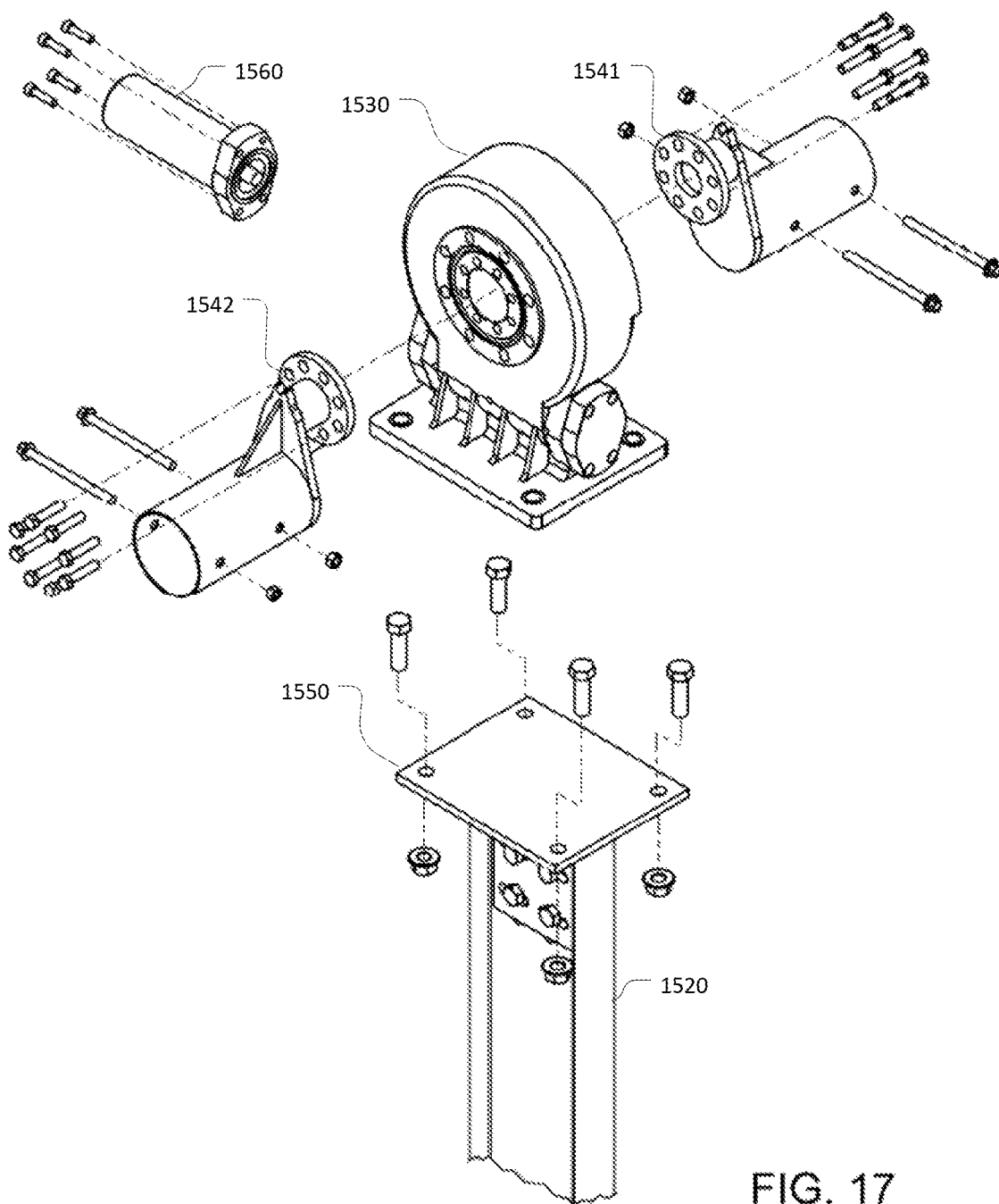
Figure 18:
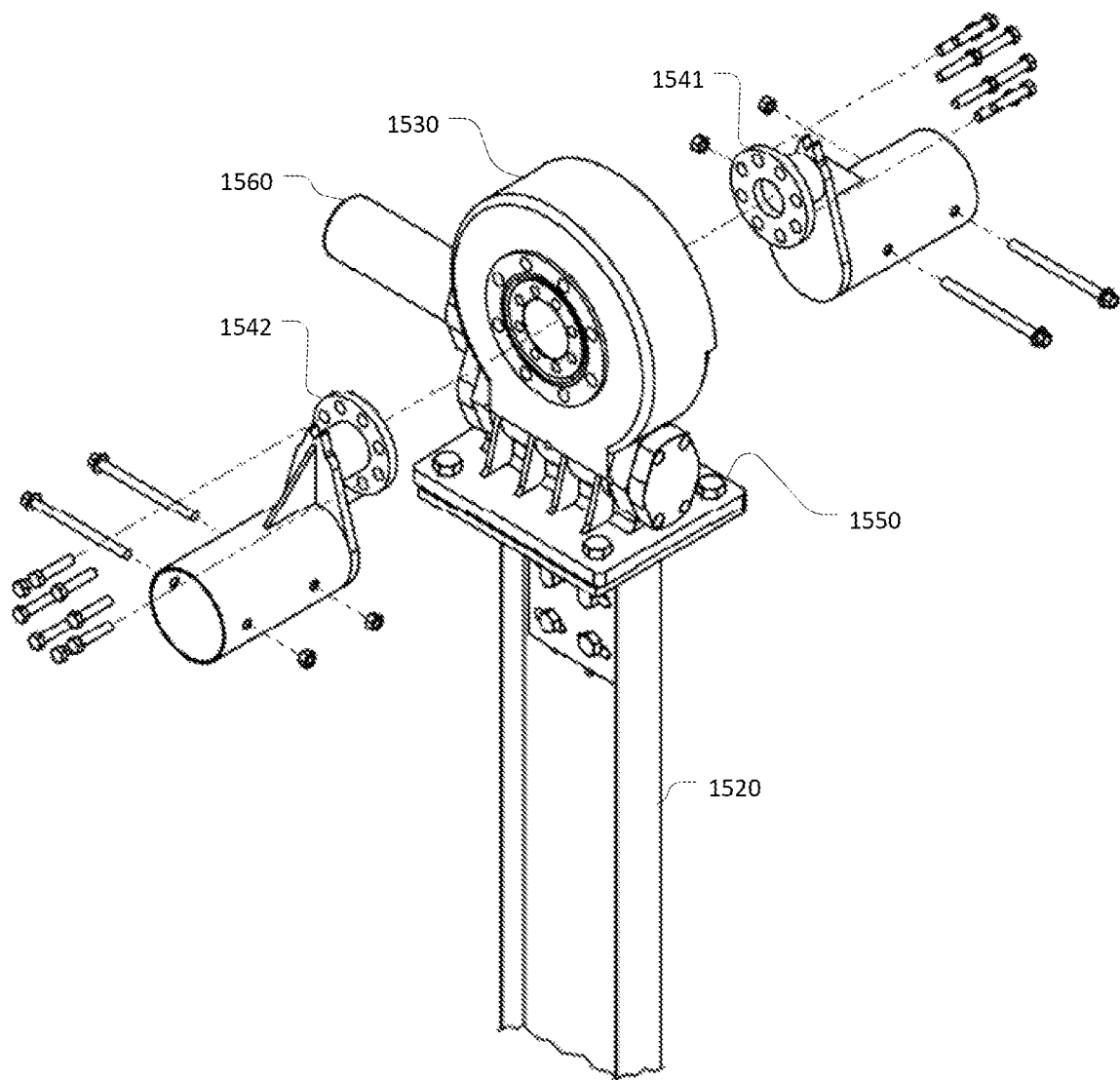
Figure 19:
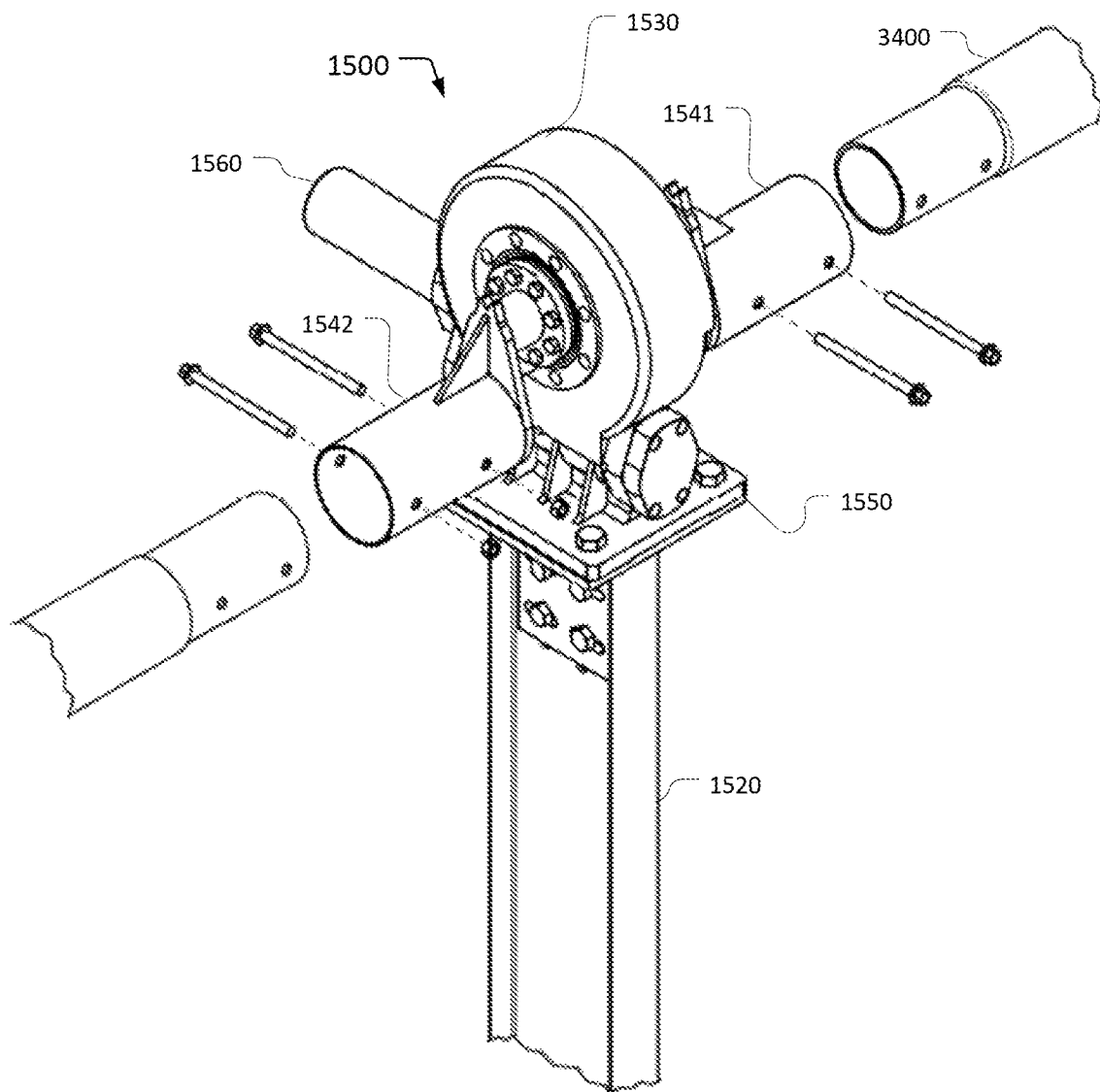

FIGS. 17 through 19 show partially exploded views of the drive assembly 1500 of FIG. 15.

In an embodiment, the process includes providing a drive device 1530, as shown. In an embodiment, the process includes coupling the drive device 1530 via a drive line 1560 or shaft to an electric motor, which can be driven by direct current (DC) or alternating current (AC). The process includes coupling the drive device 1530 to a support or drive mount 1550, which is configured on an upper region of a second pier 1520, which has been described. In an embodiment, the second pier 1520 includes a plurality of support structures coupled to a drive device 1530 support. The drive device 1530 support has a first member coupled to the plurality of support structures, and a second member coupled to the drive device 1530.

In an embodiment, the process includes coupling the drive device 1530 to a crank 1540 configured in an offset manner to a frame assembly, which has a plurality of solar modules. In an embodiment, the drive device 1530 has the drive line 1560, which couples via a gear box to drive a pair of cranks. Each crank is coupled to each side of the drive device 1530, which causes rotational movement of each crank 1540. In an embodiment, the crank 1540 includes a first crank 1541 coupled to a first side of the drive device 1530 and a second crank 1542 coupled to a second side of the drive device 1530. In an embodiment, the crank 1540 includes a first crank 1541 coupled to a first side of the drive device 1530 and a second crank 1542 coupled to a second side of the drive device 1530. In an embodiment, each crank 1540 includes a flange having a plurality of bolt openings to couple the flange to one side of the drive device 1530. Each crank 1540 includes an arm, which is normal to each flange, and couples to cylindrical member that has one or more bolt openings. The tracker apparatus has a first torque tube 3400 coupled to the first crank 1541 via the cylindrical member and a second torque tube 3410 coupled to the second crank 1542 via another cylindrical member. In an embodiment, a first swage fitting couples the first crank 1541 to the first torque tube 3400 and a second swage fitting couples the second crank 1542 to the second torque tube 3410. One or more bolts are inserted through the cylindrical members to secure a portion of the torque tube 3400 in place, and keep it free from rotation or twisting within the cylindrical member, and lock it into place, as shown.

Figure 20:
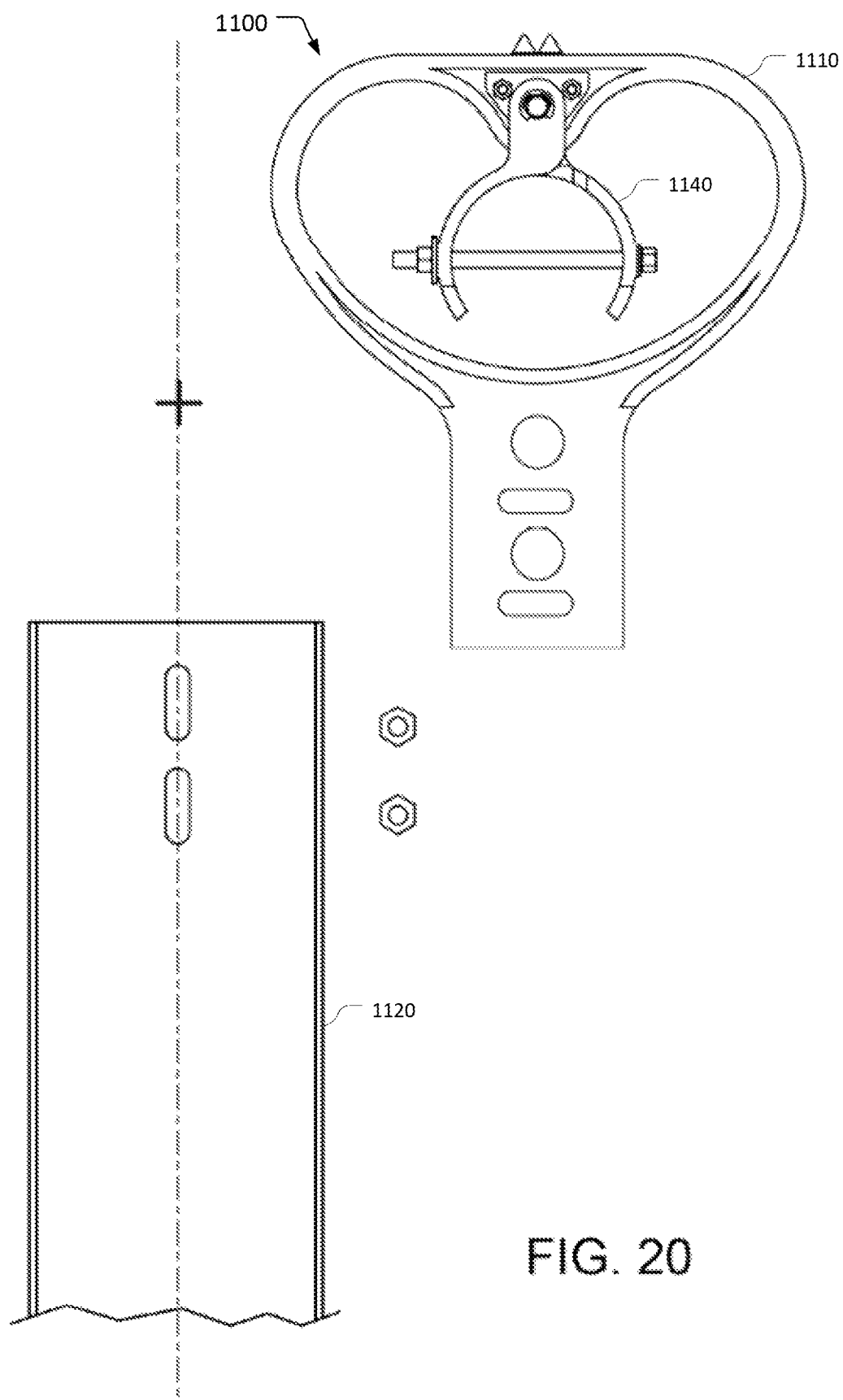
FIG. 20 is a simplified in-line view diagram illustrating a clamp assembly separate and apart from a pier member according to an embodiment.

FIG. 20 is a simplified in-line view diagram illustrating a clamp assembly 1100 separate and apart from a first pier 1120 according to an embodiment. As shown, the clamp assembly 1100 has a clamp housing member 1110 configured in an upright direction, which is a direction away from a direction of gravity. In an embodiment, the clamp housing member 1110 includes a lower region and an upper region.

The lower region is coupled to a first pier structure 1120. The lower region has a thickness of material including bolt openings, which align to openings on an upper portion of the first pier structure 1120. Locking nuts and bolts are configured to hold the lower region of the clamp housing member 1110 to the first pier structure 1120 in an upright manner. At least a pair of openings are provided in each of the lower region of the clamp housing member 1110 and the first pier structure 1120, as shown. Each of the openings in the lower region of the clamp housing member 1110 is configured as a slot to allow for adjustment in a direction normal to the direction of the length of the first pier structure 1120. Each of the openings in the first pier structure 1120 is configured as an elongated slot in the direction of the length of the first pier structure 1120 to allow for adjustment in the same direction. Of course, there can be variations, where the directions of the slots are exchanged and/or combined.

Figure 24:
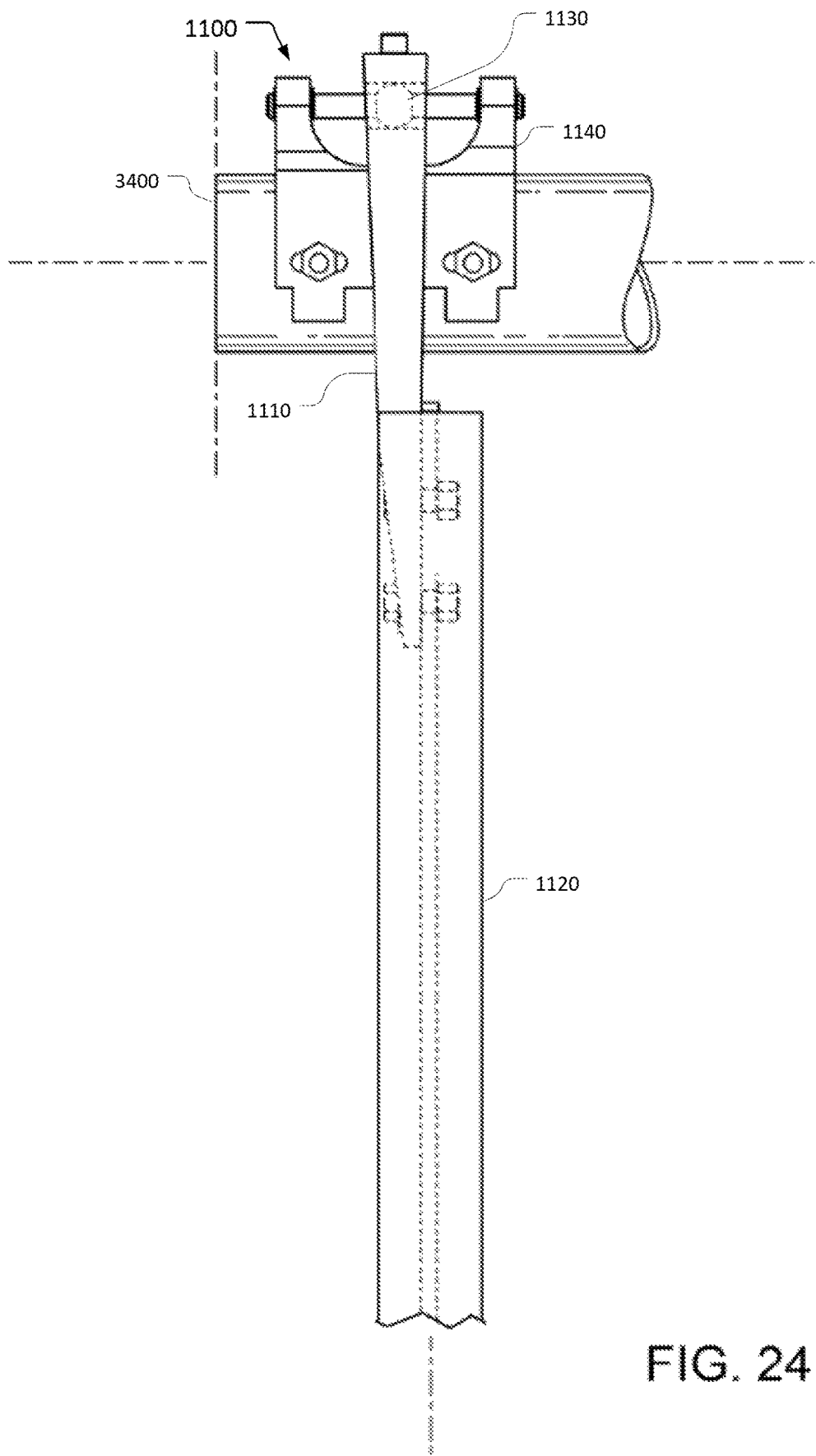
FIG. 24 is a simplified side view diagram illustrating a clamp assembly coupled to a pier member in a first orientation according to an embodiment.

In an embodiment, the upper region includes a spherical bearing device 1130, as shown in FIG. 24. The upper region has a tongue structure, which has an opening that houses the spherical bearing device 1130 between a pair of plates, which hold the bearing in place. In an embodiment, the spherical bearing device 1130 allows for rotational, and movement in each of the three axis directions within a desirable range. Each of the plates is disposed within a recessed region on each side of the tongue structure. Each of the plates may include a fastener to hold such plate in place within the recessed region.

In an embodiment, the clamp housing member 1110 has an opening that has a heart-like shape and a tongue region, which supports the spherical bearing device 1130 assembly, as shown. Each lobe of the heart-like shape acts as a stop for movement of the torque tube 3400 in a lateral rotational movement in either direction depending upon the spatial orientation of the lobe. Further details of the clamp housing member 1110 can be found further below.

In an embodiment, clamp assembly 1100 has a clam shell clamp assembly 1110 coupled to the spherical bearing device 1130 and the clam shell clamp 1140 being suspended from the spherical bearing device 1130. The clam shell clamp 1140 has a first side 1141 and a second side 1142. Each of the first and second sides 1141 and 1142 has an upper region including an opening. A pin is inserted through each of the openings, while an opening of the spherical bearing device 1130 is provided as a third suspension region between each of the openings, as shown.

Each side of the clam shell clamp 1140 is shaped to conform or couple to at least one side of a portion of the torque tube 3400, as shown. Each side has one or more openings, which align to one or more openings on the portion of the torque tube 3400. A pin or bolt is inserted through each of the openings to clamp the clam shell clamp 1140 to the portion of the torque tube 3400. The clam shell clamp 1140 may substantially surround an entirety of a peripheral region of the torque tube 3400. The pin or bolt or pins or bolts also holds the torque tube 3400 in a fixed position relative to the clam shell clamp 1140 to prevent the torque tube 3400 from slipping and/or twisting within the clam shell clamp 1140. Of course, there can be variations.

In an embodiment, the spherical bearing device 1130 allows for accommodation of a construction tolerance, tracker movement, and acts as a bonding path of least resistance for taking an electrical current to ground. The bonding path occurs from any of the solar modules, through the frame, to the clamp assembly 1100, to one or more piers, and then to ground.

In an embodiment, the clam shell clamp 1140 includes a first member operably coupled to a second member to hold a torque tube 3400 in place. In an embodiment, the tracker apparatus has a clamp housing member 1110 operably coupled to the clam shell clamp 1140 via a spherical bearing device 1130 such that the spherical bearing device 1130 includes an axis of rotation, which is different from a center of the torque tube 3400.

Figure 21:
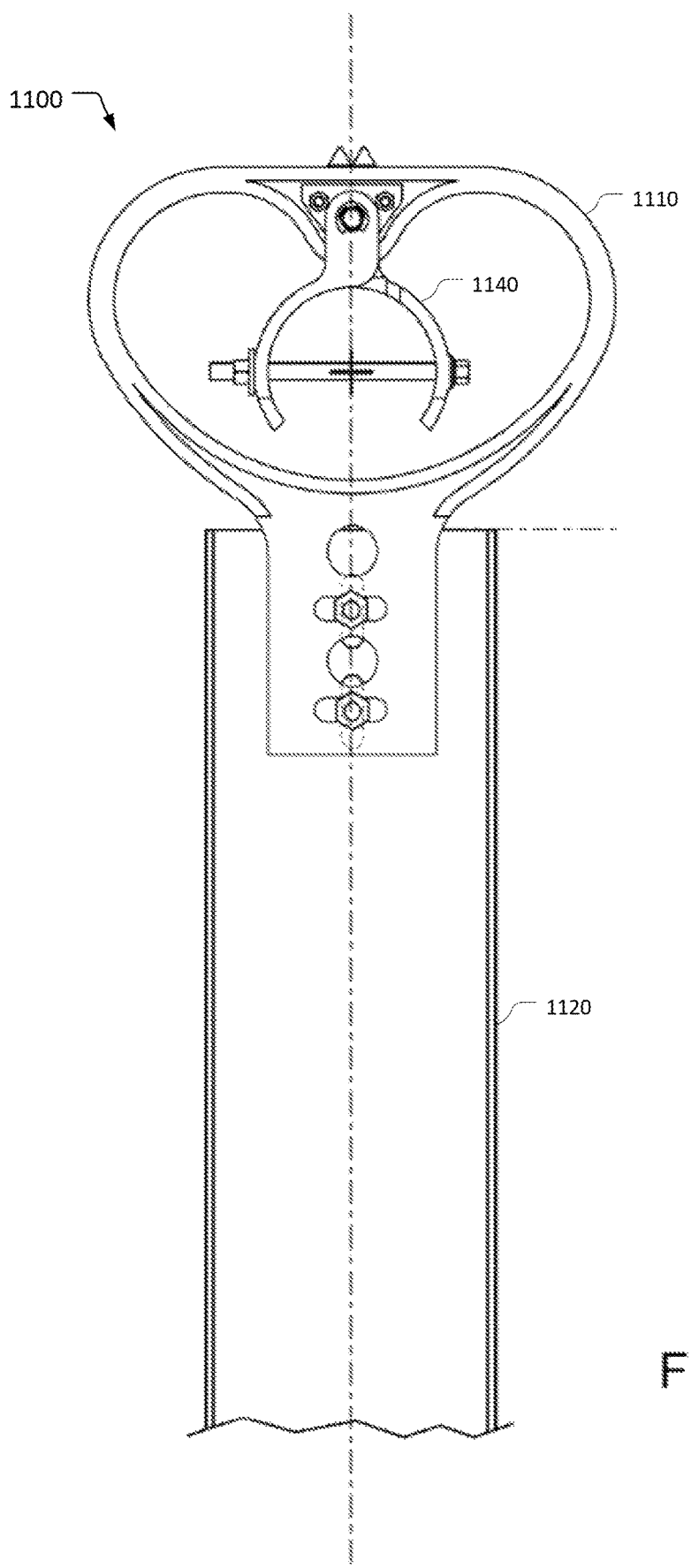
FIG. 21 is a simplified in-line view diagram illustrating a clamp assembly coupled to a pier member according to an embodiment.

FIG. 21 is a simplified in-line view diagram illustrating a clamp assembly 1100 coupled to a first pier 1120 according to an embodiment. As shown, a pair of nuts and bolts holds the first pier structure 1120 to the clamp housing member 1110 along the dotted line.

Figure 22:
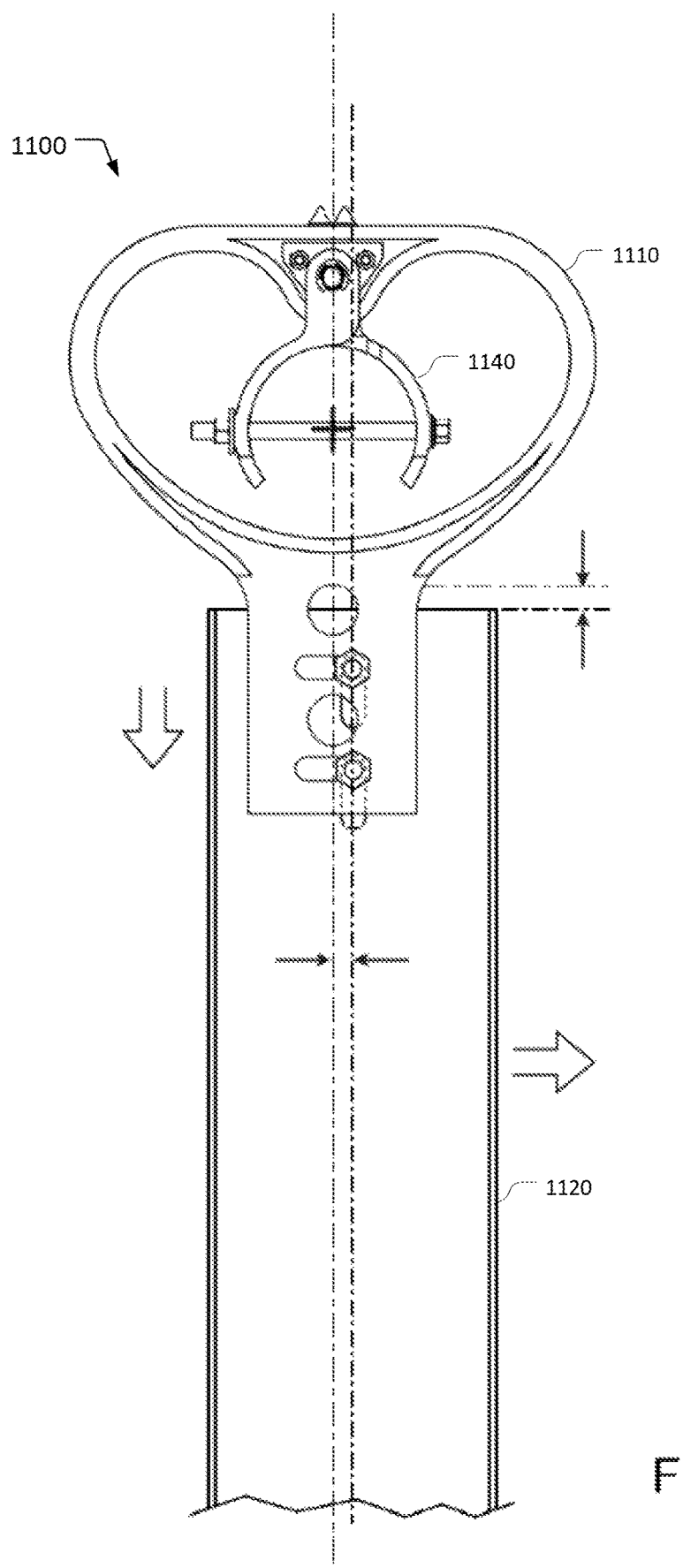
FIG. 22 is a simplified in-line view diagram illustrating a clamp assembly coupled to a pier member in a first orientation according to an embodiment.

FIG. 22 is a simplified in-line view diagram illustrating a clamp assembly 1100 coupled to a first pier member 1120 in a first orientation according to an embodiment. As shown, the clamp housing member 1110 can be off-set in a vertical and lateral manner using the slots in each of the pier and housing structure facing the in-line view of the torque tube 3400.

Figure 23:
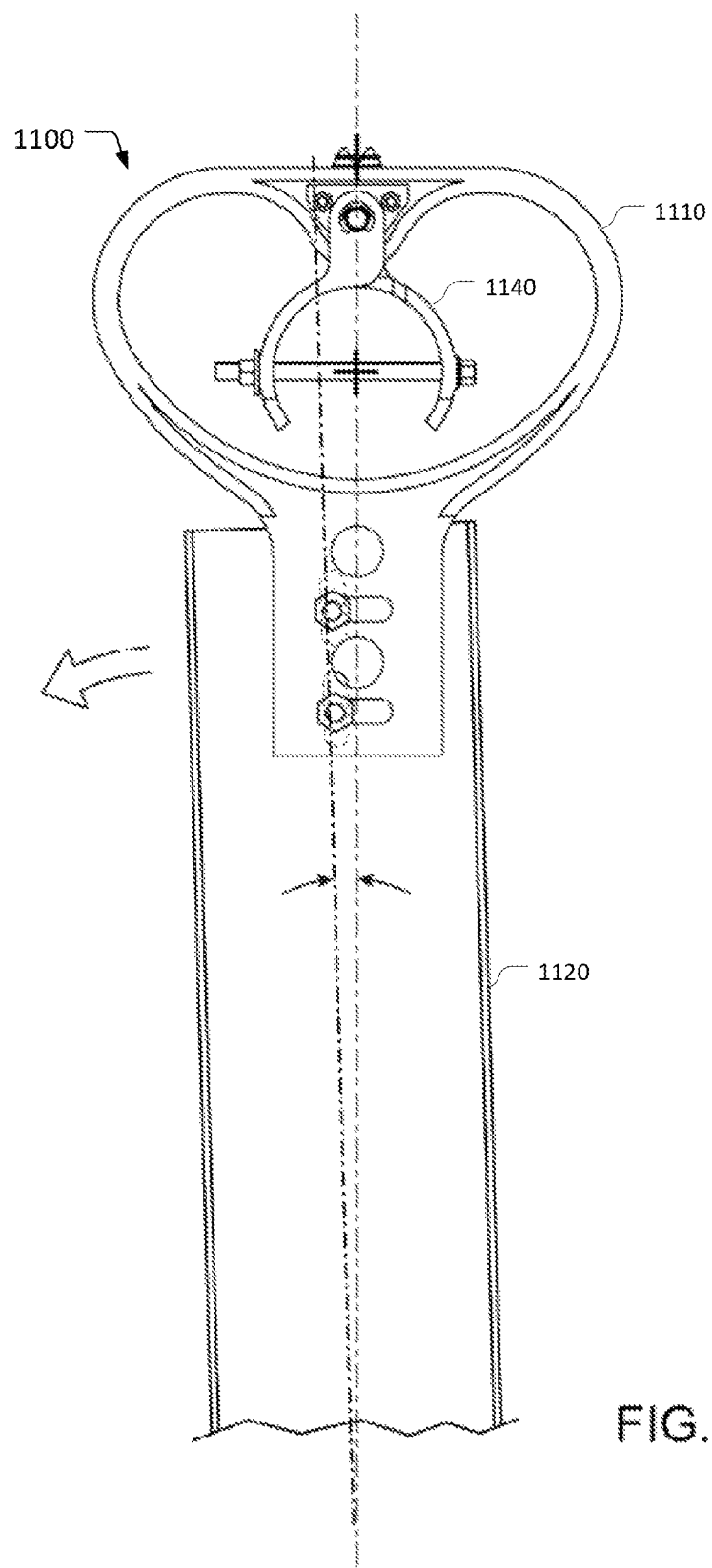
FIG. 23 is a simplified in-line view diagram illustrating a clamp assembly coupled to a pier member in a second orientation according to an embodiment.

FIG. 23 is a simplified in-line view diagram illustrating a clamp assembly 1100 coupled to a first pier 1120 in a second orientation according to an embodiment. As shown, the clamp housing member 1110 can be adjusted in a rotational manner (in either direction) using the same slots in each of the pier and housing structures facing the in-line view of the torque tube 3400.

FIG. 24 is a simplified side view diagram illustrating a clamp assembly 1100 coupled to a first pier 1120 in a first orientation according to an embodiment. As shown, the clamp housing member 1110 and the first pier 1120, along with the torque tube 3400, are arranged in a normal orientation using the pins configuring the torque tube 3400 to the clam shell clamp 1140. As shown, the clamp housing member 1110 has an elongated opening to allow each of the pins to be adjusted in place, which allows the relationship of the clamp housing member 1110 and torque tube 3400 to be adjusted.

Figure 25:
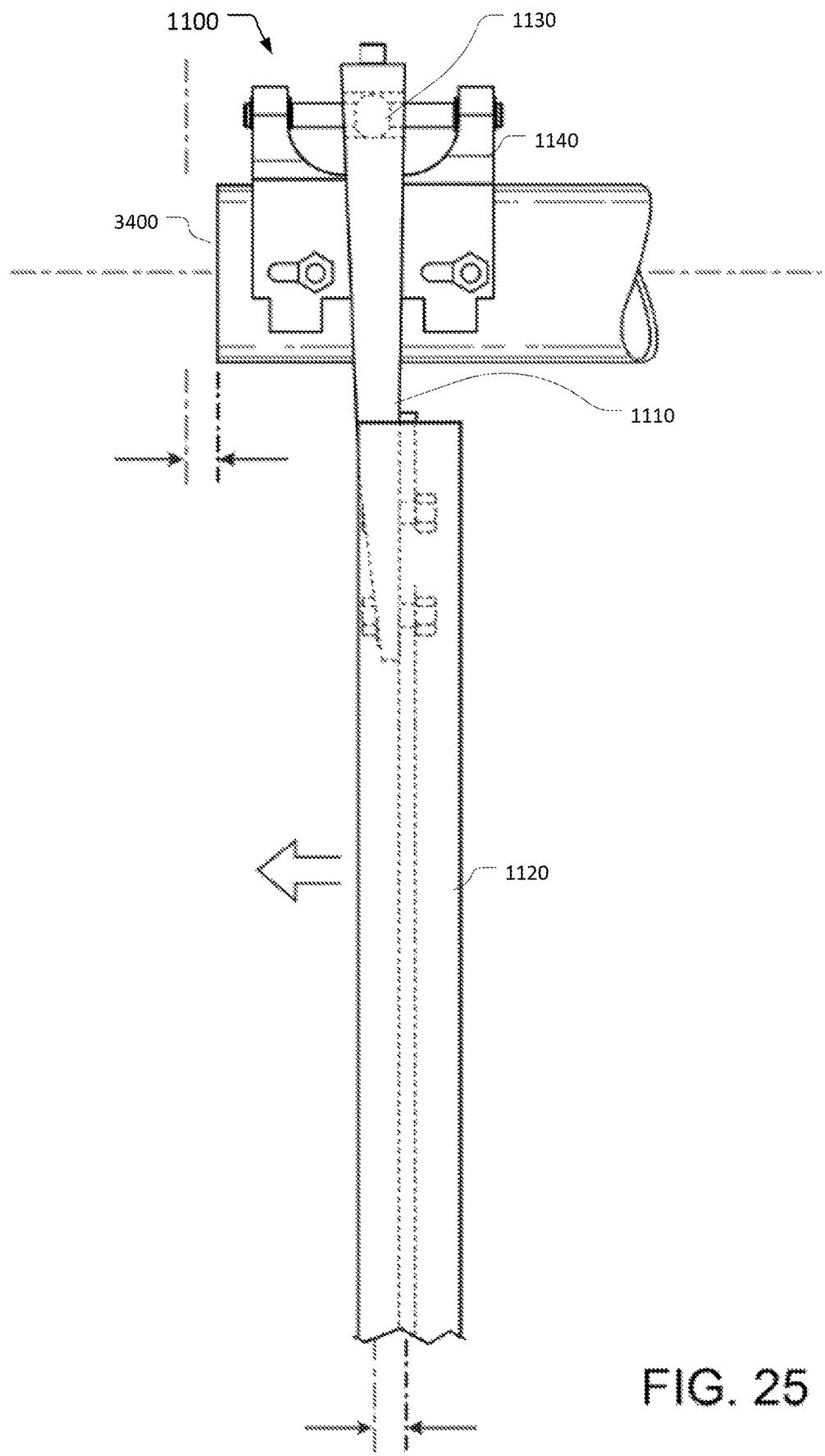
FIG. 25 is a simplified side view diagram illustrating a clamp assembly coupled to a pier member in a second orientation according to an embodiment.

FIG. 25 is a simplified side view diagram illustrating a clamp assembly 1100 coupled to a first pier 1120 in a second orientation according to an embodiment. As shown, the torque tube 3400 is shifted in an in-line direction (either way) using the slots in the clamp, while the torque tube 3400 has a smaller opening for the pin, which does not allow for any adjustment, in an embodiment.

Figure 26:
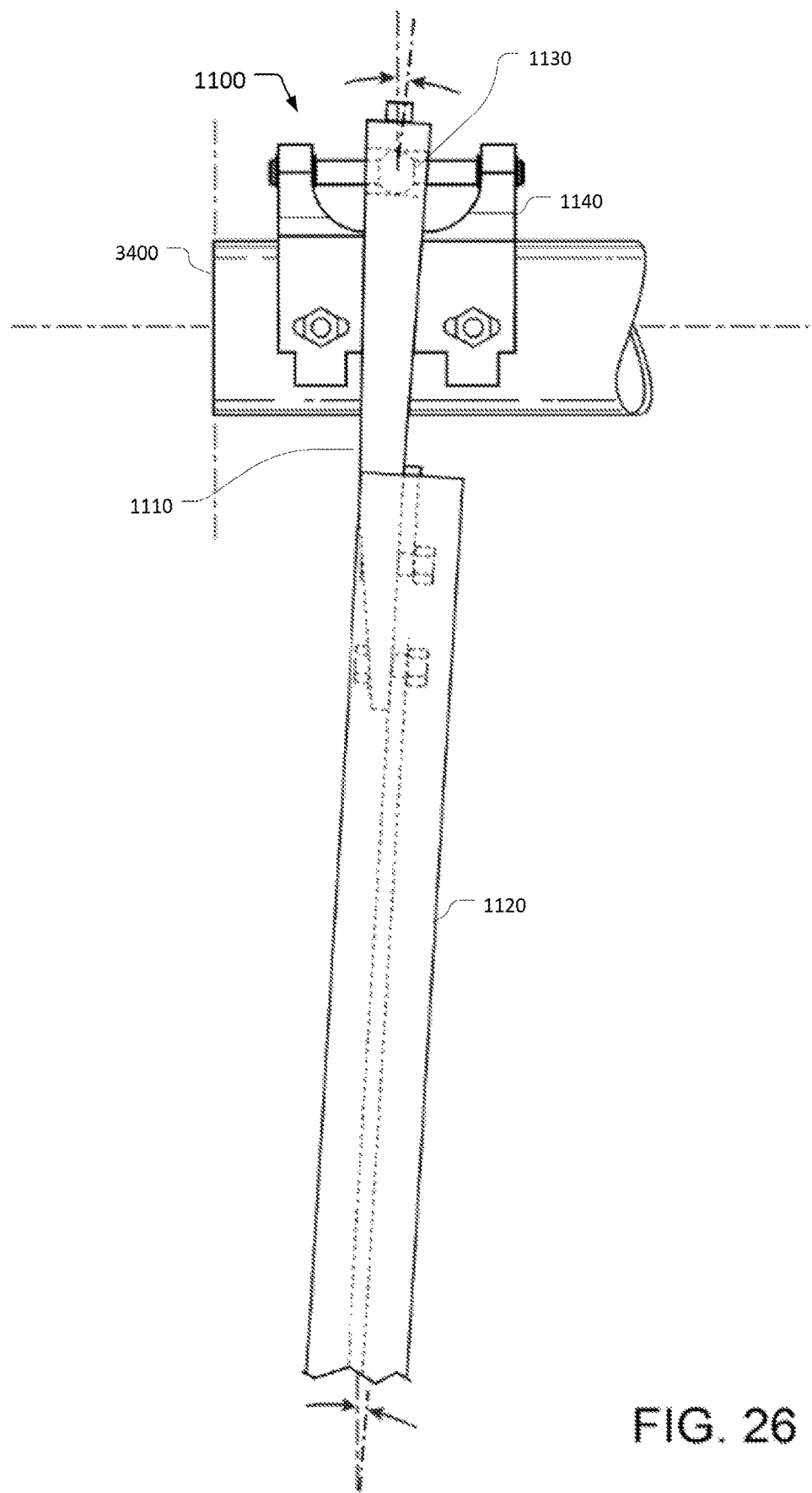
FIG. 26 is a simplified side view diagram illustrating a clamp assembly coupled to a pier member in a third orientation according to an embodiment.

FIG. 26 is a simplified side view diagram illustrating a clamp assembly 1100 coupled to a first pier 1120 in a third orientation according to an embodiment. As shown, the torque tube 3400 can be rotated or adjusted relative to the direction of the length of the first pier 1120 using the movement of the spherical bearing device 1130 assembly, explained and shown. As shown, the torque tube 3400 is parallel to the direction of gravity in an embodiment.

Figure 27:
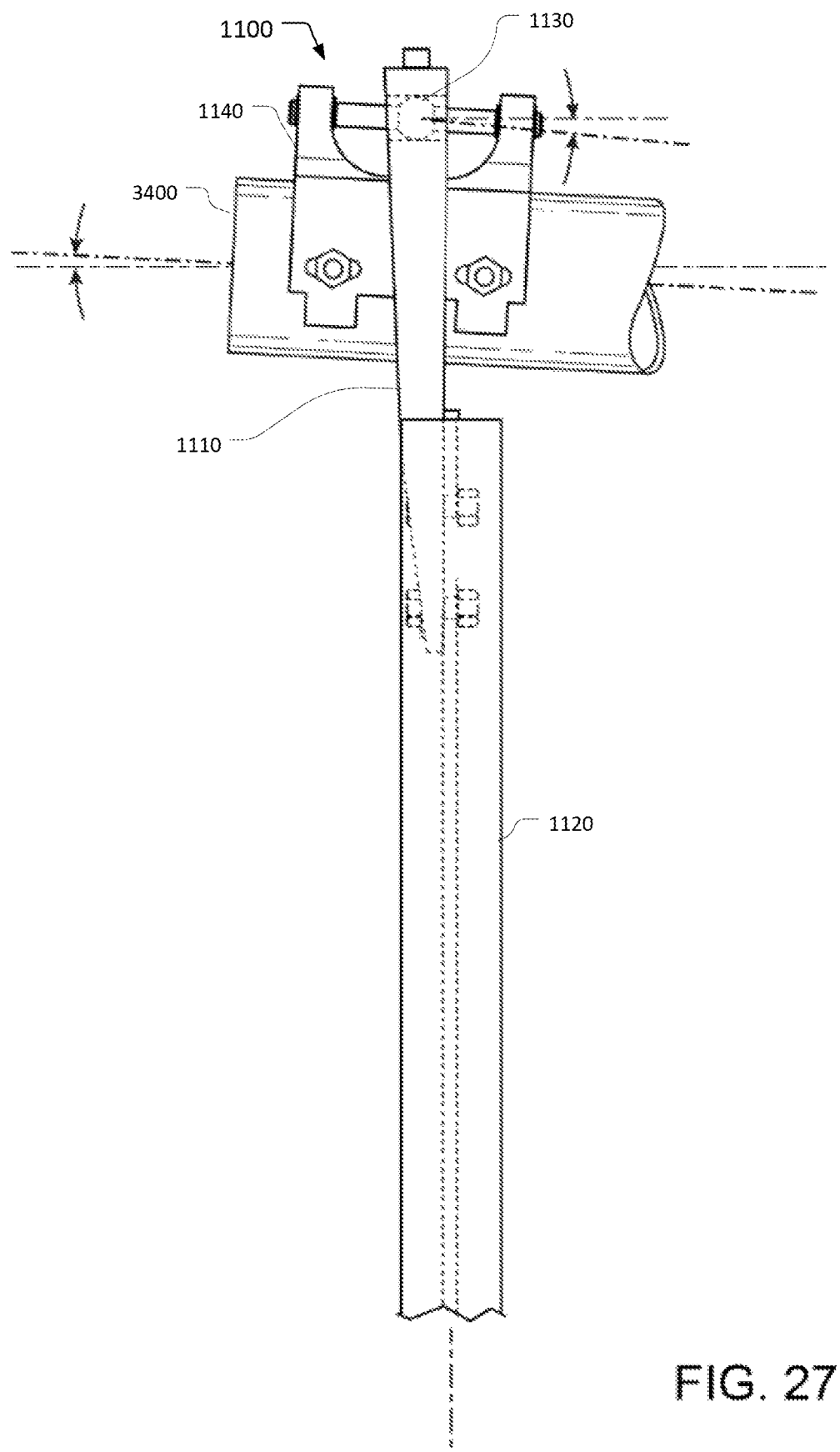
FIG. 27 is a simplified side view diagram illustrating a clamp assembly coupled to a pier member in a fourth orientation according to an embodiment.

FIG. 27 is a simplified side view diagram illustrating a clamp assembly 1100 coupled to a first pier 1120 in a fourth orientation according to an embodiment. As shown, the torque tube 3400 can be rotated or adjusted relative to the direction of the length of the first pier 1120 using the movement of the spherical bearing device 1130 assembly, explained and shown. As shown, the torque tube 3400 is not parallel to the direction of gravity in an embodiment.

Figure 28:
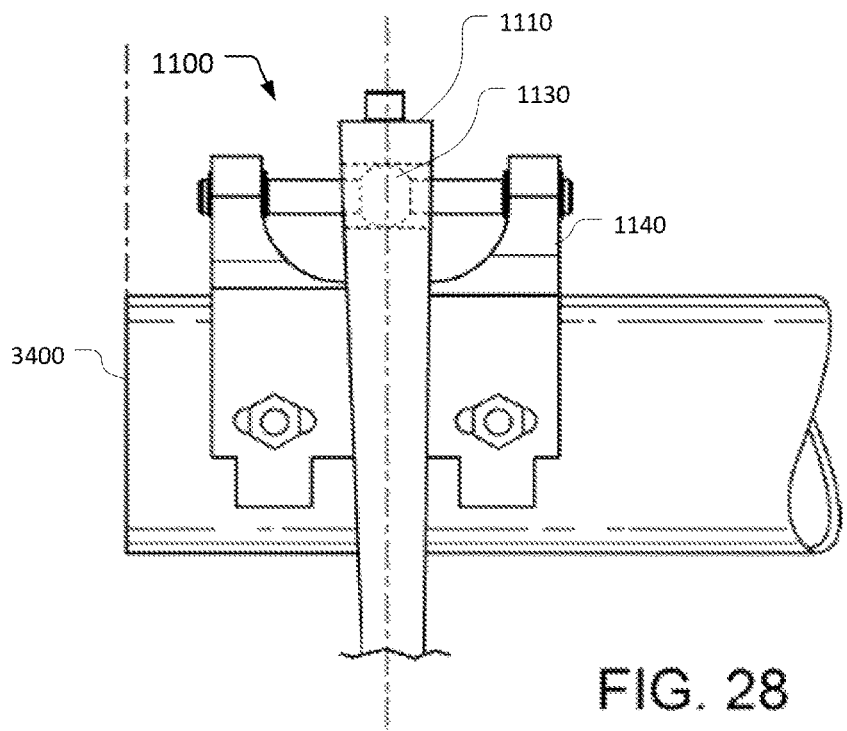
FIG. 28 is a simplified side view diagram illustrating a clamp assembly coupled to a pier member in a fifth orientation according to an embodiment.

FIG. 28 is a simplified side view diagram illustrating a clamp assembly 1100 coupled to a first pier 1120 in a fifth orientation according to an embodiment. As shown, the torque tube 3400, clamp housing member 1110, and clam shell clamp 1140 are aligned in this example.

Figure 29:
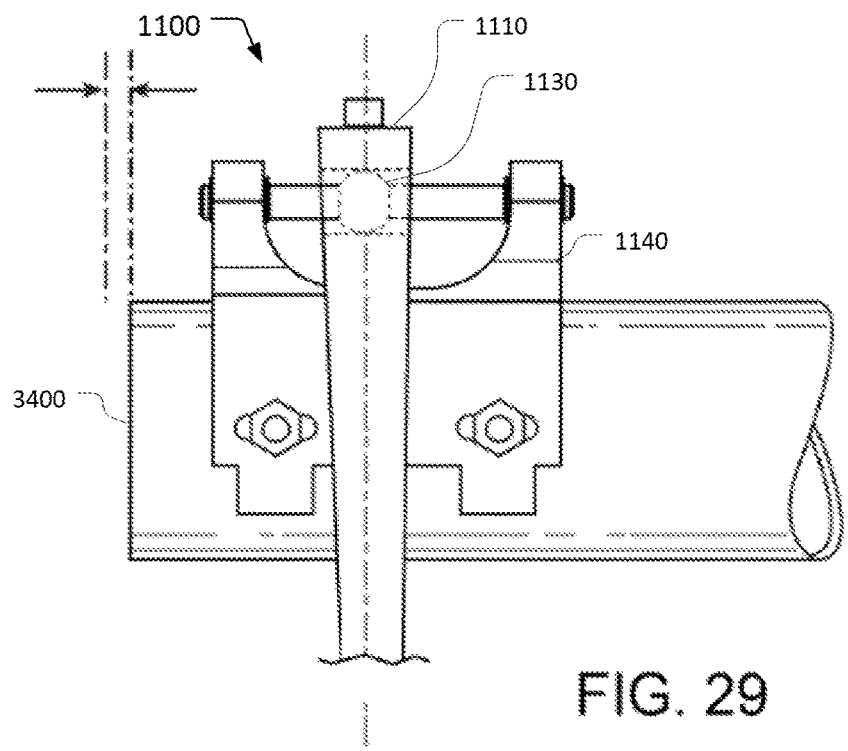
FIG. 29 is a simplified side view diagram illustrating a clamp assembly coupled to a pier member in a sixth orientation according to an embodiment.

FIG. 29 is a simplified side view diagram illustrating a clamp assembly 1100 coupled to a first pier 1120 in a sixth orientation according to an embodiment. As shown, the torque tube 3400, clamp housing member 1110, and clam shell clamp 1140 are aligned in this example. However, the position of the spherical bearing device 1130 to pin has shifted in one direction by sliding the pin in the same direction, although the pin can be slid in the other opposite direction in other examples. In this example, pin to clamp arrangement can be moved along the pin from one spatial region to another spatial region.

Figure 30:
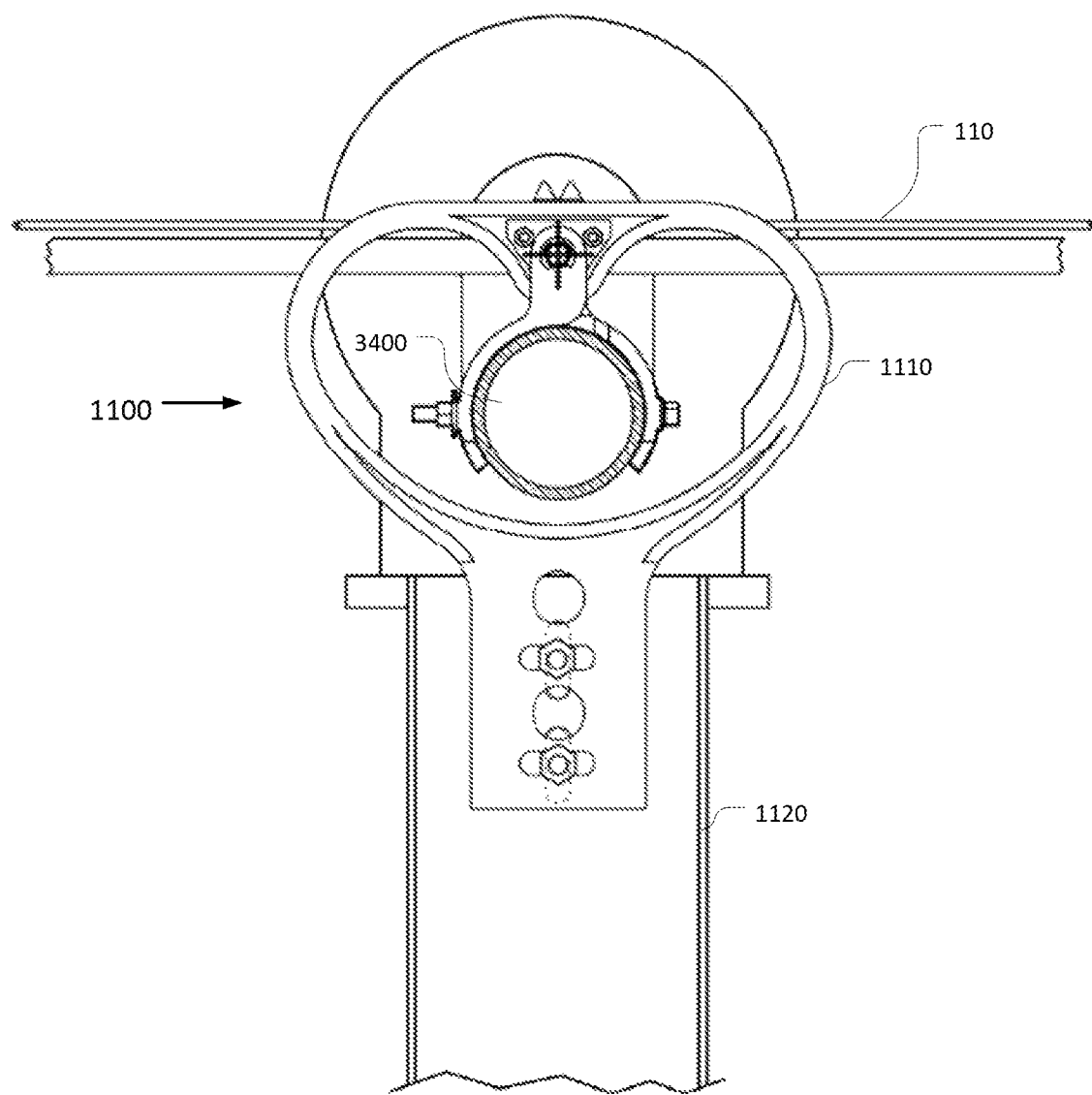
FIGS. 30 through 32 illustrate in-line views of the clamp assembly and the drive assembly in multiple configurations according to embodiments.
Figure 31:
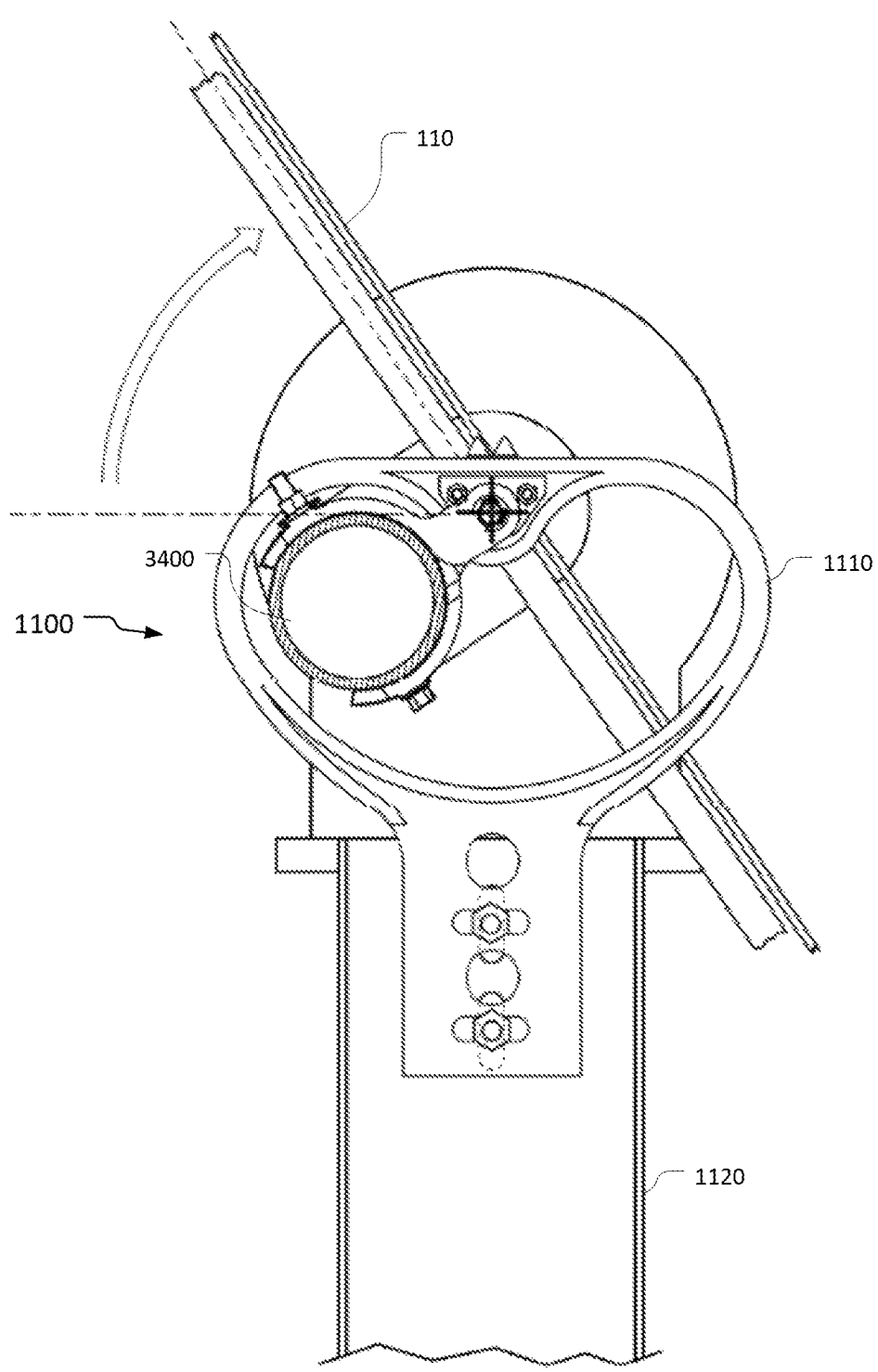
Figure 32:
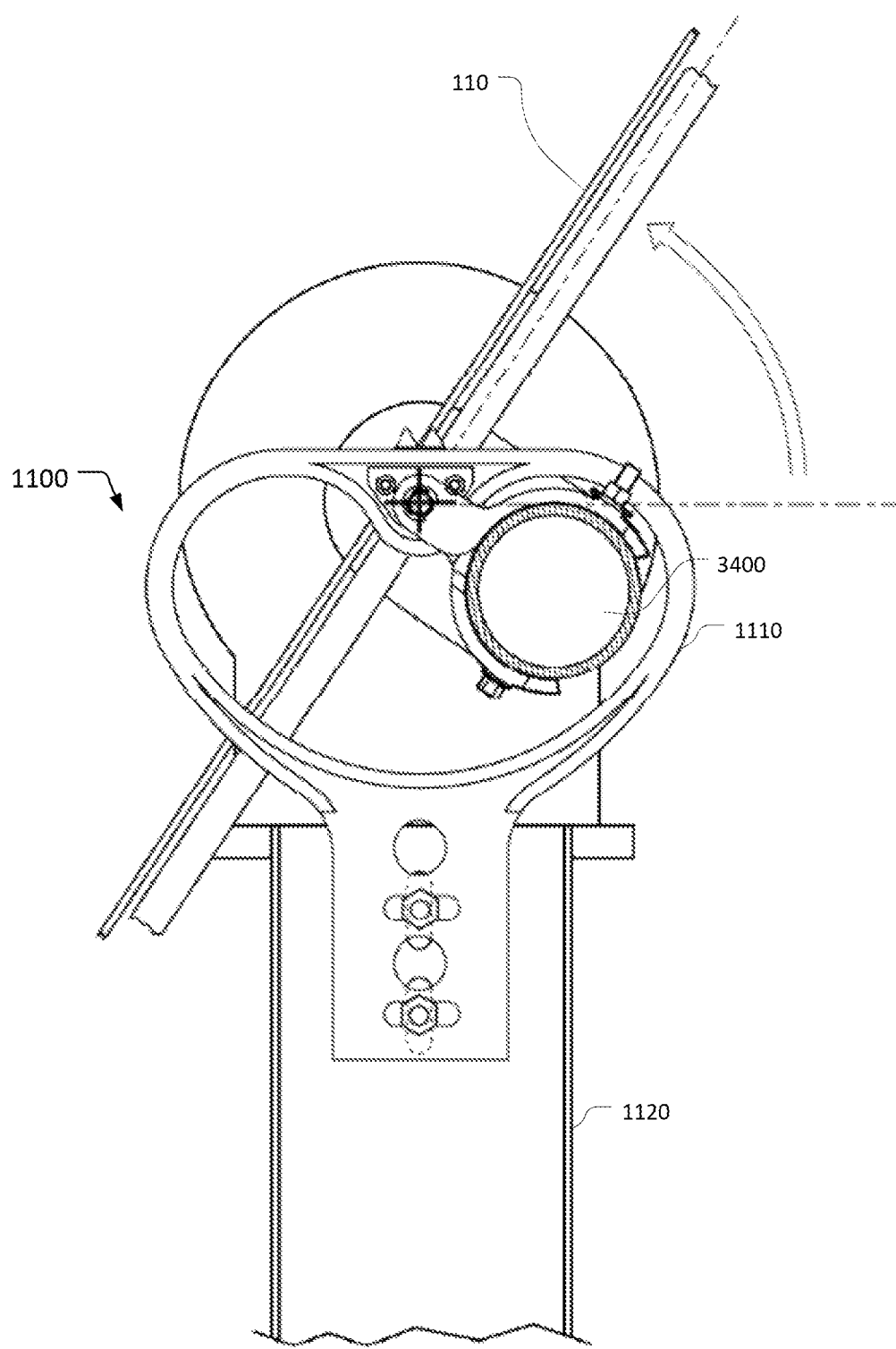

FIGS. 30 through 32 illustrate an in-line view of the clamp assembly 1100 and the drive assembly 1500 in multiple configurations according to embodiments.

FIG. 30 illustrates an in-line view of the clamp assembly 1100 when the torque tube 3400 is in a lowest position.

FIG. 31 illustrates an in-line view of the clamp assembly 1100 when the torque tube 3400 is in a first elevated position.

FIG. 32 illustrates an in-line view of the clamp assembly 1100 when the torque tube 3400 is in an second elevated position.

As shown, the crank 1540 is in a lower position, which allows for the torque tube 3400 to be at its lowest position in an embodiment. As the drive device 1530 moves the crank, the torque tube 3400 swings from the lowest position to the first elevated position in a radial manner along a first direction or the second elevated position in a radial manner along a second direction, as shown. As the torque tube 3400 rotates, the plurality of solar panels fixed to the torque tube 3400 also rotate along a path from a first spatial region to a second spatial region. As shown, each of the inner regions of the lobes of openings in the clamp housing member 1110 acts as a stop for the torque tube 3400 or an override for the torque tube 3400. Of course, there can be other variations.

Figure 33:
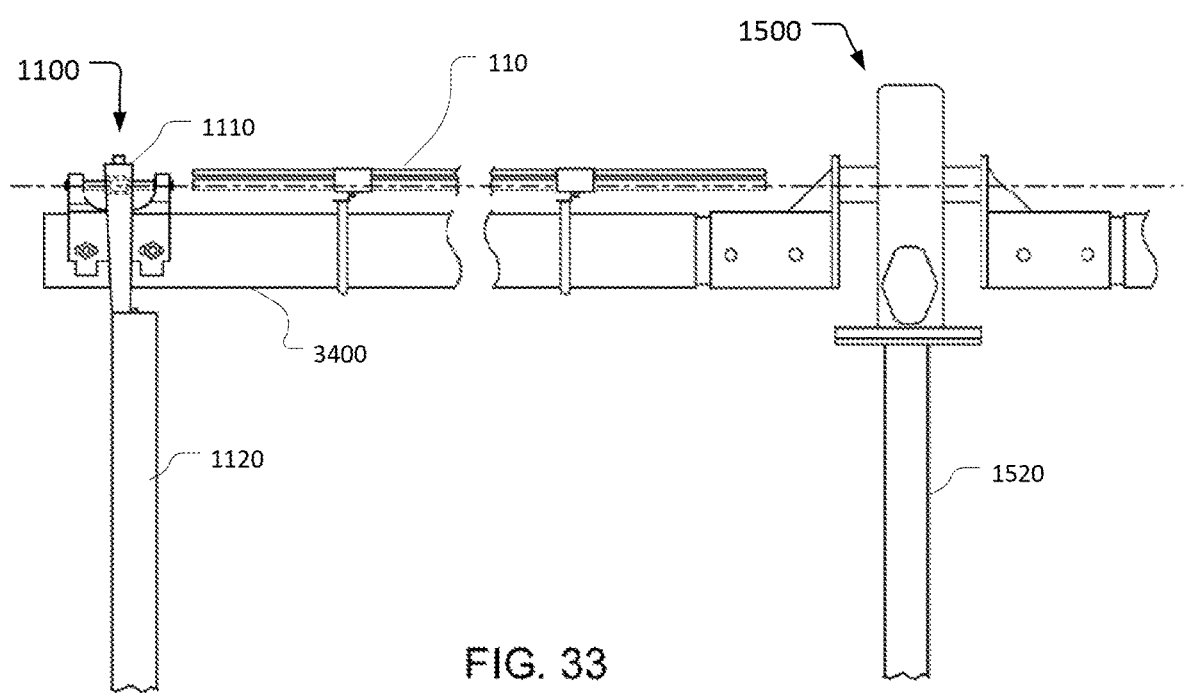
FIG. 33 is a side view diagram of the tracker apparatus according to an embodiment.

FIG. 33 is a side view diagram of the tracker apparatus according to an embodiment. As shown is a side view diagram of the torque tube 3400, solar panels 110 with frames, and clamp housing member 1110.

Figure 34:
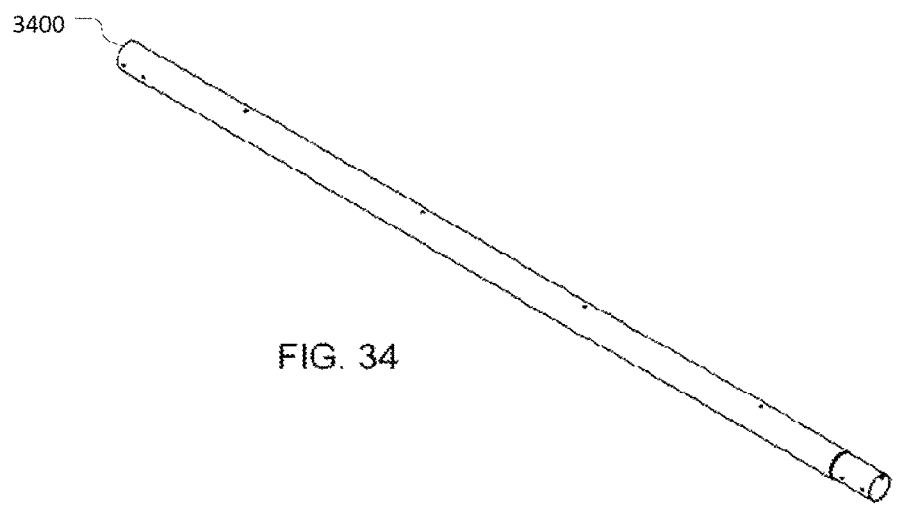
FIGS. 34 and 35 are simplified side view diagrams of a torque tube according to an embodiment.
Figure 35:

FIGS. 34 and 35 are simplified diagrams of a torque tube 3400 according to an embodiment. FIG. 34 illustrates the torque tube 3400 from a perspective view. FIG. 35 illustrates the torque tube from a side view.

As shown, the torque tube 3400 has a plurality of openings on each end for affixing to either the clam shell clamp 1140 or drive device 1530 cylinder. The torque tube 3400 also has a plurality of openings for clamps configured to hold the tube to a frame coupled to the plurality of solar modules.

FIGS. 36 through 38 illustrate a half clam shell clamp housing member 1141 according to an embodiment. FIG. 36 illustrates the half clam shell clamp housing member 1141 from a perspective view. FIG. 37 illustrates the half clam shell clamp housing member 1141 from a side view. FIG. 38 illustrates the half shell clamp housing member 1141 from a front view. As shown is a half of the clam shell clamp 1140, including a pin opening to be coupled to the spherical bearing device 1130, and a plurality of slots for bolts to hold the torque tube 3400 in place and for adjustment.

Figure 39:
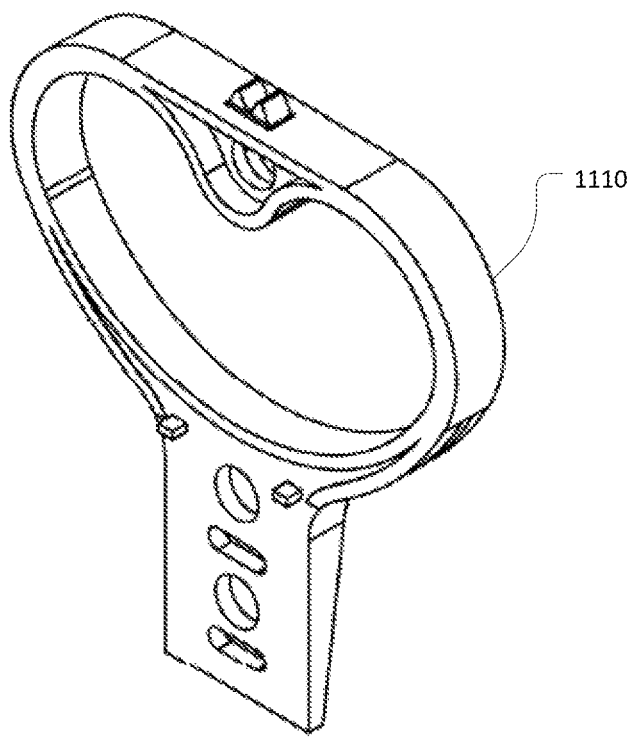
FIGS. 39 and 40 are simplified perspective-view and side view diagrams of a clamp housing member according to an embodiment.
Figure 40:
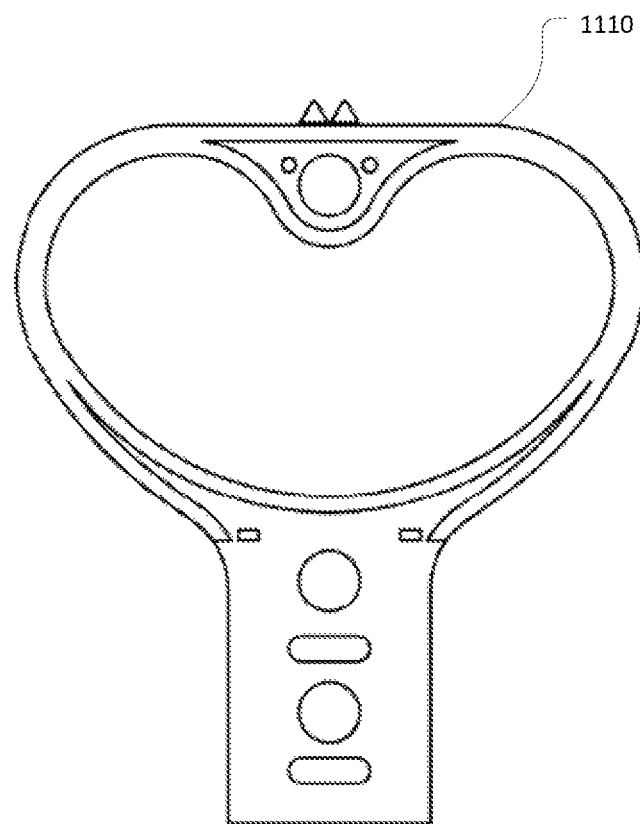

FIGS. 39 and 40 illustrate a clamp housing member 1110 according to an embodiment. FIG. 39 illustrates a simplified perspective-view diagram of the clamp housing member 1110. FIG. 40 illustrates a side view diagram of a clamp housing member 1110. As shown is the clamp housing member 1110 configured as a heart like shape, with tongue. The tongue has a recessed region, and an opening or slot for the spherical bearing device 1130. The clamp housing member 1110 also has a member to be coupled to the first pier structure 1120.

Figure 41:
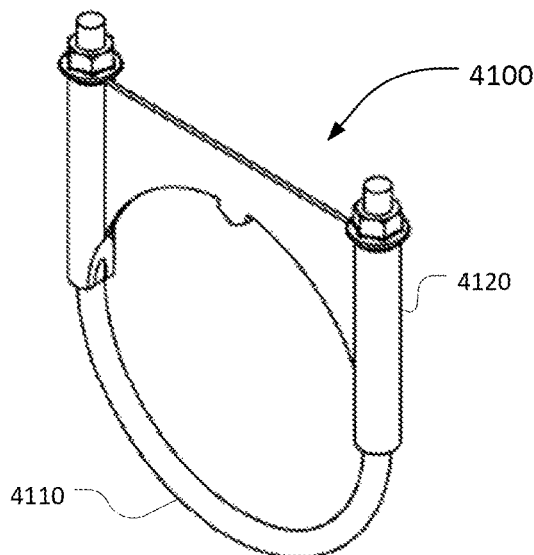
FIGS. 41, 42, 43, and 44 are simplified diagrams of components for a U-bolt member according to an embodiment.
Figure 42:
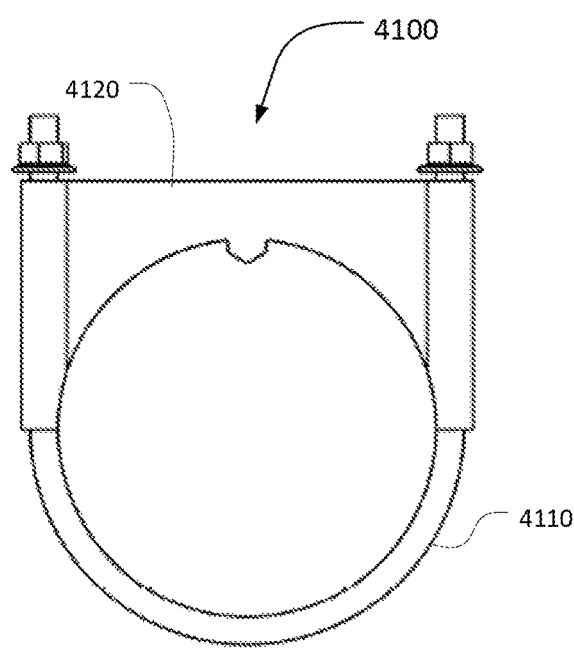
Figure 43:
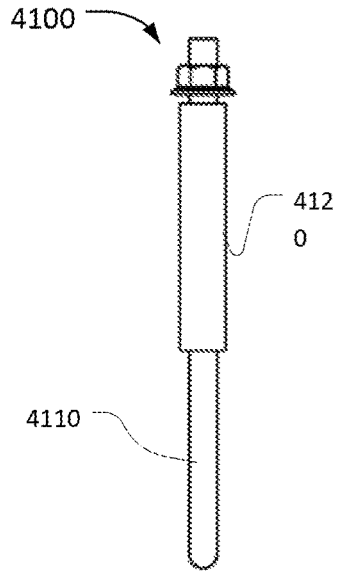
Figure 44:
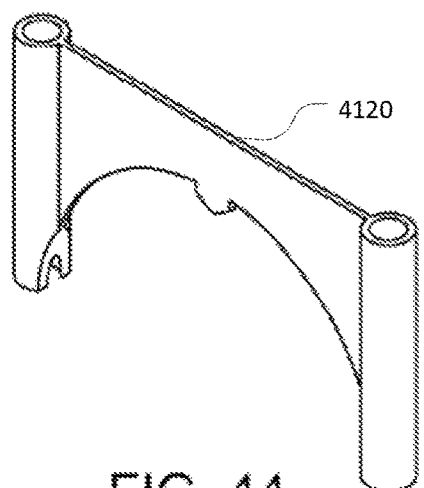

FIGS. 41, 42, 43, and 44 are simplified diagrams of components for a U-bolt member 4100 according to an embodiment. FIG. 41 shows the U-bolt member 4100 from a perspective view. FIG. 42 shows the U-bolt member 4100 from a front view. FIG. 43 shows the U-bolt 4100 member from a side view. FIG. 44 shows an upper clamp 4120 of the U-bolt member 4100 from a perspective view.

As shown is the U-bolt member 4100 and a pair of nuts to secure the U-bolt 4110. The components also includes the upper clamp 4120 with a protrusion to be coupled to a notch or opening in the torque tube 3400 to present any movement between the torque tube 3400 and U-bolt member 4100. That is, the protrusion acts as a stop to hold the U-bolt 4110 in place.

Figure 45:
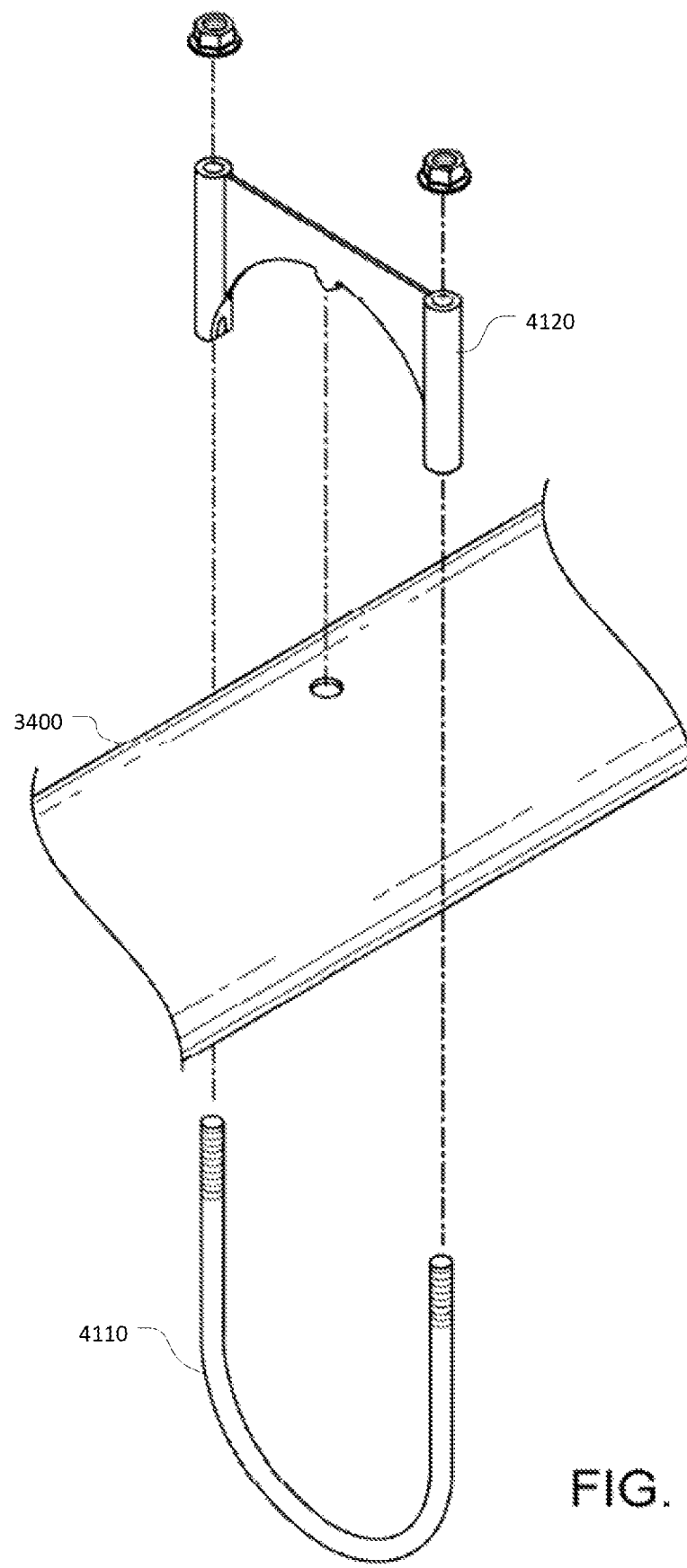
FIGS. 45, 46, and 47 are simplified diagrams illustrating assembly steps for a process of coupling a U-bolt member to a torque tube according to an embodiment.
Figure 46:
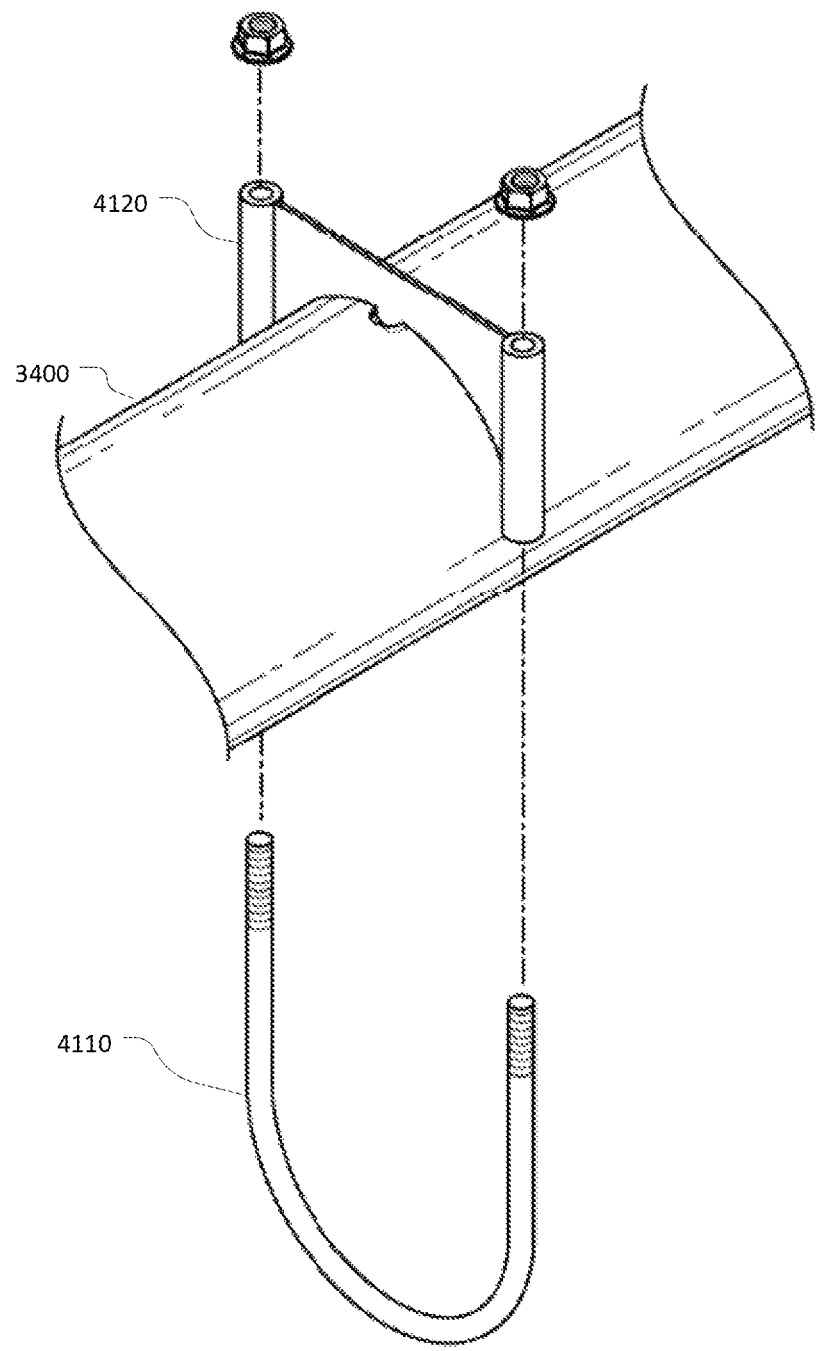
Figure 47:
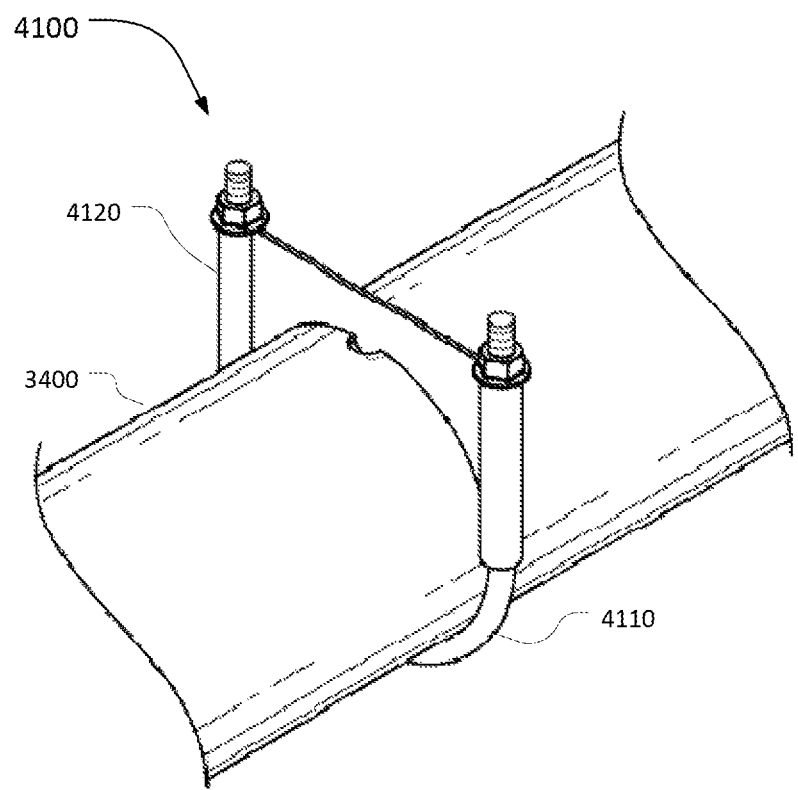

FIGS. 45, 46, and 47 are simplified diagrams illustrating assembly steps for a process of coupling a U-bolt member 4100 to a torque tube 3400 according to an embodiment. FIG. 45 illustrates an exploded view of the U-bolt member 4100 and the torque tube 3400. FIGS. 46 and 47 illustrate partially exploded views of the U-bolt member 4100 and the torque tube 3400.

The U-bolt 4110 is coupled to a periphery of the torque tube 3400. The upper clamp 4120 includes a protrusion, which has a thinner portion and thicker portion, coupled to a notch in the torque tube 3400. A pair of bolts fastens and secures the upper clamp 4120 and U-bolt 4110 in place to hold the frame structure, which couples to the plurality of solar modules.

Figure 48:
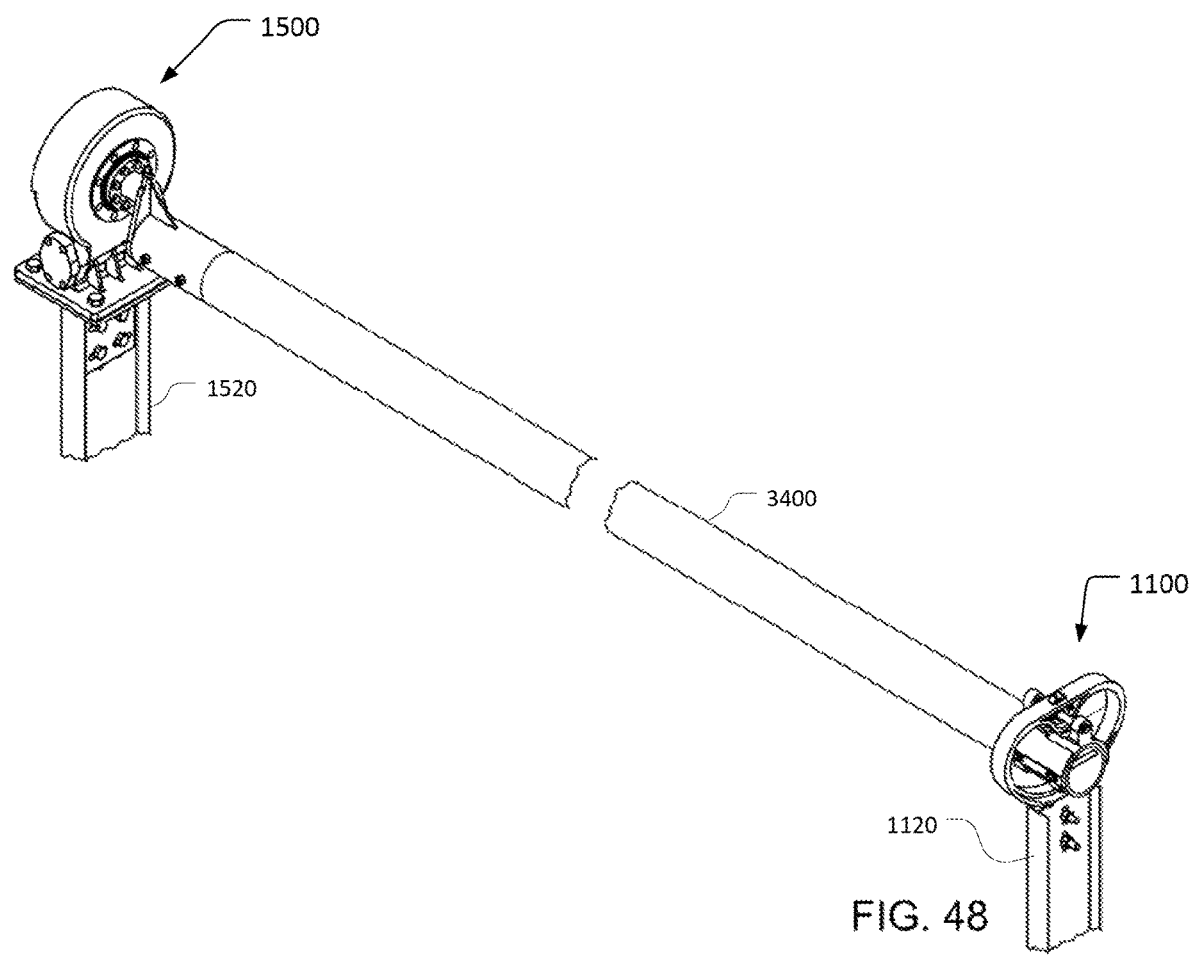
FIGS. 48 and 49 illustrate various views of a tracker apparatus according to an embodiment.
Figure 49:
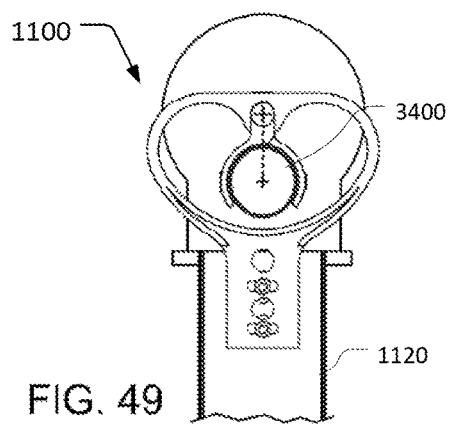

FIGS. 48 and 49 illustrate views of a tracker apparatus according to an embodiment. FIG. 48 illustrates the tracker apparatus 100 from a perspective view. FIG. 49 illustrates the tracker apparatus from a front view. As shown, the torque tube 3400 and tracker apparatus are in a normal rest position.

Figure 50:
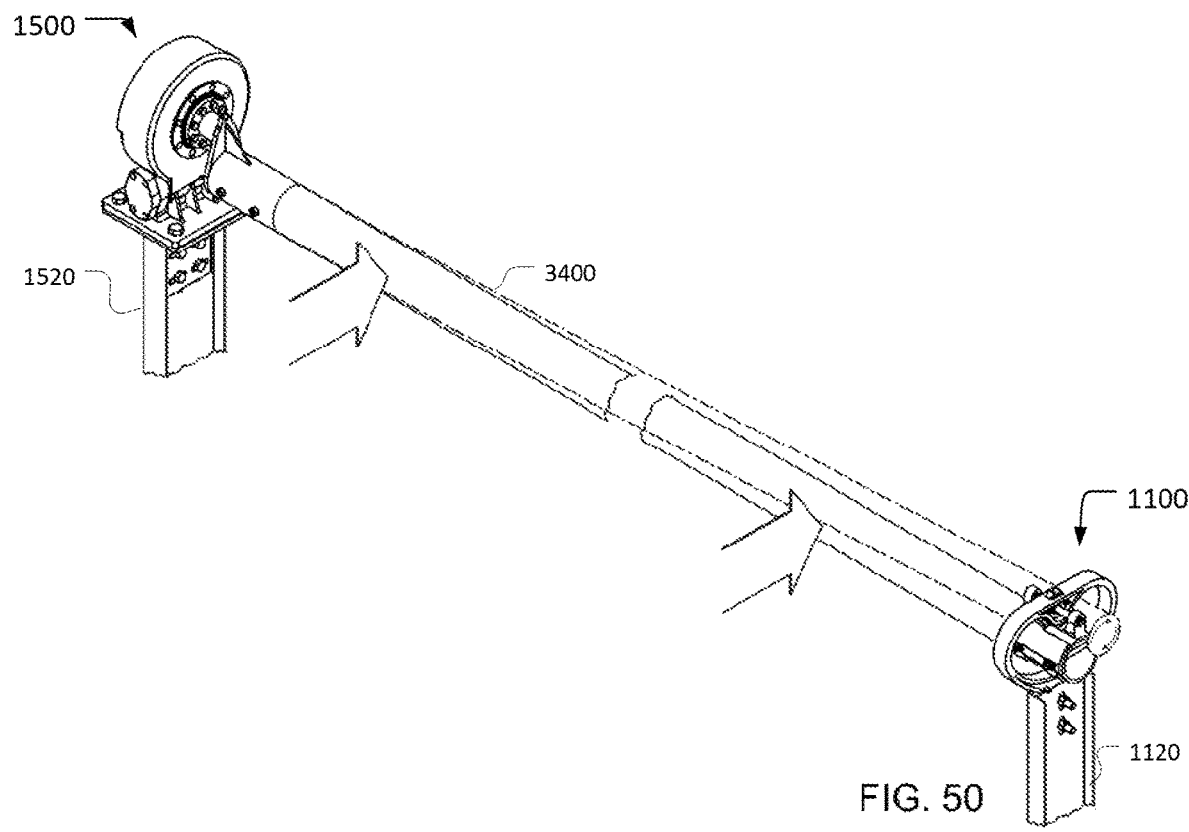
FIGS. 50 and 51 illustrate views of a tracker apparatus according to an embodiment.
Figure 51:
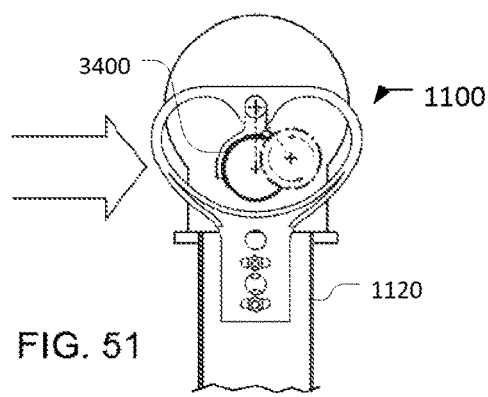

FIGS. 50 and 51 illustrate views of a tracker apparatus according to an embodiment. FIG. 50 illustrates the tracker apparatus 100 from a perspective view. FIG. 51 illustrates the tracker apparatus 100 from a front view. As shown, a lateral force is provided against a direction normal to the length of the torque tube 3400, which causes one end of the torque tube 3400 to move in the lateral direction, while the other end remains fixed in an embodiment.

Figure 52:
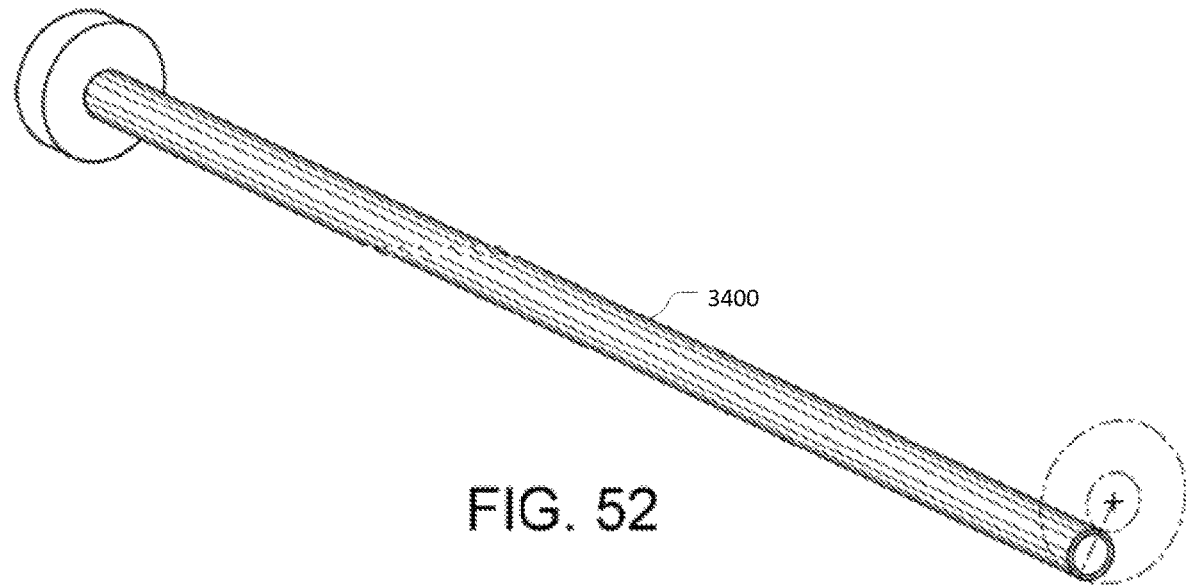
FIGS. 52 and 53 illustrate a torque tube according to an embodiment.
Figure 53:
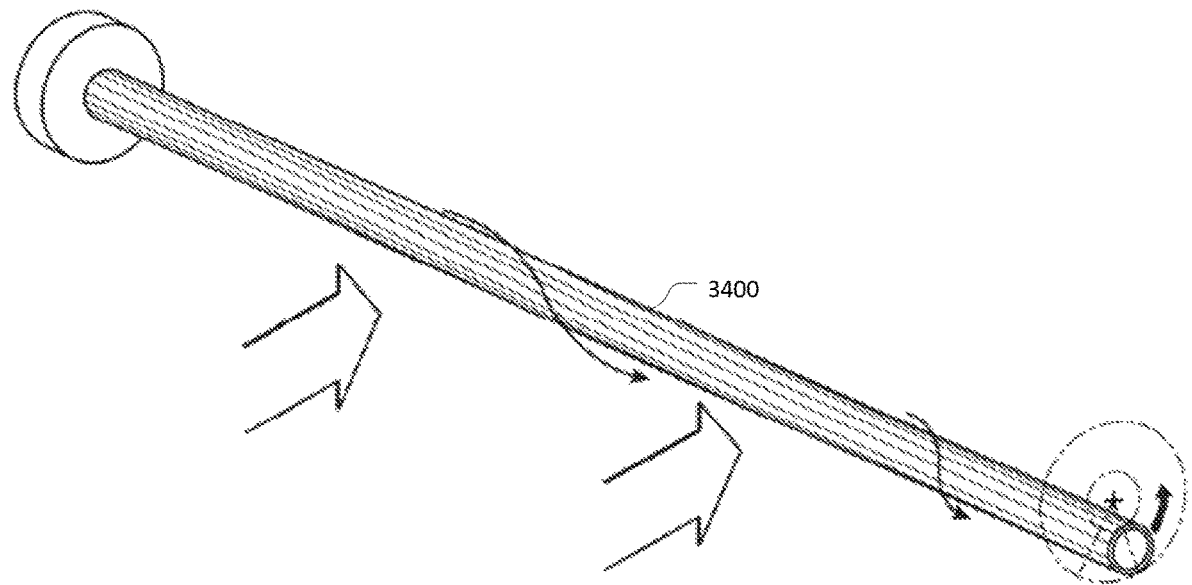

FIGS. 52 and 53 illustrate an illustration of a torque tube 3400 according to an embodiment. FIG. 52 illustrates a perspective view of the torque tube 3400. FIG. 53 illustrates a perspective view of the torque tube 3400 when subjected to a lateral force. As shown, the torque tube 3400 rotates and swings in a radial manner upon being subjected to the lateral force, in an embodiment. The torque tube 3400 stops against an inner side of one of the lobes of the clamp housing member 1110.

Figure 54:
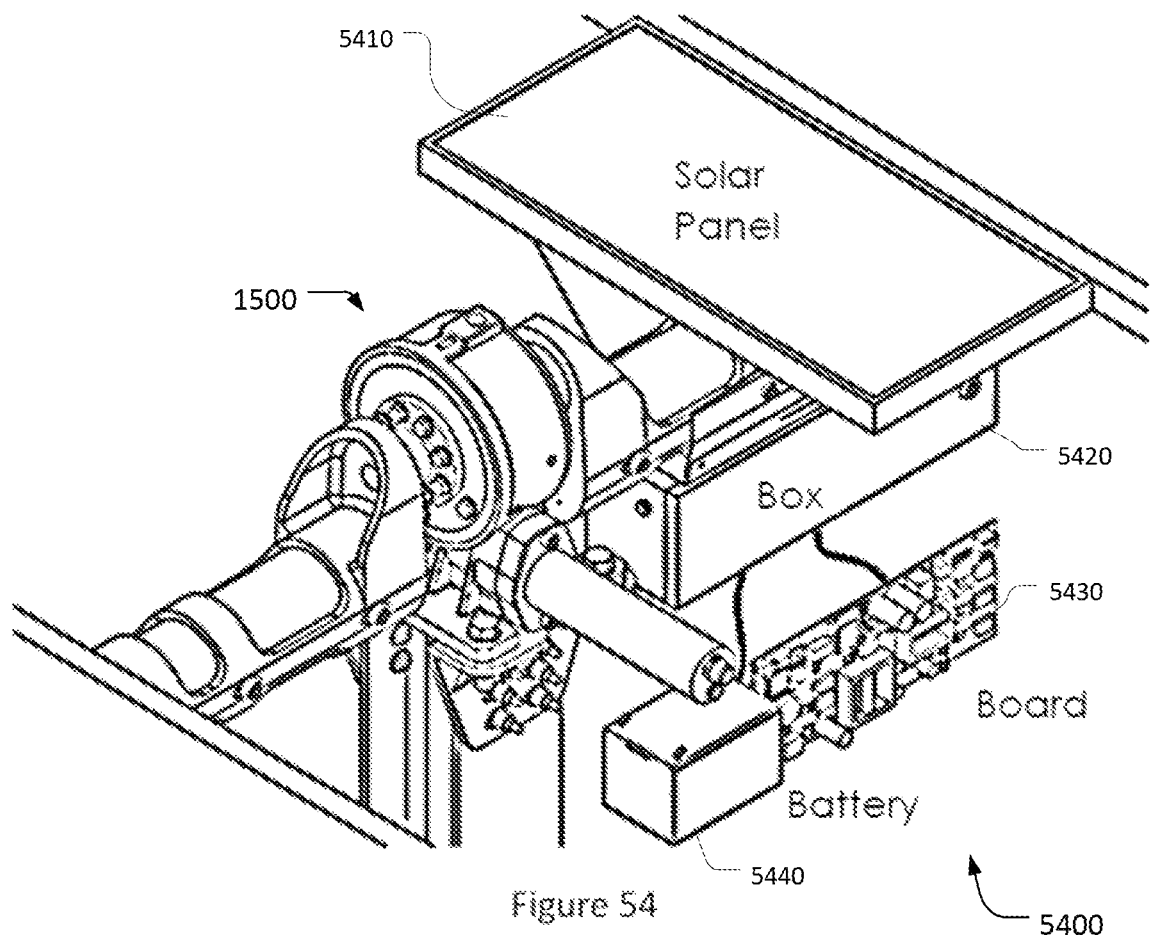
FIG. 54 is a simplified perspective diagram of a tracker system configured with a self-powered device according to an embodiment.

FIG. 54 is a simplified perspective diagram of a tracker system configured with a self-powered device (referred to herein as an energy system) 5400 according to an embodiment. As shown, the tracker system has a torque tube 3400, which has a self-powered device mounted on a lower portion of the torque tube 3400, and also within a vicinity of the off-set drive device 1530. The off-set drive device may include a motor. Portions of the self-powered device is provided in a box 5420, which is weather tight so that the self-powered device is not subject to undesirable ambient conditions. The box 5420 is mounted to the torque tube 3400. The box 5420 includes an electronic module 5430, as shown. In an embodiment, the tracker system has a solar panel energy source 5410 disposed on an upper portion of the self-powered tracker apparatus, and spatially separated from the electronic module 5430.

The electronic module 5430 may include a DC to DC converter, a battery coupled to the DC to DC converter, a boost converter, a capacitor device, and a micro controller, each of which may be provided in the box 5420.

As shown, the solar panel energy source 5410 is disposed slide by side with one of the plurality of solar modules, and is configured to track the sun with the other solar modules. In an embodiment, the solar panel energy source 5410 is smaller than the other solar panels, and can provide enough energy to self-power the subject tracker system. Of course, there can be other variations, modifications, and alternatives.

In an embodiment, the energy system 5400 has various elements. The energy system 5400 has a solar panel energy source 5410 including a first electrode and a second electrode. In an embodiment the solar panel energy source 5410 produces less than 300 Watts. In an embodiment, the energy system 5400 has a DC to DC converter coupled to the first electrode and the second electrode, a battery 5440 coupled to the DC to DC converter, a boost converter including a first lead and a second lead coupled to the battery 5440, and a capacitor device coupled to the boost converter. In an embodiment, the energy system 5400 has the capacitor device configured to provide a stable voltage for the motor drive.

In an embodiment, the energy system 5400 includes a micro-controller including one or more inputs coupled to a motor current and/or a motor voltage, an input for a sensor to monitor a temperature of the battery 5440; one or more inputs for current and/or voltage from the solar panel energy source 5410; and one or more inputs for a current and/or a voltage for the battery 5440. In an embodiment, one or more control signals are operably coupled to the battery charger, boost converter, and motor drive, among other elements. The control signals may be produced by the micro-controller.

In an embodiment, the energy system 5400 is configured to supply power to the motor 5450 to cause the tracker apparatus to operate with less than 15 Watt-hours per day of operation without an external energy source. In other examples, the system can operate in power ranging from 25 Watts to 10 Watts, among others. The system desirably runs by itself, in a self-powered mode, without use of external power lines or other energy sources.

Figure 55:
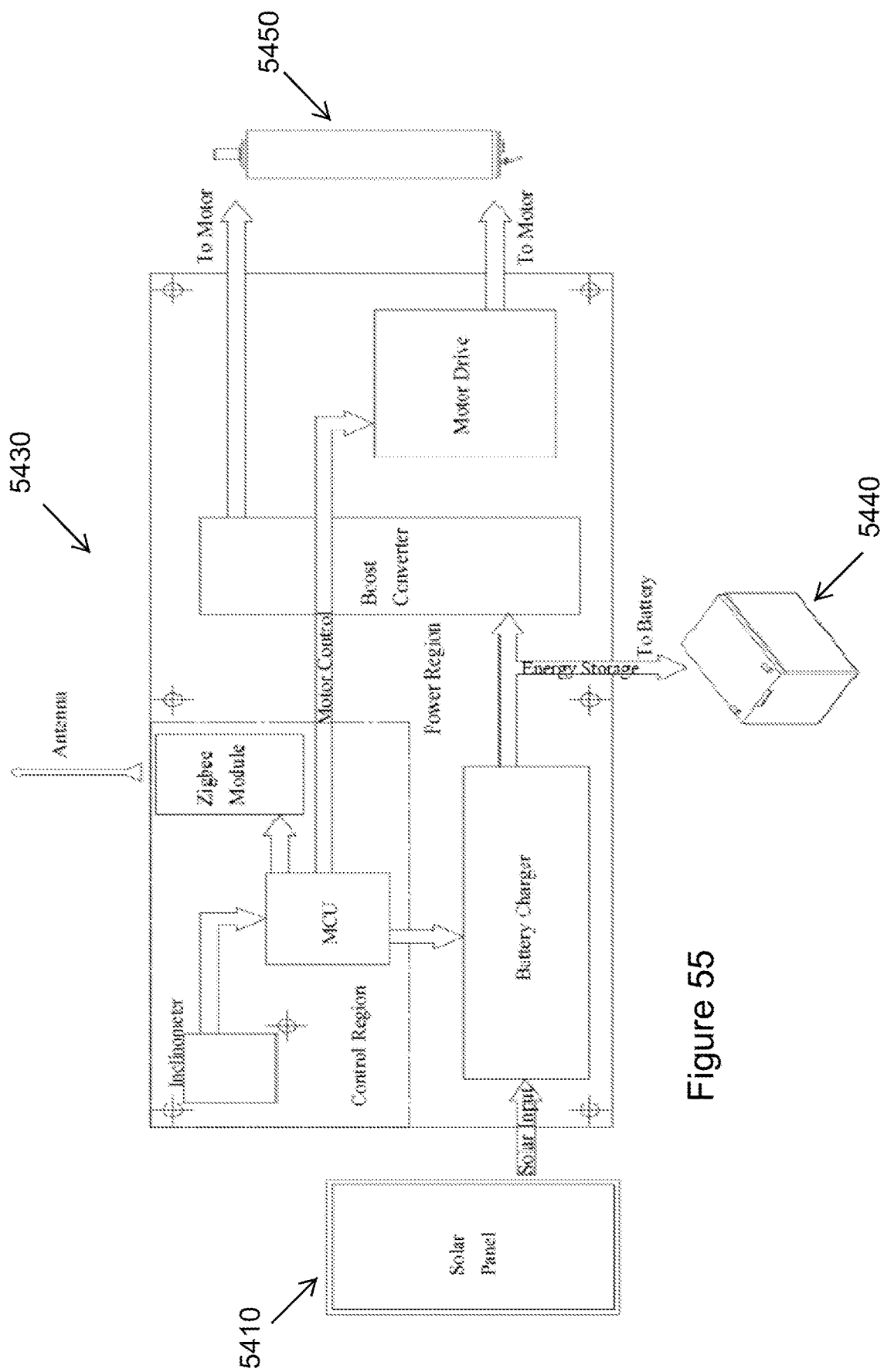
FIG. 55 is a block diagram illustrating the electronic module according to an embodiment.
Figure 56:
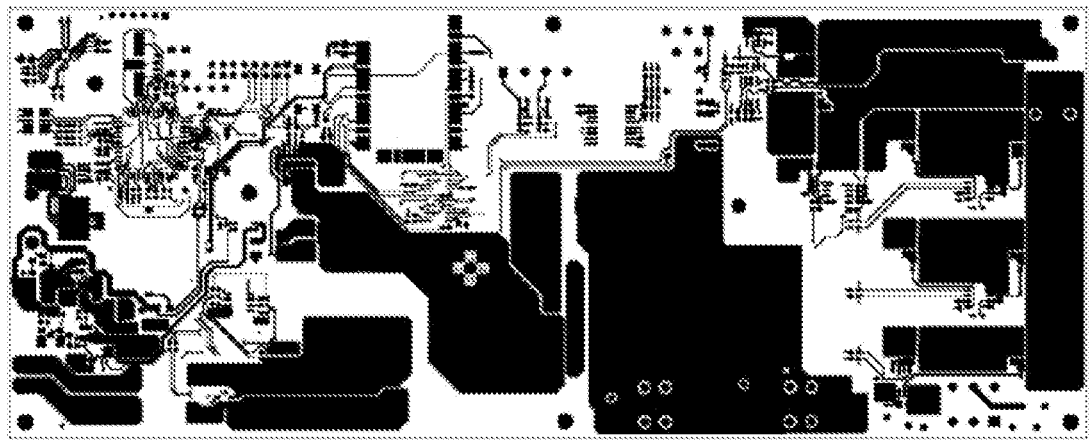
FIGS. 56-59 illustrate layers of the electronic module according to an example.
Figure 57:
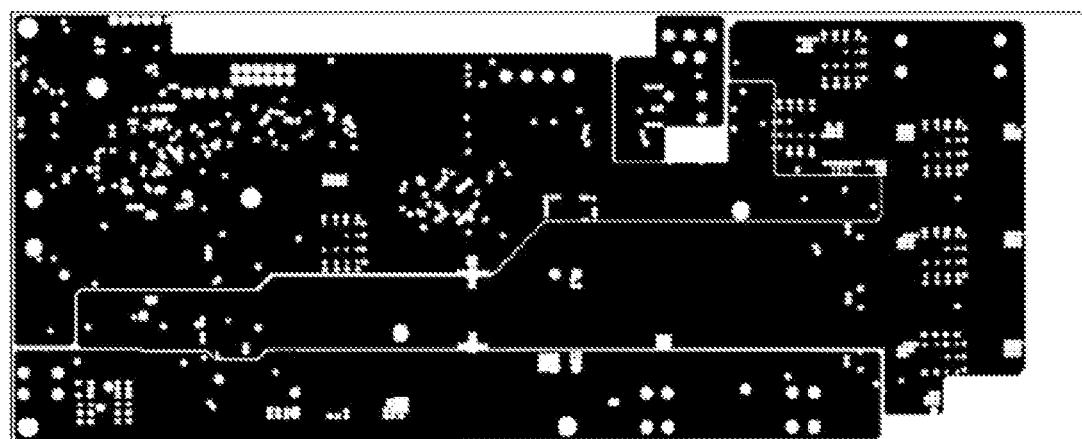
Figure 58:
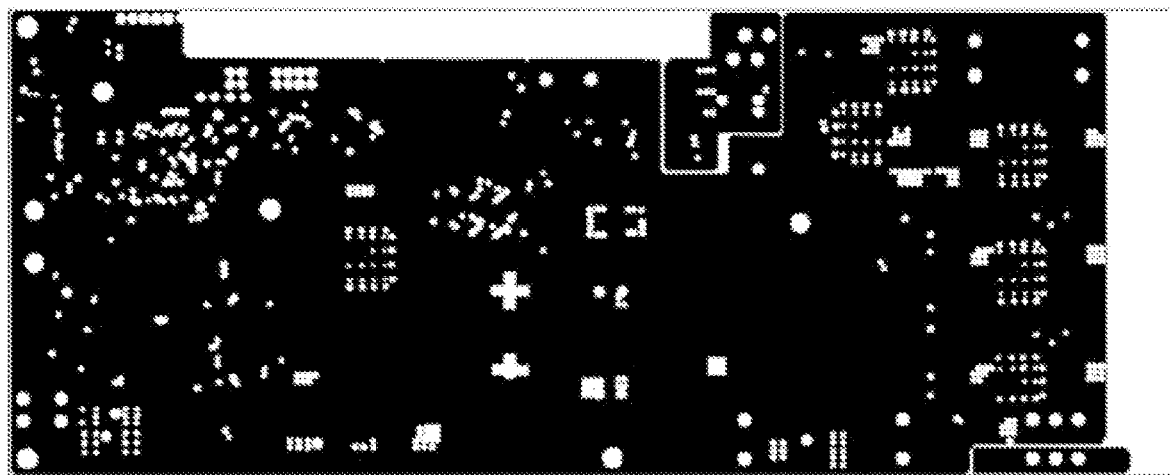
Figure 59:
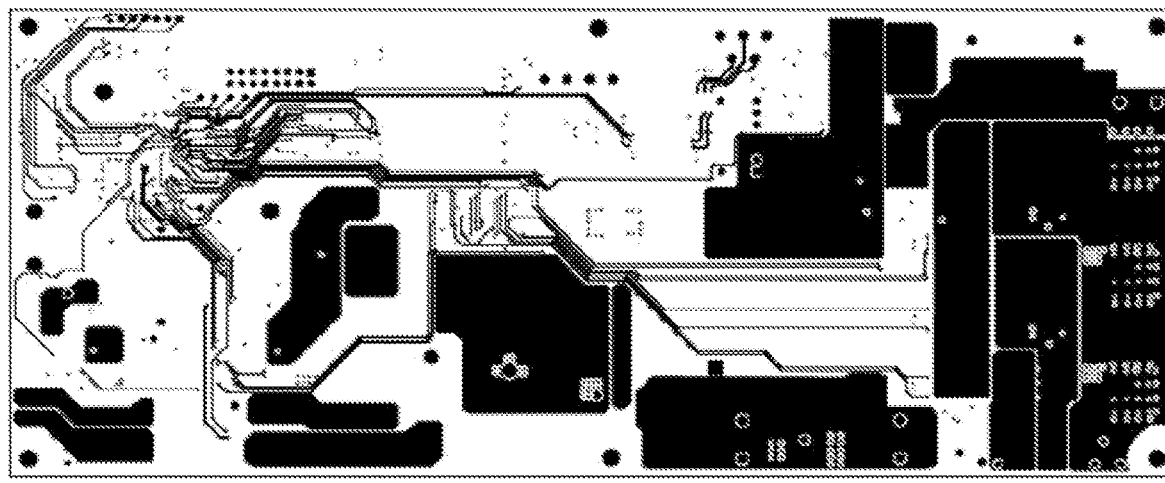

FIG. 55 is a block diagram illustrating the electronic module 5430 according to an example. The electronic module 5430 may be provided on a multi-layered printed circuit board. The board may include a control region and a power region. The board is provided with the energy system 5400.

In an embodiment, the power region includes a battery charger including a DC to DC converter coupled to a solar input including a first electrode and a second electrode, a battery coupled to the battery charger, a boost converter including a first lead and a second lead coupled to the battery device, a capacitor device included in the boost converter, the capacitor device being configured to provide a stable voltage for the motor drive, and a motor drive coupled to the motor 5450, among other elements. The power region is spatially separated from the control region.

The power region has an energy flow from the control region to an outer edge of the power region. The flow, as shown, is from right to left to reduce any electromagnetic interference. The energy flow from the micro-controller unit (MCU) for the control of the motor drive is from the control region to the power region, and the drive is located near an opposite edge of the control region and provided with outputs along an edge of the circuit board. A distance between such drive outputs from the drive from the control region is a maximum distance of the circuit board.

In an embodiment, the circuit board has a control region provided spatially separated from the power region for isolation, again to reduce noise. The control region has a micro-controller unit (MCU) including one or more inputs respectively coupled to one or more of a motor current, a motor voltage, a sensor to monitor a temperature of the battery device, a current of the solar panel energy source, a voltage from the solar panel energy source, a current for the battery device, and a voltage for the battery device. The MCU further includes one or more control signals operably coupled to the battery charger, boost converter, and motor drive. In an embodiment, the device has an inclinometer device provided within an outer edge region of the control region. In an embodiment, the inclinometer device has an output coupled to the micro-controller via an interface.

In an embodiment, the inclinometer device is configured for measuring angles of slope (or tilt), elevation, and/or depression of the solar panels with respect to gravity. In other examples, the device can be a tilt meter, tilt indicator, slope alert, slope gauge, gradient meter, gradiometer, level gauge, level meter, declinometer, and pitch & roll indicator.

In an embodiment, the control region has a wireless module including a Zigbee module provided on the control region. The wireless module is coupled to an antenna device for communication of a wireless signal to and from the microcontroller device.

In an embodiment, the energy system 5400 is configured to supply power to the motor 5450 to cause the tracker apparatus to operate with less than 15 Watt-hours per day of operation without an external energy source, such as a power line or other energy source from central distribution.

FIGS. 56-59 illustrate layers of a printed circuit board of the electronic module 5430 according to an embodiment. Further details of each of the layers are described throughout the present specification, and more particularly below.

Figure 60:
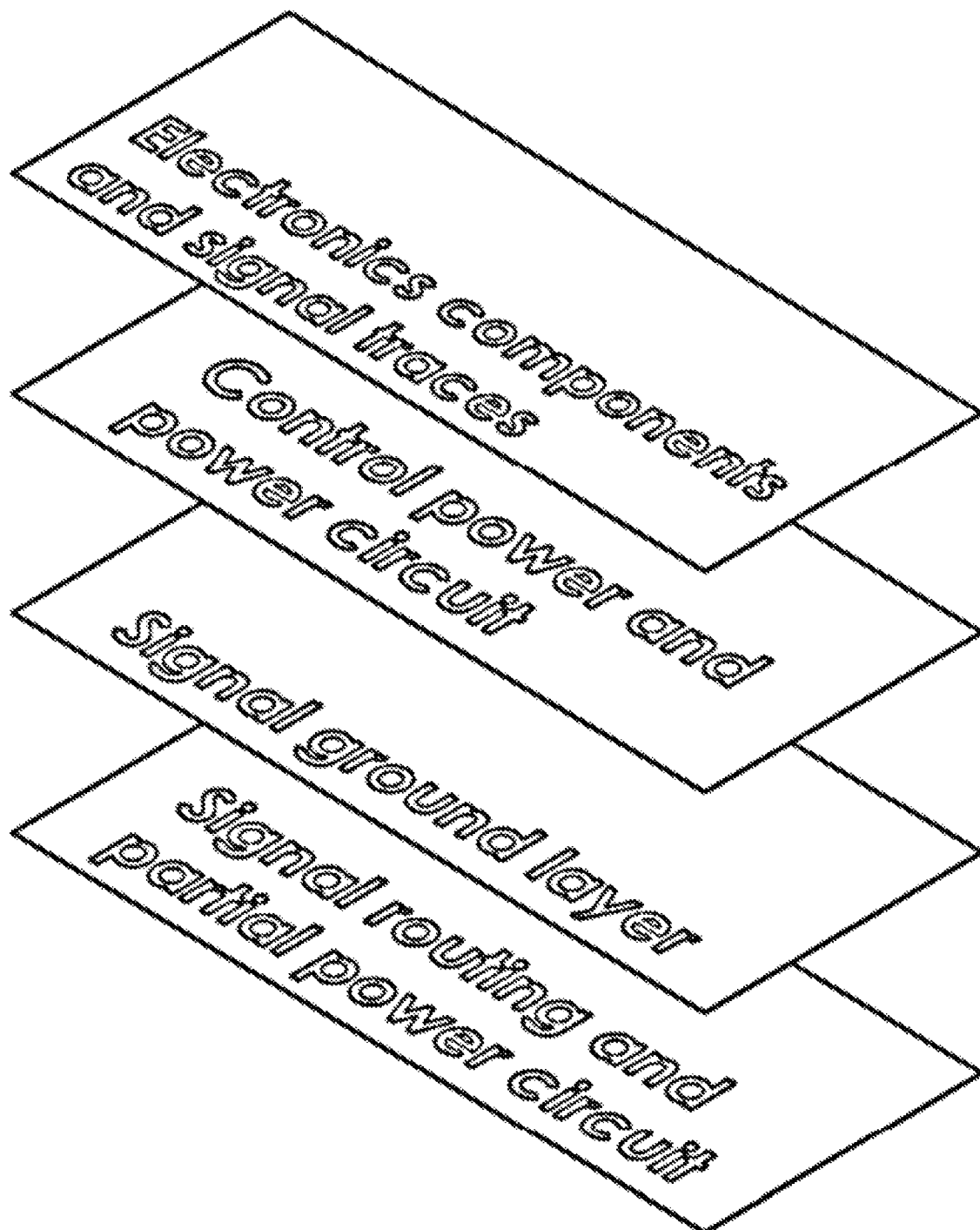
FIG. 60 is an expanded view of the electronic module according to an example.

FIG. 60 is an expanded functional view of a printed circuit board of the electronic module 5430 according to an embodiment. The printed circuit board includes a plurality of layers including a top electronic component layer, an inner control power and circuit layer, an inner grounding layer, and a bottom signal routing and partial power circuit layer such that the inner grounding layer and the inner control power layer are located within an inner region to protect against electromagnetic interference. The top electronic component layer is for placing and securing each of the electronic components thereon. In an embodiment, the inner control power and circuit layer is provided for supplying control and power via the drive circuits. In an embodiment, the inner grounding layer is provided as a grounding region for each of the plurality of layers. The bottom signal routing and partially power circuit layer are provided for signal routing, and power in some embodiments.

In an embodiment, the electronic component layer includes each of the electronic components as described herein as well as others.

In an embodiment, the inner control power and circuit layer includes lines for charging the battery 5440 and lines for controlling the drive motor 5450 and also driving the motor with sufficient energy to move the torque tube 3400.

In an embodiment, the grounding layer includes a ground electrode, and a continuous sheet of conductive material, along with via structures, for grounding and shielding purposes.

In an embodiment, the bottom signal routing and partial power circuit layer also includes lines for controlling the drive motor and also driving the motor in conjunction with the inner control power and circuit layer.

Figure 61:
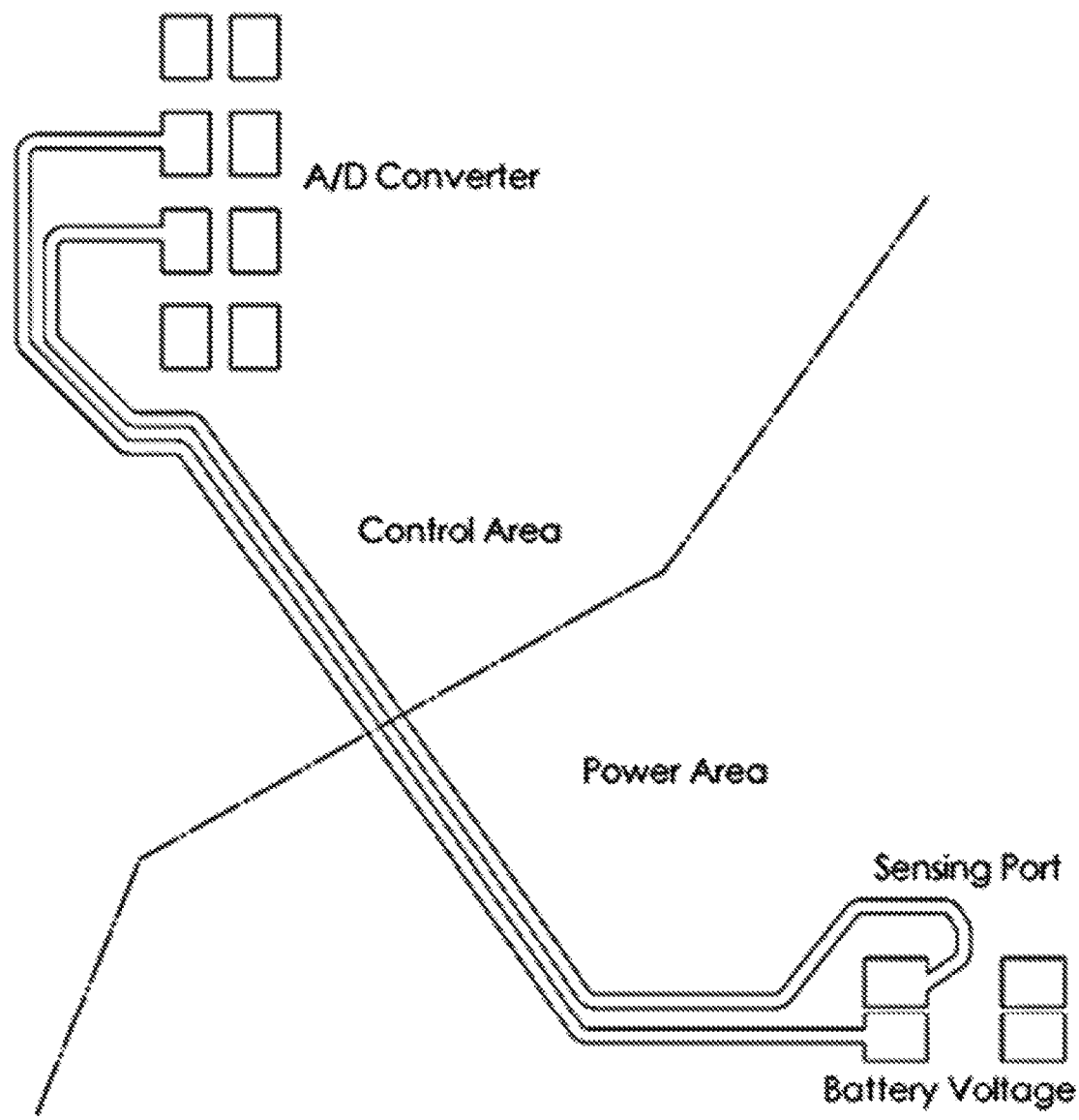
FIG. 61 is an example of sample traces from a power region to a control region having a differential pair of traces configured with a matched impedance in an embodiment.

FIG. 61 is an example of sample traces from a power region to a control region having a differential pair of traces configured with a matched impedance in an embodiment. As shown, the power region is coupled to a sensor for monitoring the battery, while the control region has an analog to digital device coupled to a micro-controller.

Figure 62:
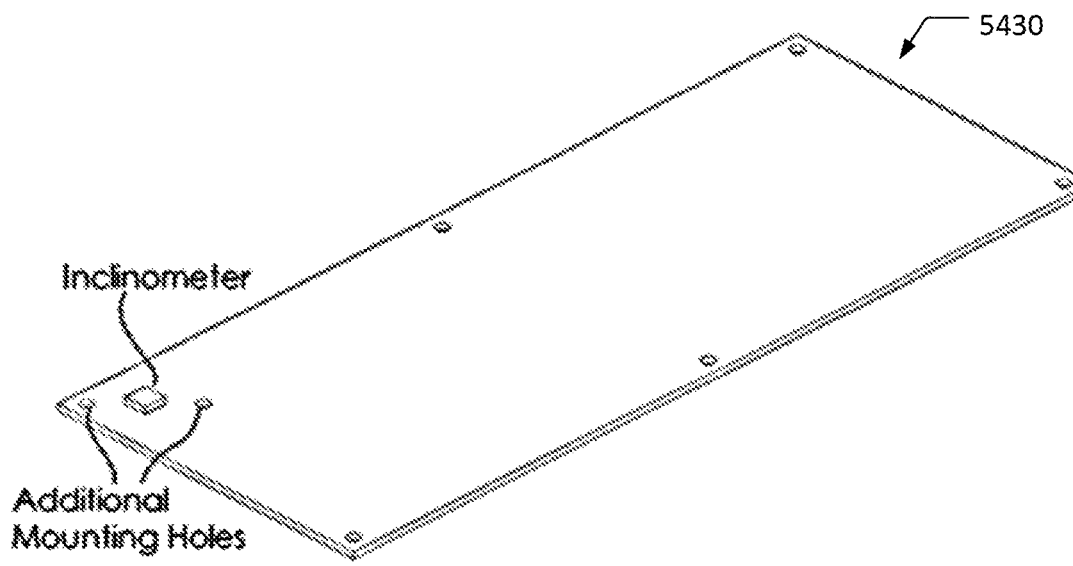
FIG. 62 is a module configured with a sensing device such as an inclinometer device in an embodiment.

FIG. 62 is an electronic module 5430 configured with a sensing device such as an inclinometer device in an embodiment. As shown, the sensing device is mounted within a vicinity of an edge region of the module. The edge region provides for stability and accuracy of the device. The edge region also has a pair of mounting regions, which can be holes. The sensing device is generally surface-mounted via solder or other conventional techniques. The electronic module 5430 is mounted in reference to the tracker underlying a portion of the torque tube 3400. The edge region is more stable than a center region, which is susceptible to mechanical vibrations, and other movements, often during high winds, or other extreme conditions.

Figure 63:
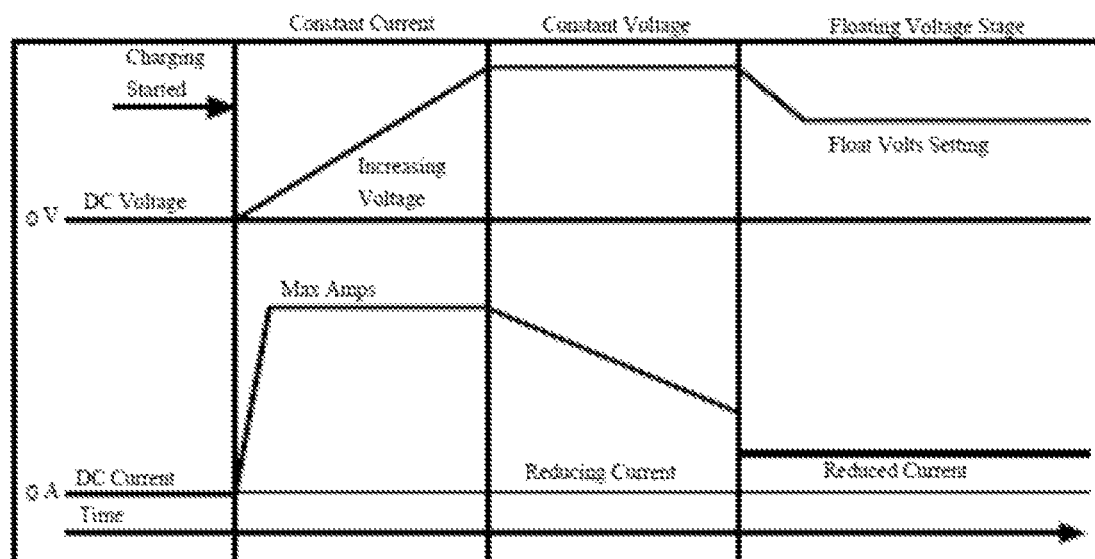
FIG. 63 is a simplified plot of a storage charge process in an embodiment.

FIG. 63 is a simplified plot of a storage charge process in an embodiment. As shown, when a voltage of the battery is lower than a predetermined value target, charging occurs at constant current in a maximum charging process. Upon achieving the voltage target, the charging current drops to a reduced current value at a float volts setting. When the battery voltage is at the float volts setting, current can charge and discharge in an embodiment. Depending upon the example, the process can include any combination of the above, as well as others.

Figure 64:
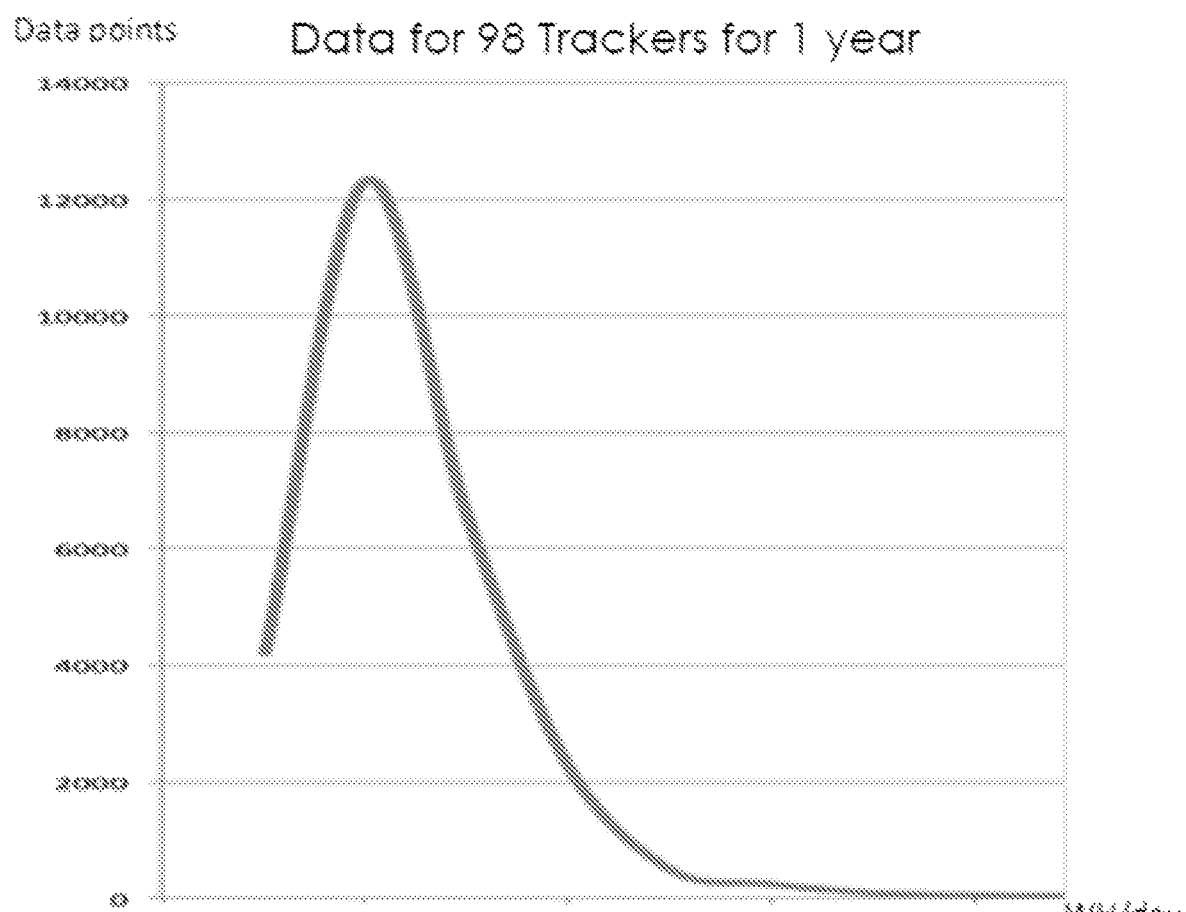
FIG. 64 is a plot of daily energy usage of a plurality of tracking systems according to an embodiment.

FIG. 64 is a plot of energy usage in watt hours each day for a plurality of tracking systems (that is, trackers) according to an embodiment. As shown, for a substantial majority of trackers, energy consumption is about two watt-hours per day, which leads to a self-powered process for each of the tracking devices. In an embodiment, the energy consumption can range from 25 Watts to 15 Watts during normal operation. Alternatively, the range can be others. Of course, there can be other variations, modifications, and alternatives.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A solar tracker apparatus comprising:
   a torque tube defining a single axis of rotation;
   a plurality of solar modules coupled to the torque tube such that rotation of the torque tube about the single axis of rotation orients the plurality of solar modules;
   a drive device operably coupled to the torque tube, the drive device configured to rotate the torque tube and the plurality of solar modules about the single axis of rotation;
   a solar panel energy source smaller than each of the plurality of solar modules and configured to power the drive device, the solar panel energy source mounted on the torque tube side by side with one of the plurality of solar modules; and
   an electronic module secured to the torque tube, wherein the electronics module and the solar panel energy source are proximate the drive device and between at least two solar modules.

2. The solar tracker apparatus of claim 1, wherein the torque tube is cylindrical.

3. The solar tracker apparatus of claim 1, wherein the solar panel energy source is configured to produce less than 300 Watts.

4. The solar tracker apparatus of claim 1, wherein the solar panel energy source is configured to supply power to the drive device to cause the solar tracker apparatus to operate with less than 15 Watt-hours per day of operation without an external energy source.

5. The solar tracker apparatus of claim 1, wherein the electronic module includes a DC to DC converter.

6. The solar tracker apparatus of claim 5, further comprising a battery coupled to the DC to DC converter and the electronics module.

7. The solar tracker apparatus of claim 6, wherein the electronic module further includes a boost converter coupled to the battery and a capacitor coupled to the drive device.

* * * * *